(12) United States Patent
Nishimura et al.

(10) Patent No.: US 12,200,961 B2
(45) Date of Patent: Jan. 14, 2025

(54) ORGANIC ELECTROLUMINESCENCE ELEMENT, DISPLAY DEVICE, AND ELECTRONIC APPARATUS

(71) Applicant: IDEMITSU KOSAN CO., LTD., Tokyo (JP)

(72) Inventors: Kazuki Nishimura, Sodegaura (JP); Toshinari Ogiwara, Sodegaura (JP); Keiji Okinaka, Sodegaura (JP); Keiichi Yasukawa, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 976 days.

(21) Appl. No.: 17/059,352

(22) PCT Filed: May 28, 2019

(86) PCT No.: PCT/JP2019/021054
§ 371 (c)(1),
(2) Date: Nov. 27, 2020

(87) PCT Pub. No.: WO2019/230708
PCT Pub. Date: Dec. 5, 2019

(65) Prior Publication Data
US 2021/0242428 A1 Aug. 5, 2021

(30) Foreign Application Priority Data
May 28, 2018 (JP) .................................. 2018-101837

(51) Int. Cl.
*H10K 50/852* (2023.01)
*H10K 50/11* (2023.01)
(Continued)

(52) U.S. Cl.
CPC ........... *H10K 50/852* (2023.02); *H10K 50/11* (2023.02); *H10K 50/18* (2023.02); *H10K 59/35* (2023.02);
(Continued)

(58) Field of Classification Search
CPC .............................................. H10K 50/11–135
See application file for complete search history.

(56) References Cited

U.S. PATENT DOCUMENTS

| 2003/0087126 A1 | 5/2003 | Ishida et al. |
| 2004/0137270 A1 | 7/2004 | Seo et al. |

(Continued)

FOREIGN PATENT DOCUMENTS

| CN | 102074656 A | 5/2011 |
| CN | 105103326 A | 11/2015 |

(Continued)

OTHER PUBLICATIONS

International Search Report issued on Sep. 3, 2019 in PCT/JP2019/021054 filed on May 28, 2019, 2 pages.
(Continued)

*Primary Examiner* — Mariceli Santiago
(74) *Attorney, Agent, or Firm* — Oblon, McClelland, Maier & Neustadt, L.L.P.

(57) ABSTRACT

An organic electroluminescence device including: at least a first pixel and a blue pixel apposed on a substrate, in which the first pixel and the blue pixel each have an anode and a cathode, and the first pixel and the blue pixel have a first emitting layer and a blue emitting layer, respectively; a hole transporting zone provided between the first emitting layer and the anode and between the blue emitting layer and the anode; and an electron transporting zone provided between the first emitting layer and the cathode and between the blue emitting layer and the cathode, in which the first emitting
(Continued)

layer includes a delayed fluorescent second compound and a fluorescent first compound capable of emitting light ranging from 500 nm to 660 nm, and the electron transporting zone includes: a first common layer; and an additional layer provided between the first emitting layer and the cathode.

13 Claims, 19 Drawing Sheets

(51) Int. Cl.
  *H10K 50/18* (2023.01)
  *H10K 50/818* (2023.01)
  *H10K 50/828* (2023.01)
  *H10K 59/35* (2023.01)
  *H10K 71/00* (2023.01)
  *H10K 85/60* (2023.01)
  *H10K 101/30* (2023.01)
  *H10K 102/00* (2023.01)

(52) U.S. Cl.
  CPC ........... *H10K 71/00* (2023.02); *H10K 85/623* (2023.02); *H10K 85/633* (2023.02); *H10K 85/654* (2023.02); *H10K 85/6572* (2023.02); *H10K 50/818* (2023.02); *H10K 50/828* (2023.02); *H10K 2101/30* (2023.02); *H10K 2102/3026* (2023.02); *H10K 2102/351* (2023.02)

(56) References Cited

U.S. PATENT DOCUMENTS

| | | |
|---|---|---|
| 2005/0074631 A1 | 4/2005 | Ishida et al. |
| 2006/0052641 A1 | 3/2006 | Funahashi |
| 2007/0009758 A1 | 1/2007 | Funahashi |
| 2007/0155991 A1 | 7/2007 | Funahashi |
| 2007/0247063 A1 | 10/2007 | Murase et al. |
| 2007/0252511 A1 | 11/2007 | Funahashi |
| 2008/0015399 A1 | 1/2008 | Funahashi |
| 2008/0203905 A1 | 8/2008 | Je et al. |
| 2008/0284324 A1 | 11/2008 | Chun et al. |
| 2009/0128010 A1 | 5/2009 | Hyun et al. |
| 2009/0195149 A1 | 8/2009 | Funahashi |
| 2010/0052526 A1 | 3/2010 | Je et al. |
| 2010/0155714 A1 | 6/2010 | Seo et al. |
| 2010/0187505 A1 | 7/2010 | Stoessel et al. |
| 2010/0314615 A1 | 12/2010 | Mizuki et al. |
| 2012/0138907 A1 | 6/2012 | Murase et al. |
| 2013/0253183 A1 | 9/2013 | Mizuki et al. |
| 2014/0124763 A1 | 5/2014 | Funahashi |
| 2014/0175419 A1 | 6/2014 | Nakano et al. |
| 2014/0183486 A1 | 7/2014 | Nakano et al. |
| 2015/0115225 A1 | 4/2015 | Kawamura et al. |
| 2015/0303391 A1 | 10/2015 | Nishimura et al. |
| 2015/0340623 A1 | 11/2015 | Kawamura et al. |
| 2016/0190469 A1 | 6/2016 | Ogiwara et al. |
| 2016/0197286 A1 | 7/2016 | Kawamura et al. |
| 2016/0197287 A1 | 7/2016 | Kawamura et al. |
| 2016/0285012 A1 | 9/2016 | Mizuki et al. |
| 2017/0062731 A1 | 3/2017 | Ogiwara et al. |
| 2017/0200920 A1 | 7/2017 | Nishimura et al. |
| 2018/0019428 A1* | 1/2018 | Kawamura ............ H10K 50/15 |
| 2018/0051204 A1 | 2/2018 | Ogiwara et al. |
| 2018/0130959 A1 | 5/2018 | Ogiwara et al. |
| 2018/0375058 A1 | 12/2018 | Kawamura et al. |
| 2019/0010390 A1 | 1/2019 | Ogiwara et al. |
| 2019/0081112 A1 | 3/2019 | Tsukamoto et al. |
| 2019/0109285 A1 | 4/2019 | Kawamura et al. |
| 2019/0221753 A1 | 7/2019 | Mizuki et al. |
| 2019/0305054 A1* | 10/2019 | Tsukamoto ............ H10K 50/13 |
| 2020/0303670 A1 | 9/2020 | Tsukamoto et al. |

FOREIGN PATENT DOCUMENTS

| | | | |
|---|---|---|---|
| JP | 2004-158327 A | 6/2004 | |
| JP | 2004-204238 A | 7/2004 | |
| JP | 2005-31 4239 A | 11/2005 | |
| JP | 2008-288201 A | 11/2008 | |
| JP | 2014-110348 A | 6/2014 | |
| JP | 2015-144224 A | 8/2015 | |
| KR | 10-2007-0115588 A | 12/2007 | |
| KR | 10-2008-0079956 A | 9/2008 | |
| KR | 10-2010-0024894 A | 3/2010 | |
| WO | WO 02/14244 A1 | 2/2002 | |
| WO | WO 2004/044088 A1 | 5/2004 | |
| WO | WO 2004/083162 A1 | 9/2004 | |
| WO | WO 2005/108348 A1 | 11/2005 | |
| WO | WO 2005/113531 A1 | 12/2005 | |
| WO | WO 2007/021117 A1 | 2/2007 | |
| WO | WO 2008/145239 A2 | 12/2008 | |
| WO | WO 2009/084512 A1 | 7/2009 | |
| WO | WO 2012/153780 A1 | 11/2012 | |
| WO | WO 2013/038650 A1 | 3/2013 | |
| WO | WO 2013/180241 A1 | 12/2013 | |
| WO | WO 2014/092083 A1 | 6/2014 | |
| WO | WO 2014/104346 A1 | 7/2014 | |
| WO | WO 2016/056559 A1 | 4/2016 | |
| WO | WO 2016/125807 A1 | 8/2016 | |
| WO | WO 2017/065295 A1 | 4/2017 | |
| WO | WO 2017/099160 A1 | 6/2017 | |
| WO | WO 2017/170063 A1 | 10/2017 | |
| WO | WO 2017/191786 A1 | 11/2017 | |
| WO | WO 2018/062058 A1 | 4/2018 | |

OTHER PUBLICATIONS

Adachi, C., "Yuki Hando-tai no Debaisu Bussei (Device Physics of Organic Semiconductors)," Kodansha Company Ltd, 10.9, 2012, pp. 261-268, 19 total pages (with English translation).

Combined Chinese Office Action and Search Report issued Oct. 14, 2023, in corresponding Chinese Patent Application No. 201980033140.X (with English Translation of Category of Cited Documents), 12 pages.

* cited by examiner

FIG.7

| B | G | R |
|---|---|---|
|  |  | ET |
| ET | ET | HBL |
| HBL | HBL | R_HBL |
| B_EML | G_EML | R_EML |
| B_HT | G_HT | R_HT |
| HTL | | |

FIG.8

| B | G | R |
|---|---|---|
|   | ET | |
| ET | HBL | |
| HBL | G_HBL | R_HBL |
| B_EML | G_EML | R_EML |
| B_HT | G_HT | R_HT |
| HTL | | |

FIG. 9

| B | G | R |
|---|---|---|
| | ET | |
| ET | HBL | |
| HBL | G_HBL | R_HBL |
| B_EML | G_EML | R_EML |
| EBL | | |
| B_HT | G_HT | R_HT |
| HTL | | |

FIG.10

| B | G | R |
|---|---|---|
| ET | | |
| B_HBL | G_HBL | R_HBL |
| B_EML | G_EML | R_EML |
| B_HT | G_HT | R_HT |
| HTL | | |

FIG.11

| B | G | R |
|---|---|---|
| B_ET | G_ET | R_ET |
| B_EML | G_EML | R_EML |
| B_HT | G_HT | R_HT |
| HTL |||

FIG.13

| B | G | R |
|---|---|---|
| B_ET | G_ET | R_ET |
| HBL | | |
| B_EML | G_EML | R_EML |
| EBL | | |
| B_HT | G_HT | R_HT |

FIG.14

| B | G | R |
|---|---|---|
| B_ET | G_ET | R_ET |
| HBL | | |
| B_EML | G_EML | R_EML |
| B_HT | G_HT | R_HT |
| HTL | | |

FIG.15

| B | G | R |
|---|---|---|
|  |  | ET |
|  | ET | HBL |
| ET | HBL | R_HBL |
| HBL | G_HBL | R_EML |
| B_EML | G_EML | R_HT2 |
| B_HT | G_HT | R_HT1 |
| HTL |||

FIG.16

| B | G | R |
|---|---|---|
|  | ET | |
| ET | G_HBL | R_HBL |
| B_HBL | G_EML | R_EML |
| B_EML | G_HT | R_HT |
| B_HT | | |
| HTL | | |

FIG.17

| B | G | R |
|---|---|---|
|  |  | ET |
|  | ET | R_HBL |
| ET | G_HBL | R_EML |
| B_HBL | G_EML | R_HT |
| B_EML | G_HT ||
| B_HT |||
| HTL |||

ORGANIC ELECTROLUMINESCENCE ELEMENT, DISPLAY DEVICE, AND ELECTRONIC APPARATUS

TECHNICAL FIELD

The present invention relates to an organic electroluminescence device, a display, and an electronic device.

BACKGROUND ART

An organic electroluminescence device (hereinafter, referred to as an organic EL device) includes an emitting layer between an anode and a cathode, where holes are injected from the anode and electrons are injected from the cathode into the emitting layer and the holes and the electrons are recombined to emit light.

An organic EL device including an emitting layer that is divided in color into a red emitting layer, a green emitting layer, and a blue emitting layer has been known as an organic EL device for a full color display.

In such an organic EL device as including differently colored emitting layers, a method of adjusting a thickness of surroundings of the emitting layer has been known as one method for improving a luminous efficiency.

For instance, Patent Literature 1 discloses an organic luminescent device including: a substrate; a first electrode; a second electrode; an organic layer interposed between the first electrode and the second electrode and including a hole injecting layer and an emitting layer, in which the emitting layer includes a red emitting layer, a green emitting layer and a blue emitting layer; at least one of (a) a first auxiliary layer interposed between the hole injecting layer and the red emitting layer and configured to adjust a resonance period of a red light or (b) a second auxiliary layer interposed between the hole injecting layer and the green emitting layer and configured to adjust a resonance period of a green light, in which a substance forming the first auxiliary layer is different from a substance forming the hole injecting layer and a substance forming the second auxiliary layer is different from the substance forming the hole injecting layer.

On the other hand, a fluorescent organic EL device with use of thermally activated delayed fluorescence (hereinafter, sometimes simply referred to as "delayed fluorescence") has been proposed and studied as an organic EL device.

For instance, TADF (Thermally Activated Delayed Fluorescence) mechanism has been studied. The TADF mechanism employs a phenomenon that inverse intersystem crossing from triplet excitons to singlet excitons thermally occurs when a material having a small energy difference ($\Delta ST$) between a singlet level and a triplet level is used. Thermally activated delayed fluorescence is described, for instance, in "Yuki Hando-tai no Debaisu Bussei (Device Physics of Organic Semiconductors)" (edited by ADACHI, Chihaya, published by Kodansha, issued on Apr. 1, 2012, on pages 261-268).

CITATION LIST

Patent Literature(S)

Patent Literature 1: JP2008-288201 A

SUMMARY OF THE INVENTION

Problem(s) to be Solved by the Invention

In recent years, an organic EL device is required to be further improved in a luminous efficiency.

In particular, since an organic EL device with use of the TADF mechanism emits light through a mechanism different from that of a typical fluorescent organic EL device, it is important to design a structure of such an organic EL device in consideration of characteristic light emission by a TADF material.

An object of the invention is to provide an organic electroluminescence device capable of improving a luminous efficiency, and a display device and an electronic device each including the organic electroluminescence device.

Means for Solving the Problems

According to an aspect of the invention, an organic electroluminescence device includes at least a first pixel and a blue pixel apposed on a substrate, in which the first pixel and the blue pixel each include an anode and a cathode, the first pixel includes a first emitting layer between the anode and the cathode, and the blue pixel includes a blue emitting layer between the anode and the cathode;
  a hole transporting zone interposed between the first emitting layer and the anode and between the blue emitting layer and the anode; and
  an electron transporting zone interposed between the first emitting layer and the cathode and between the blue emitting layer and the cathode, in which
  the first emitting layer includes a delayed fluorescent second compound, and a fluorescent first compound emittable in a range from 500 nm to 660 nm, and
  the electron transporting zone includes: a first common layer shared by the first pixel and the blue pixel; and an additional layer interposed between the first emitting layer and the cathode in the first pixel.

According to another aspect of the invention, an organic electroluminescence device includes a red pixel, a green pixel, and a blue pixel apposed on a substrate, in which the red pixel, the green pixel, and the blue pixel each include an anode and a cathode, the red pixel includes a red emitting layer between the anode and the cathode, the green pixel includes a green emitting layer between the anode and the cathode, and the blue pixel includes a blue emitting layer between the anode and the cathode;
  a hole transporting zone interposed between the red emitting layer and the anode, between the green emitting layer and the anode, and between the blue emitting layer and the anode; and
  an electron transporting zone between the red emitting layer and the cathode, between the green emitting layer and the cathode, and between the blue emitting layer and the cathode, in which
  the red emitting layer contains a delayed fluorescent second compound and a red fluorescent first compound, and
  the electron transporting zone includes: a first common layer provided in common in the red pixel, the green pixel, and the blue pixel; and an additional layer interposed between the red emitting layer and the cathode in the red pixel.

According to still another aspect of the invention, an organic electroluminescence device includes a red pixel, a green pixel, and a blue pixel apposed on a substrate, in which the red pixel, the green pixel, and the blue pixel each include an anode and a cathode, the red pixel includes a red emitting layer between the anode and the cathode, the green pixel includes a green emitting layer between the anode and the cathode, and the blue pixel includes a blue emitting layer between the anode and the cathode;
  a hole transporting zone interposed between the red emitting layer and the anode, between the green emitting layer and the anode, and between the blue emitting layer and the anode; and
  an electron transporting zone between the red emitting layer and the cathode, between the green emitting layer and the cathode, and between the blue emitting layer and the cathode, in which
  the green emitting layer contains a delayed fluorescent second compound and a green fluorescent first compound, and
  the electron transporting zone includes: a first common layer provided in common in the red pixel, the green pixel, and the blue pixel; and an additional layer interposed between the green emitting layer and the cathode in the green pixel.

A display according to a further aspect of the invention is installed with the organic electroluminescence device according to any one of the above aspects.

An electronic device according to a still further aspect of the invention is installed with the organic electroluminescence device according to any one of the above aspects.

According to the above aspects of the invention, an organic electroluminescence device capable of improving a luminous efficiency, and a display and an electronic device installed with the organic electroluminescence device can be provided.

BRIEF DESCRIPTION OF DRAWINGS

FIG. 7 schematically illustrates a partial cross section of an organic EL device according to an exemplary embodiment of the invention.

FIG. 8 schematically illustrates a partial cross section of an organic EL device according to another exemplary embodiment of the invention.

FIG. 9 schematically illustrates a partial cross section of an organic EL device according to still another exemplary embodiment of the invention.

FIG. 10 schematically illustrates a partial cross section of an organic EL device according to a further exemplary embodiment of the invention.

FIG. 11 schematically illustrates a partial cross section of an organic EL device according to a still further exemplary embodiment of the invention.

FIG. 13 schematically illustrates a partial cross section of an organic EL device according to a still further exemplary embodiment of the invention.

FIG. 14 schematically illustrates a partial cross section of an organic EL device according to a still further exemplary embodiment of the invention.

FIG. 15 schematically illustrates a partial cross section of an organic EL device according to a still further exemplary embodiment of the invention.

FIG. 16 schematically illustrates a partial cross section of an organic EL device according to a still further exemplary embodiment of the invention.

FIG. 17 schematically illustrates a partial cross section of an organic EL device according to a still further exemplary embodiment of the invention.

DESCRIPTION OF EMBODIMENT(S)

Exemplary Embodiment

Figure 1:
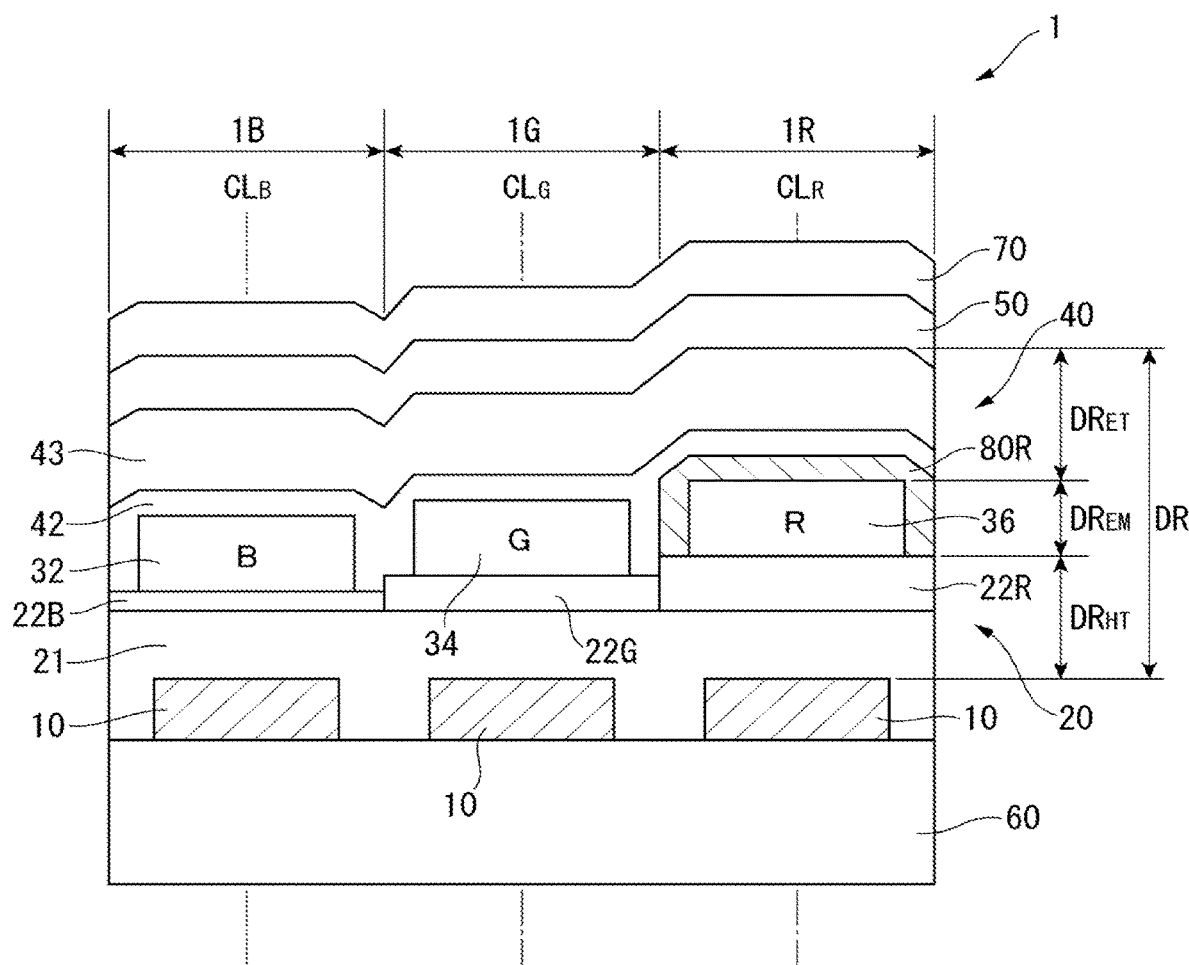
FIG. 1 schematically illustrates an arrangement of an organic EL device according to a first exemplary embodiment of the invention.

An exemplary arrangement of an organic EL device according to an exemplary embodiment of the invention will be described with reference to FIG. 18.

An organic EL device 11 of the exemplary embodiment includes a substrate 60, and a first pixel 1F and a blue pixel 1B apposed on the substrate 60.

Each of the first pixel 1F and the blue pixel 1B includes an anode 10 and a cathode 50. In the exemplary embodiment, a capping layer 70 is further provided on the cathode 50.

Between the anode 10 and the cathode 50, the first pixel 1F has a first emitting layer 36F and the blue pixel 1B has a blue emitting layer 32.

Figure 18:
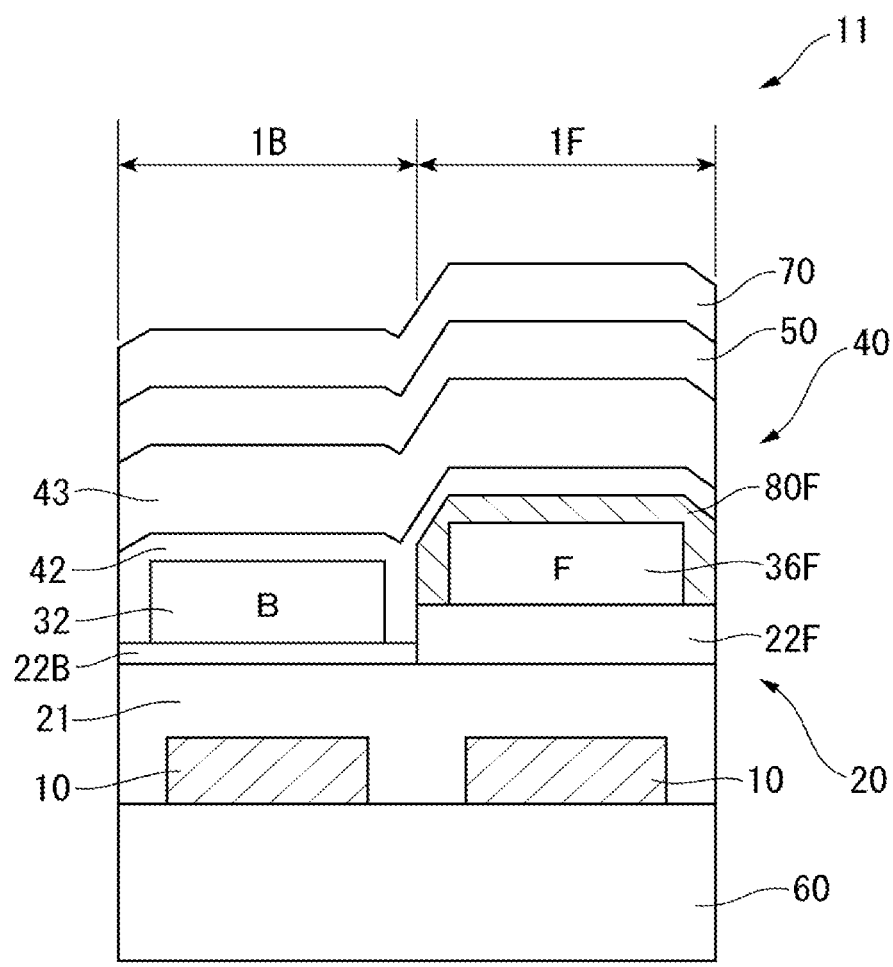
FIG. 18 illustrates a schematic arrangement of an organic EL device according to a still further exemplary embodiment of the invention.

In FIG. 18, the blue emitting layer 32 is denoted as B and the first emitting layer 36F is denoted as F.

A hole transporting zone 20 is provided between the first emitting layer 36F and the anode 10 and between the blue emitting layer 32 and the anode 10.

An electron transporting zone 40 is provided between the first emitting layer 36F and the cathode 50 and between the blue emitting layer 32 and the cathode 50.

In the organic EL device 11, the first emitting layer 36F includes a delayed fluorescent second compound and a fluorescent first compound capable of emitting light in a range from 500 nm to 660 nm.

In the exemplary embodiment, the electron transporting zone 40 includes: an additional layer (e.g., a hole blocking layer 80F in FIG. 18, however, the additional layer is not limited to the hole blocking layer as long as the additional layer is interposed between the first emitting layer 36F and the cathode 50) interposed between the first emitting layer 36F and the cathode 50; a first common layer (e.g., a hole blocking layer 42 in FIG. 18, however, the first common layer is not limited to the hole blocking layer) provided entirely on the hole blocking layer 80F and the blue emitting layer 32 in a shared manner; and an electron transporting layer 43 provided on the hole blocking layer 42. The additional layer (the hole blocking layer 80F in FIG. 18) and the first common layer (the hole blocking layer 42 in FIG. 18) may be made of the same material or different materials.

The electron transporting zone 40 may include an electron injecting layer and the like between the electron transporting layer 43 and the cathode 50.

The hole transporting zone 20 preferably includes: a second common layer (e.g., a hole transporting layer 21 in FIG. 18, however, the second common layer is not limited to a hole transporting layer) provided in common through pixels (the first pixel 1F and the blue pixel 1B); and electron blocking layers 22F and 22B formed in the respective pixels. The hole transporting zone 20 may include a hole injecting layer and the like between the hole transporting layer 21 and the anode 10.

The additional layer (the hole blocking layer 80F in FIG. 18) is a non-common layer described later.

For instance, the first pixel 1F may be a red pixel or a green pixel.

Although FIG. 18 clearly shows the first pixel 1F and the blue pixel 1B, another pixel may be included.

Relationship Between First Compound and Second Compound in First Emitting Layer

In the organic EL device 11 of the exemplary embodiment, a lowest singlet energy $S_1(M1)$ of the first compound and a lowest singlet energy $S_1(M2)$ of the second compound contained in the first emitting layer 36F preferably satisfy a relationship of Numerical Formula 3 below.

$$S_1(M2) > S_1(M1) \quad \text{(Numerical Formula 3)}$$

In the organic EL device 11 of the exemplary embodiment, an electron affinity level Af(M2) of the second compound and an electron affinity level Af(M1) of the first compound contained in the first emitting layer 36F preferably satisfy a relationship of Numerical Formula 4 below.

When the Numerical Formula 4 is satisfied, the luminous efficiency is considered to be further improved due to the same reason as that described in the later-described "Relationship between First Compound and Second Compound in Red Emitting Layer".

$$Af(M2) < Af(M1) \quad \text{(Numerical Formula 4)}$$

Relationship Between First Compound, Second Compound and Third Compound in First Emitting Layer In the organic EL device 11 of the exemplary embodiment, when the first emitting layer 36F contains the first, second and third compounds, a lowest singlet energy $S_1(M3)$ of the third compound and the lowest singlet energy $S_1(M2)$ of the second compound preferably satisfy a relationship of Numerical Formula 5 below.

$$S_1(M3) > S_1(M2) \quad \text{(Numerical Formula 5)}$$

In the organic EL device 11 according to the exemplary embodiment, when the first emitting layer 36F contains the first compound, the second compound, and the third compound, it is preferable that the electron affinity level Af(M2) of the second compound and an electron affinity level Af(M3) of the third compound satisfy a relationship of the following Numerical Formula 6.

When the numerical Formula 6 is satisfied, the luminous efficiency is considered to be further improved due to the same reason as that described in the later-described "Relationship between First Compound, Second Compound and Third Compound in Red Emitting Layer".

$$Af(M3) < Af(M2) \quad \text{(Numerical Formula 6)}$$

In the organic EL device 11 of the exemplary embodiment, it is preferable that the anode 10 is a reflective electrode and the cathode 50 is a light transmissive electrode.

As the exemplary embodiments of the invention, a first exemplary embodiment, a second exemplary embodiment and a second exemplary embodiment A will be described.

First Exemplary Embodiment

Arrangement(s) of an organic EL device according to a first exemplary embodiment of the invention will be described with reference to FIG. 1.

The organic EL device 1 of the first exemplary embodiment shown in FIG. 1 includes the substrate 60, and a red pixel 1R, a green pixel 1G and a blue pixel 1B apposed on the substrate 60.

The red pixel 1R, the green pixel 1G, and the blue pixel 1B each include the anode 10 and the cathode 50. In the first exemplary embodiment, the capping layer 70 is further provided on the cathode 50.

Between the anode 10 and the cathode 50, the red pixel 1R has a red emitting layer 36, the green pixel 1G has a green emitting layer 34, and the blue pixel 1B has a blue emitting layer 32.

In FIG. 1, the blue emitting layer 32 is represented by B, the green emitting layer 34 is represented by G, and the red emitting layer 36 is represented by R.

The hole transporting zone 20 is provided between the red emitting layer 36 and the anode 10, between the green emitting layer 34 and the anode 10, and between the blue emitting layer 32 and the anode 10.

The electron transporting zone 40 is provided between the red emitting layer 36 and the cathode 50, between the green emitting layer 34 and the cathode 50, and between the blue emitting layer 32 and the cathode 50.

In the organic EL device 1, the red emitting layer 36 contains a delayed fluorescent second compound and a red fluorescent first compound.

In the first exemplary embodiment, the electron transporting zone 40 includes: an additional layer (e.g., a hole blocking layer 80R in FIG. 1, however, the additional layer is not limited to the hole blocking layer as long as the additional layer is interposed between the red emitting layer 36 and the cathode 50) interposed between the red emitting layer 36 and the cathode 50; a first common layer (e.g., a hole blocking layer 42 in FIG. 1, however, the first common layer is not limited to the hole blocking layer) provided entirely on the hole blocking layer 80R, the green emitting layer 34 and the blue emitting layer 32 in a shared manner; and the electron transporting layer 43 provided on the hole blocking layer 42. The additional layer (the hole blocking layer 80R in FIG. 1) and the first common layer (the hole blocking layer 42 in FIG. 1) may be made of the same material or different materials. The electron transporting zone 40 may include the electron injecting layer and the like between the electron transporting layer 43 and the cathode 50.

The hole transporting zone 20 preferably includes: a second common layer (e.g., the hole transporting layer 21 in FIG. 1, however, the second common layer is not limited to the hole transporting layer) provided through pixels (a red pixel 1R, a green pixel 1G and a blue pixel 1B) in a shared manner; and electron blocking layers 22R, 22G, 22B formed in the respective pixels. The hole transporting zone 20 may include the hole injecting layer and the like between the hole transporting layer 21 and the anode 10.

Herein, the "layer provided in a shared manner" means a layer made of the same material and having the same thickness.

Herein, the layer that is made of the same material, has the same thickness, and is formed through two or more pixels among the red pixel 1R, the green pixel 1G and the blue pixel 1B is sometimes referred to as a "common layer."

On the other hand, a layer provided on one of the red pixel 1R, the green pixel 1G and the blue pixel 1B is sometimes referred to as a "non-common layer."

In FIG. 1, the hole transporting layer 21, the hole blocking layer 42, and the electron transporting layer 43 are the common layers. The electron blocking layers 22B, 22G, 22R, the blue emitting layer 32, the green emitting layer 34, the red emitting layer 36, and the hole blocking layer 80R (additional layer) are the non-common layers.

Typically, an organic EL device usable for an electronic device such as a full color display panel is often manufactured according to a method of coating pixels of the hole transporting zone and the emitting layer in different colors using a mask and the like. However, in terms of manufacturing suitability, the hole transporting zone is desired to be formed in common through the RGB pixels before the RGB emitting layers are coated in the respective colors.

Meanwhile, in order exhibit a sufficient cavity effect, it is sometimes required to form, for instance, the anodes to the RGB emitting layers in different thicknesses for the respective RGB pixels. Accordingly, it is difficult at present to form the entire hole transporting zone in common through the RGB pixels, and the hole transporting zone is usually formed with parts coated in different colors for the respective pixels.

Under these circumstances, the inventors have found that, when the emitting layer of the red pixel contains the delayed fluorescent compound and the red fluorescent compound, a recombination region in the emitting layer is different from a typically-estimated region, specifically, holes and electrons are locally recombined in a region of the red emitting layer close to the electron transporting zone. Accordingly, it has been found that a typical method of coating the hole transporting zone in different colors and a typical method of coating a part of the hole transporting zone in different colors do not provide a sufficient cavity effect.

As a result of dedicated study, the inventors have found that a particular light emission caused by a delayed fluorescent compound is obtained at a high efficiency by providing the additional layer in the electron transporting zone of at least the red pixel among the RGB pixels, in other words, by providing a relatively thicker electron transporting zone in the red pixel than a typical electron transporting zone in a red pixel.

Specifically, in the organic EL device 1 of the present exemplary embodiment, the additional layer (hole blocking layer 80R in FIG. 1) is provided in the electron transporting zone 40 of the red pixel 1R. Although the thickness of the electron transporting zone 40 in the red pixel 1R is larger than the electron transporting zone 40 in the green pixel 1G and the blue pixel 1B in FIG. 1, a relationship between the RGB pixels in terms of the thickness of the electron transporting zone 40 is not limited to the relationship shown in FIG. 1. However, it is preferable that the thickness of the electron transporting zone 40 in the red pixel 1R is larger than the electron transporting zone 40 in the green pixel 1G and the blue pixel 1B. Further, such an arrangement that the first common layer (hole blocking layer 42 in FIG. 1) is provided in common in the red pixel 1R, the green pixel 1G, and the blue pixel 1B is employed. It is considered that providing of the additional layer in the electron transporting zone 40 of the red pixel 1R leads to overlapping of the recombination region in the red emitting layer 36, which is considered to be located in the electron transporting zone 40, with a position where the cavity effect can be suitably produced.

Since it is expected that holes and electrons are recombined in the recombination region, where the cavity effect can be suitably produced, in the red pixel 1R in the present exemplary embodiment, it is considered that a particular light emission caused by a delayed fluorescent compound can be obtained from the red emitting layer 36 at a high efficiency.

Accordingly, the organic EL device of the present exemplary embodiment can improve the luminous efficiency.

Further, according to the organic EL device of the present exemplary embodiment, the roll-off value [(current efficiency at 10 mA/cm$^2$ of the current density)/(current efficiency at 1 mA/cm$^2$ of the current density)] can be made closer to 1. This effect of the roll-off value is unexpected from the cavity effect.

Accordingly, the organic EL device in the present exemplary embodiment can also improve roll-off characteristics when driven at a high current density (e.g., from 1 mA/cm$^2$ to 10 mA/cm$^2$).

Herein, a hole transporting zone means a region in which holes transfer. The hole mobility $\mu^H$ in the hole transporting zone is preferably $10^{-6}$ cm$^2$/[V·s] or more.

The hole transporting zone may be a single layer or a plurality of layers.

Examples of layers forming the hole transporting zone include a hole injecting layer, a hole transporting layer, and an electron blocking layer.

The hole mobility $\mu$cm$^2$/[V·s] can be measured according to impedance spectroscopy disclosed in JP 2014-110348 A.

The electron transporting zone means a region in which electrons transfer. The electron mobility $\mu^E$ in the electron transporting zone is preferably $10^{-6}$ cm$^2$/[V·s] or more.

Examples of layers forming the electron transporting zone include an electron injecting layer, an electron transporting layer, and a hole blocking layer.

The electron mobility $\mu^E$ cm$^2$/[V·s] can be measured according to impedance spectroscopy disclosed in JP 2014-110348 A.

The second common layer (hole transporting layer 21 in FIG. 1) may be formed in each of the RGB pixels. However, the second common layer is preferably formed in common through the red pixel 1R, the green pixel 1G, and the blue pixel 1B. With this arrangement, productivity of the organic EL device is improved.

Specifically, in the organic EL device 1 of the present exemplary embodiment, the hole transporting zone 20 preferably includes the second common layer formed in common in the red pixel 1R, the green pixel 1G, and the blue pixel 1B.

In the organic EL device 1 of the present exemplary embodiment, it is preferable that the anode 10 is a reflective electrode and the cathode 50 is a light transmissive electrode.

In the organic EL device 1 of the present exemplary embodiment, in order to further improve the luminous efficiency, a total thickness DR of a thickness DR$_{ET}$ of the electron transporting zone 40 in the red pixel 1R, a thickness DR$_{HT}$ of the hole transporting zone 20 in the red pixel 1R, and a thickness DR$_{EM}$ of the red emitting layer 36 preferably satisfies a relationship with the thickness DR$_{ET}$, which is represented by Numerical Formula 1 below. The total thickness DR in the Numerical Formula 1 is represented by Numerical Formula 1A below. A unit is [nm].

$$0.15 \leq DR_{ET}/DR \leq 0.50 \quad \text{(Numerical Formula 1)}$$

$$DR = DR_{ET} + DR_{HT} + DR_{EM} \quad \text{(Numerical Formula 1A)}$$

Herein, the thickness $DR_{ET}$ of the electron transporting zone 40 does not include a thickness of a layer formed of only an alkali metal, alkaline earth metal or a compound thereof (e.g., lithium quinolate Liq), examples of which include lithium (Li), cesium (Cs), calcium (Ca), lithium fluoride (LiF), cesium fluoride (CsF), calcium fluoride ($CaF_2$), and lithium oxide ($Li_2O$), or a thickness of layers formed of only these corn pounds.

Herein, the thickness $DR_{ET}$ of the electron transporting zone 40 includes a thickness of a layer concurrently containing an alkali metal, alkaline earth metal or a compound thereof (e.g., lithium quinolate Liq), examples of which include lithium (Li), cesium (Cs), calcium (Ca), lithium fluoride (LiF), cesium fluoride (CsF), calcium fluoride ($CaF_2$), and lithium oxide ($Li_2O$), and other organic compound(s).

When $DR_{ET}/DR$ is equal to or more than 0.15 in the Numerical Formula 1, the recombination region of the red emitting layer 36 is likely to be shifted to a position where the cavity effect can be sufficiently exhibited. $DR_{ET}/DR$ is preferably 0.17 or more, more preferably 0.20 or more.

$DR_{ET}/DR$ is preferably 0.45 or less, more preferably 0.40 or less.

$DR_{ET}/DR$ is preferably in a range from 0.17 to 0.45, more preferably in a range from 0.20 to 0.40.

The thickness $DR_{ET}$ of the electron transporting zone 40 in the red pixel 1R is measured as follows.

A central part (reference numeral $CL_R$ in FIG. 1) of the red pixel 1R of the organic EL device 1 is cut in a perpendicular direction (i.e., a thickness direction of the electron transporting zone 40) relative to a formation surface of the electron transporting zone 40. A cut surface of the central part is observed and measured with a transmission electron microscope (TEM). In FIG. 1, a central part of the green pixel 1G is denoted by a reference numeral $CL_G$ and a central part of the blue pixel 1B is denoted by a reference numeral $CL_B$.

A thickness $DR_{HT}$ of the hole transporting zone 20 in the red pixel 1R and a thickness $DR_{EM}$ of the red emitting layer 36 can be measured in the same manner.

The central part of the organic EL device 1 means a central part of a shape of the organic EL device 1 projected from the cathode. For instance, when the projected shape is rectangular, the central part means an intersection of diagonals of the rectangular shape.

Herein, when a target zone or layer includes a plurality of layers, a thickness means a total thickness of the plurality of layers.

Manufacturing Method of Organic EL Device

A manufacturing method of the organic EL device 1 according to the present exemplary embodiment will be detailed.

The anode 10 was layered on the substrate 60 and patterned. In a top emission type organic EL device, a metal layer (e.g., APC layer), which is a reflective layer, is used as the anode 10. In a bottom emission type organic EL device, an indium tin oxide (ITO), indium zinc oxide or the like, which is a transparent electrode, is used as the anode 10.

Next, the hole transporting layer 21 is formed as the second common layer entirely (in common) on the anode 10 by vacuum deposition method or the like. The hole transporting layer 21 is formed of the same material and with the same thickness. It should be noted that, before the hole transporting layer 21 is layered, the hole injecting layer may be disposed between the hole transporting layer 21 and the anode 10. The hole injecting layer is also preferably formed in common.

Next, on the hole transporting layer 21 and in a region corresponding to the anode 10 of the blue pixel 1B, by the vacuum deposition method or the like, the electron blocking layer 22B is formed using a predetermined film-forming mask, and the blue emitting layer 32 is formed on the electron blocking layer 22B with a predetermined thickness. In the same manner, on the hole transporting layer 21 and in a region corresponding to the anode 10 of the green pixel 1G, the electron blocking layer 22G is formed using a predetermined film-forming mask, and the green emitting layer 34 is formed on the electron blocking layer 22G with a predetermined thickness. In the same manner, on the hole transporting layer 21 and in a region corresponding to the anode 10 of the red pixel 1R, the electron blocking layer 22R is formed using a predetermined film-forming mask, and the red emitting layer 36 is formed on the electron blocking layer 22R with a predetermined thickness. The electron blocking layers 22B, 22G, 22R are formed of different materials with different thicknesses. The blue emitting layer 32, the green emitting layer 34, and the red emitting layer 36 are formed of different materials. The thicknesses of the respective emitting layers may be the same or different.

Next, the hole blocking layer 80R as the additional layer is formed entirely on the red emitting layer 36 with a predetermined thickness by the vacuum deposition method or the like. Next, the hole blocking layer 42 as the first common layer is formed entirely (formed in common) on the blue emitting layer 32, the green emitting layer 34, and the hole blocking layer 80R. The electron transporting layer 43 is further formed entirely (formed in common) on the hole blocking layer 42. The hole blocking layer 42 and the electron transporting layer 43 are formed of the same material and with the same thickness.

Next, the cathode 50 is layered on the electron transporting layer 43 and the capping layer 70 is further layered on the cathode 50 by the vacuum deposition method or the like. It should be noted that, before the cathode 50 is layered, the electron injecting layer may be disposed between the electron transporting layer 43 and the cathode 50. The electron injecting layer is also preferably formed in common.

The organic EL device 1 shown in FIG. 1 is completed as described above.

The electron transporting zone 40 may consist of the additional layer (the hole blocking layer 80R in FIG. 1) in the red device 1R and the first common layer (the hole blocking layer 42 in FIG. 1), or may further include at least one of the electron injecting layer, the electron transporting layer, and the hole blocking layer to provide three or more layers.

The layers other than the additional layers in the electron transporting zone 40 may be the common layer or the non-common layer. However, the common layer is preferable in terms of the manufacturing efficiency.

The hole transporting zone 20 may consist of the second common layer (the hole transporting layer 21 in FIG. 1), or may further include at least one of the hole injecting layer, the hole transporting layer, and the electron blocking layer to provide two or more layers.

The layers in the hole transporting zone 20 may be the common layer or the non-common layer. However, the common layer is preferable in terms of the manufacturing efficiency.

The emitting layer of the organic EL device of the invention includes the blue pixel 1B, the green pixel 1G, and the red pixel 1R. The blue pixel 1B, the green pixel 1G, and the red pixel 1R include the blue emitting layer 32, the green emitting layer 34, and the red emitting layer 36, respectively. A voltage is applied to each pixel independently. Accordingly, in the organic EL device 1 of FIG. 1, the blue emitting layer 32, the green emitting layer 34 and the red emitting layer 36 do not always simultaneously emit light, but can emit light independently selectively. The organic EL device 1 in the present exemplary embodiment may include one each of the blue pixel 1B, the green pixel 1G, and the red pixel 1R, which may be repeated as one unit. Alternatively, each pixel may be provided by a plurality of ones. For instance, an arrangement of a single blue pixel 1B, two green pixels 1G, and a single red pixel 1R may be repeated as one unit.

Arrangement(s) of an organic EL device according to the present exemplary embodiment will be detailed below. The codes will be omitted in the description below.

Red Pixel

The red pixel includes a red emitting layer.

Red Emitting Layer

The red emitting layer contains a delayed fluorescent second compound and a red fluorescent first compound.

The red emitting layer may contain a metal complex.

It is preferable that the red emitting layer does not contain a phosphorescent metal complex. It is also preferable that the red emitting layer does not contain a metal complex.

It is preferable that the first compound is a dopant material (sometimes referred to as a guest material, emitter, or emitting material) and the second compound is preferably a host material (sometimes referred to as a matrix material).

First Compound

The first compound is a fluorescent compound capable of emitting light in a range from 500 nm to 660 nm.

When the emitting layer is the red emitting layer, any red fluorescent compound is usable as the first compound without particular limitation.

When the emitting layer is the red emitting layer, the first compound is also preferably a compound represented by a formula (1) below.

[Formula 1]

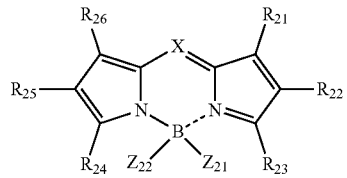

(1)

In the formula (1): X is a nitrogen atom, or a carbon atom to be bonded to Y; Y is a hydrogen atom or substituent; $R_{21}$ to $R_{26}$ are each independently a hydrogen atom or a substituent, at least one combination of a combination of $R_{21}$ and $R_{22}$, a combination of $R_{22}$ and $R_{23}$, a combination of $R_{24}$ and $R_{25}$, and a combination of $R_{25}$ and $R_{26}$ are mutually bonded to form a ring.

Y and $R_{21}$ to $R_{26}$ being the substituent are each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, a substituted or unsubstituted alkylthio group having 6 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 7 to 30 carbon atoms, a substituted or unsubstituted heteroaryl group having 5 to 30 ring atoms, a halogen atom, a carboxy group, a substituted or unsubstituted ester group, a substituted or unsubstituted carbamoyl group, a substituted or unsubstituted amino group, a nitro group, a cyano group, a substituted or unsubstituted silyl group, and a substituted or unsubstituted siloxanyl group.

$Z_{21}$ and $Z_{22}$ are each independently a substituent, or are mutually bonded to form a ring.

$Z_{21}$ and $Z_{22}$ being the substituent are each independently selected from the group consisting of a halogen atom, a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

In the formula (1), for instance, when a combination of $R_{25}$ and $R_{26}$ are mutually bonded to form a ring, the first compound is represented by a formula (11) below.

[Formula 2]

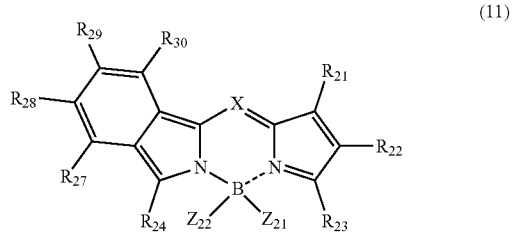

(11)

In the formula (11), X, Y, $R_{21}$ to $R_{24}$, $Z_{21}$, and $Z_{22}$ represent the same as X, Y, $R_{21}$ to $R_{24}$, $Z_{21}$, and $Z_{22}$ in the formula (1), respectively. $R_{27}$ to $R_{30}$ are each independently a hydrogen atom or a substituent, the substituent for $R_{27}$ to $R_{30}$ being the same as the substituent for $R_{21}$ to $R_{24}$.

In the formula (1), when $Z_{21}$ and $Z_{22}$ are mutually bonded to form a ring, the first compound is represented by, for instance, a formula (1A) or a formula (1B) below. However, the structure of the first compound is not limited to the structures below.

[Formula 3]

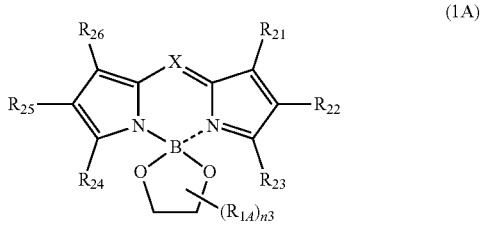

(1A)

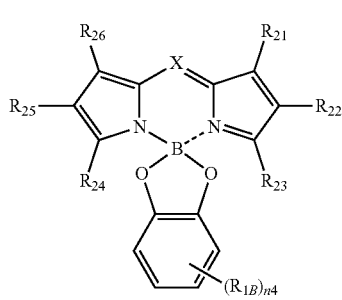

(1B)

In the formula (1A), X, Y and $R_{21}$ to $R_{26}$ are the same as X, Y, and $R_{21}$ to $R_{26}$ in the formula (1), respectively. $R_{1A}$ are each independently a hydrogen atom or a substituent, $R_{1A}$ as a substituent being the same as the substituent for $R_{21}$ to $R_{26}$. n3 is 4.

In the formula (1B), X, Y and $R_{21}$ to $R_{26}$ represent the same as X, Y, and $R_{21}$ to $R_{26}$ in the formula (1), respectively. RIB are each independently a hydrogen atom or a substituent, the substituent for RIB being selected from the same group for the substituent for $R_{21}$ to $R_{26}$. n4 is 4.

At least one of $Z_{21}$ and $Z_{22}$ (preferably $Z_{21}$ and $Z_{22}$) is preferably a group selected from the group consisting of a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

It is more preferable that at least one of $Z_{21}$ and $Z_{22}$ is a group selected from the group consisting of a fluorine-atom-substituted alkoxy group having 1 to 30 carbon atoms, a fluorine-atom-substituted aryloxy group having 6 to 30 ring carbon atoms, and a fluoroalkyl-group-substituted aryloxy group having 6 to 30 ring carbon atoms.

Further preferably, at least one of $Z_{21}$ or $Z_{22}$ is a fluorine-substituted alkoxy group having 1 to 30 carbon atoms. Even more preferably, both of $Z_{21}$ and $Z_{22}$ are fluorine-substituted alkoxy groups having 1 to 30 carbon atoms.

It is also preferable that both of $Z_{21}$ and $Z_{22}$ are the same with each other.

Meanwhile, it is also preferable that at least one of $Z_{21}$ and $Z_{22}$ is a fluorine atom. More preferably, $Z_{21}$ and $Z_{22}$ are fluorine atoms.

It is also preferable that at least one of $Z_{21}$ and $Z_{22}$ is represented by formula (1a) below.

[Formula 4]

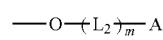

(1a)

In the formula (1a), A is a substituted or unsubstituted alkyl group having 1 to 6 carbon atoms, a substituted or unsubstituted alkyl halide group having 1 to 6 carbon atoms, or a substituted or unsubstituted aryl group having 6 to 12 ring carbon atoms, $L_2$ is a substituted or unsubstituted alkylene group having 1 to 6 carbon atoms, or a substituted or unsubstituted arylene group having 6 to 12 ring carbon atoms, m is 0, 1, 2, 3, 4, 5, 6, or 7, and, when m is 2, 3, 4, 5, 6, or 7, a plurality of $L_2$ are mutually the same or different. m is preferably 0, 1, or 2. When m is 0, A is directly bonded to O (oxygen atom).

In the formula (1), when $Z_{21}$ and $Z_{22}$ each are a group represented by the formula (1a), the first compound is a compound represented by a formula (10) below.

The first compound is also preferably represented by the formula (10).

[Formula 5]

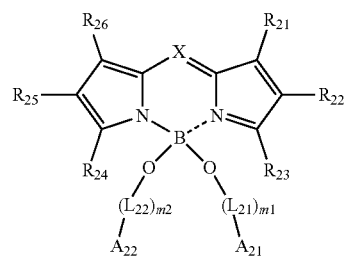

(10)

In the formula (10), X, Y bonded to X that is a carbon atom, and $R_{21}$ to $R_{26}$ represent the same as X, Y, and $R_{21}$ to $R_{26}$, respectively, in the formula (1). $A_{21}$ and $A_{22}$ represent the same as A in the formula (1a) and may be mutually the same or different. $L_{21}$ and $L_{22}$ represent the same as $L_2$ in the formula (1a) and may be mutually the same or different. m1 and m2 are each independently 0, 1, 2, 3, 4, 5, 6 or 7, preferably 0, 1 or 2. When m1 is 2, 3, 4, 5, 6 or 7, a plurality of $L_{21}$ are mutually the same or different. When m2 is 2, 3, 4, 5, 6 or 7, a plurality of $L_{22}$ are mutually the same or different. When m1 is 0, $A_{21}$ is directly bonded to O (oxygen atom). When m2 is 0, $A_{22}$ is directly bonded to O (oxygen atom).

At least one of A and $L_2$ in the formula (1a) is preferably substituted by a halogen atom, more preferably by a fluorine atom.

A in the formula (1a) is more preferably a perfluoroalkyl group having 1 to 6 carbon atoms or a perfluoroaryl group having 6 to 12 ring carbon atoms, further preferably a perfluoroalkyl group having 1 to 6 carbon atoms.

$L_2$ in the formula (1a) is more preferably a perfluoroalkylene group having 1 to 6 carbon atoms or a perfluoroarylene group having 6 to 12 ring carbon atoms, further preferably a perfluoroalkylene group having 1 to 6 carbon atoms.

Specifically, the first compound is also preferably a compound represented by a formula (10a) below.

[Formula 6]

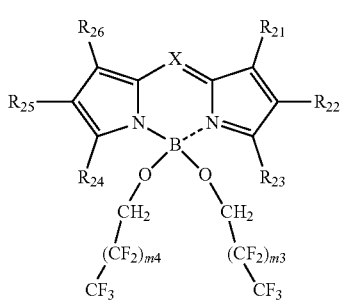

(10a)

In the formula (10a), X represents the same as X in the formula (1); Y when X is a carbon atom bonded to Y represents the same as Y in the formula (1);

$R_{21}$ to $R_{26}$ each independently represent the same as $R_{21}$ to $R_{26}$ in the formula (1);

m3 is in a range from 0 to 4;

m4 is in a range from 0 to 4; and m3 and m4 are mutually the same or different.

In the formulae (1), (11), (10) and (10a), X is a carbon atom bonded to Y; Y is a hydrogen atom or a substituent; Y as a substituent is preferably a substituent selected from the group consisting of a substituted or unsubstituted alkyl group having 1 to 30 carbon atoms, a substituted or unsubstituted alkyl halide group having 1 to 30 carbon atoms, and a substituted or unsubstituted aryl group having 6 to 30 ring carbon atoms, more preferably a substituted or unsubstituted aryl group having 6 to 30 ring carbon atoms.

In the formulae (1), (11), (10) and (10a), it is more preferable that X is a carbon atom bonded to Y; Y is a hydrogen atom or a substituent; Y as a substituent is a substituted or unsubstituted aryl group having 6 to 30 ring carbon atoms; when Y as a substituent is an aryl group having 6 to 30 ring carbon atoms having a substituent, the substituent is a substituted or unsubstituted alkyl group having 1 to 30 carbon atoms, a substituted or unsubstituted alkyl halide group having 1 to 30 carbon atoms, a substituted or unsubstituted alkoxy group having 1 to 30 carbon atoms, a substituted or unsubstituted alkoxy halide group having 1 to 30 carbon atoms, or an aryl group having 6 to 30 ring carbon atoms and substituted with an alkyl group having 1 to 30 carbon atoms.

Though $Z_{21}$ and $Z_{22}$ of the first compound may be mutually bonded to form a ring, $Z_{21}$ and $Z_{22}$ are preferably not bonded.

In the formulae (1), (10) and (10a), at least one of $R_{21}$, $R_{23}$, $R_{24}$ and $R_{26}$ is preferably a substituted or unsubstituted alkyl group having 1 to 30 carbon atoms or a substituted or unsubstituted alkyl halide group 1 to 30 carbon atoms.

In the formulae (1), (10) and (10a), $R_{21}$, $R_{23}$, $R_{24}$ and $R_{26}$ are more preferably a substituted or unsubstituted alkyl group having 1 to 30 carbon atoms or a substituted or unsubstituted alkyl halide group having 1 to 30 carbon atoms. In this case, $R_{22}$ and $R_{25}$ are preferably hydrogen atoms.

In the formulae (1), (10) and (10a), at least one of $R_{21}$, $R_{23}$, $R_{24}$ and $R_{26}$ is preferably a substituted or unsubstituted aryl group having 6 to 30 ring carbon atoms.

In the formulae (1), (10) and (10a), $R_{21}$, $R_{23}$, $R_{24}$ and $R_{26}$ are more preferably a substituted or unsubstituted aryl group having 6 to 30 ring carbon atoms. In this case, $R_{22}$ and $R_{25}$ are preferably hydrogen atoms.

In the formulae (1), (10) and (10a), it is more preferable that $R_{21}$, $R_{23}$, $R_{24}$, and $R_{26}$ are each independently a substituted or unsubstituted alkyl group having 1 to 30 carbon atoms (preferably 1 to 6 carbon atoms), a substituted or unsubstituted alkyl halide group having 1 to 30 carbon atoms (preferably 1 to 6 carbon atoms), or an aryl group having 6 to 30 ring carbon atoms (preferably 6 to 12 ring carbon atoms) and substituted by an alkyl group having 1 to 30 carbon atoms, and $R_{22}$ and $R_{25}$ are hydrogen atoms.

In the formula (11), at least one of $R_{21}$, $R_{23}$ and $R_{24}$ is preferably a substituted or unsubstituted alkyl group having 1 to 30 carbon atoms or a substituted or unsubstituted alkyl halide group having 1 to 30 carbon atoms.

In the formula (11), $R_{21}$, $R_{23}$ and $R_{24}$ are more preferably a substituted or unsubstituted alkyl group having 1 to 30 carbon atoms or a substituted or unsubstituted alkyl halide group having 1 to 30 carbon atoms. In this case, $R_{22}$ is preferably a hydrogen atom.

In the formula (11), at least one of $R_{21}$, $R_{23}$ and $R_{24}$ is preferably a substituted or unsubstituted aryl group having 6 to 30 ring carbon atoms.

In the formula (11), $R_{21}$, $R_{23}$ and $R_{24}$ are more preferably a substituted or unsubstituted aryl group having 6 to 30 ring carbon atoms. In this case, $R_{22}$ is preferably a hydrogen atom.

In the formula (11), it is more preferable that $R_{21}$, $R_{23}$ and $R_{24}$ are each independently a substituted or unsubstituted alkyl group having 1 to 30 carbon atoms (preferably 1 to 6 carbon atoms), a substituted or unsubstituted alkyl halide group having 1 to 30 carbon atoms (preferably 1 to 6 carbon atoms), or an aryl group having 6 to 30 ring carbon atoms (preferably 6 to 12 ring carbon atoms) and substituted by an alkyl group having 1 to 30 carbon atoms, and $R_{22}$ is a hydrogen atom.

In the formula (1), it is particularly preferable that $R_{21}$, $R_{23}$, $R_{24}$, and $R_{26}$ are each independently an aryl group having 6 to 30 ring carbon atoms (preferably 6 to 12 ring carbon atoms) and substituted by an alkyl group having 1 to 30 carbon atoms; X is a carbon atom to be bonded to Y; Y is a substituted or unsubstituted aryl group having 6 to 30 ring carbon atoms; when Y is an aryl group having 6 to 30 ring carbon atoms and having a substituent, the substituent is a substituted or unsubstituted alkyl group having 1 to 30 carbon atoms, a substituted or unsubstituted alkyl halide group having 1 to 30 carbon atoms, a substituted or unsubstituted alkoxy group having 1 to 30 carbon atoms, a substituted or unsubstituted alkoxy halide group having 1 to 30 carbon atoms, or an aryl group having 6 to 30 ring carbon atoms and substituted with an alkyl group having 1 to 30 carbon atoms; $Z_{21}$ and $Z_{22}$ are halogen atoms; and $R_{22}$ and $R_{25}$ are hydrogen atoms.

In the formula (1), it is more particularly preferable that $R_{21}$, $R_{23}$, $R_{24}$, and $R_{26}$ are each independently an aryl group having 6 to 30 ring carbon atoms (preferably 6 to 12 ring carbon atoms) and substituted by an alkyl group having 1 to 30 carbon atoms; X is a carbon atom to be bonded to Y; Y is a substituted aryl group having 6 to 30 ring carbon atoms; a substituent of Y is a substituted or unsubstituted alkoxy group having 1 to 30 carbon atoms; $Z_{21}$ and $Z_{22}$ are halogen atoms; and $R_{22}$ and $R_{25}$ are hydrogen atoms.

In the first compound, examples of the fluorine-atom-substituted alkoxy group include: 2,2,2-trifluoroethoxy group, 2,2-difluoroethoxy group, 2,2,3,3,3-pentafluoro-1-propoxy group, 2,2,3,3-tetrafluoro-1-propoxy group, 1,1,1,3,3,3-hexafluoro-2-propoxy group, 2,2,3,3,4,4,4-heptafluoro-1-butyloxy group, 2,2,3,3,4,4-hexafluoro-1-butyloxy group, nonafluoro-tert-butyloxy group, 2,2,3,3,4,4,5,5,5-nonafluoropentanoxy group, 2,2,3,3,4,4,5,5,6,6,6-undecafluorohexanoxy group, 2,3-bis(trifluoromethyl)-2,3-butanedioxy group, 1,1,2,2-tetra(trifluoromethyl) ethyleneglykoxy group, 4,4,5,5,6,6,6-heptafluorohexane-1,2-dioxy group, and 4,4,5,5,6,6,7,7,8,8,9,9,9-tridecafluorononane-1,2-dioxy group.

In the first compound, examples of the fluorine-atom substituted aryloxy group, or the fluoroalkyl-group-substituted aryloxy group include pentafluorophenoxy group, 3,4,5-trifluorophenoxy group, 4-trifluoromethylphenoxy group, 3,5-bistrifluoromethylphenoxy group, 3-fluoro-4-trifluoromethylphenoxy group, 2,3,5,6-tetrafluoro-4-trifluoromethylphenoxy group, 4-fluorocatecholato group, 4-trifluoromethylcatecholato group, and 3,5-bis-trifluoromethylcatecholato group.

When the emitting layer is a red emitting layer, the first compound is also preferably a compound represented by a formula (101) below.

[Formula 7]

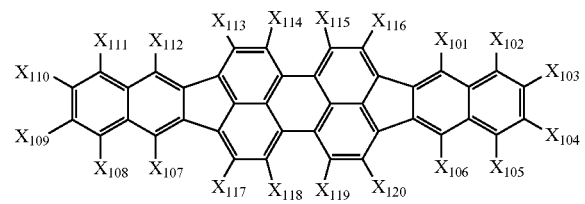

(101)

In the formula (101), $X_{101}$ to $X_{120}$ are each independently a hydrogen atom or a substituent. $X_{101}$ to $X_{120}$ being the substituent are each independently a halogen atom, a substituted or unsubstituted linear, branched or cyclic alkyl group, a substituted or unsubstituted linear, branched or cyclic alkoxy group, a substituted or unsubstituted linear, branched or cyclic alkylthio group, a substituted or unsubstituted linear, branched or cyclic alkenyl group, a substituted or unsubstituted linear, branched or cyclic alkenyloxy group, a substituted or unsubstituted linear, branched or cyclic alkenylthio group, a substituted or unsubstituted aralkyl group, a substituted or unsubstituted aralkyloxy group, a substituted or unsubstituted aralkylthio group, a substituted or unsubstituted aryl group, a substituted or unsubstituted heteroaryl group, a substituted or unsubstituted aryloxy group, a substituted or unsubstituted arylthio group, a substituted or unsubstituted amino group, a cyano group, a hydroxyl group, —$COOR_1$, —$COR_2$, or —$OCOR_3$.

Further, adjacent groups selected from $X_{101}$ to $X_{120}$ or selected ones of groups of $X_{101}$ and $X_{106}$ or groups of $X_{107}$ and $X_{112}$ are mutually bonded to form a substituted or unsubstituted carbocyclic aliphatic ring together with a substituted carbon atom, or groups selected from $X_{101}$ to $X_{120}$ are not mutually bonded.

Furthermore, when adjacent groups selected from $X_{101}$ to $X_{120}$ or selected ones of groups of $X_{101}$ and $X_{106}$ or groups of $X_{107}$ and $X_{112}$ are mutually bonded to form a substituted or unsubstituted carbocyclic aliphatic ring together with a substituted carbon atom, a substituted or unsubstituted carbocyclic aliphatic ring having 4 to 20 ring carbon atoms is preferably formed.

More preferably, $X_{101}$ to $X_{120}$ are a hydrogen atom, a halogen atom, a substituted or unsubstituted linear, branched or cyclic alkyl group having 1 to 24 carbon atoms, a substituted or unsubstituted linear, branched or cyclic alkoxy group having 1 to 24 carbon atoms, a substituted or unsubstituted linear, branched or cyclic alkylthio group having 1 to 24 carbon atoms, a substituted or unsubstituted linear, branched or cyclic alkenyl group having 2 to 24 carbon atoms, a substituted or unsubstituted linear, branched or cyclic alkenyloxy group having 2 to 24 carbon atoms, a substituted or unsubstituted linear, branched or cyclic alkenylthio group having 2 to 24 carbon atoms, a substituted or unsubstituted aralkyl group having 6 to 24 carbon atoms, a substituted or unsubstituted aralkyloxy group having 7 to 24 carbon atoms, a substituted or unsubstituted aralkylthio group having 7 to 24 carbon atoms, a substituted or unsubstituted aryl group having 6 to 24 ring carbon atoms, a substituted or unsubstituted aryloxy group having 6 to 24 ring carbon atoms, a substituted or unsubstituted arylthio group having 6 to 24 ring carbon atoms, a substituted or unsubstituted heteroaryl group having 5 to 30 ring atoms, an unsubstituted amino group, a substituted amino group having 1 to 24 carbon atoms, a cyano group, a hydroxyl group, —$COOR_1$, —$COR_2$, or —$OCOR_3$.

The first compound represented by the formula (101) is more preferably a compound represented by a formula (102) below.

[Formula 8]

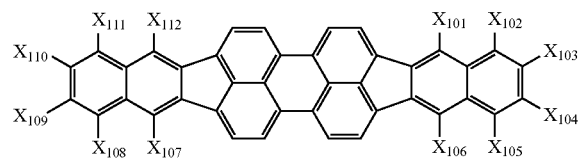

(102)

In the formula (102), $X_{101}$ to $X_{112}$ are a hydrogen atom, a halogen atom, a substituted or unsubstituted linear, branched or cyclic alkyl group having 1 to 24 carbon atoms, a substituted or unsubstituted linear, branched or cyclic alkoxy group having 1 to 24 carbon atoms, a substituted or unsubstituted linear, branched or cyclic alkenyl group having 2 to 24 carbon atoms, a substituted or unsubstituted aralkyl group having 7 to 24 carbon atoms, a substituted or unsubstituted aryl group having 6 to 24 ring carbon atoms, a substituted or unsubstituted heteroaryl group having 5 to 30 ring atoms, a cyano group, a hydroxyl group, —$COOR_1$, —$COR_2$, or —$OCOR_3$.

In —$COOR_1$, $R_1$ is a hydrogen atom or a substituent. $R_1$ being the substituent is a substituted or unsubstituted linear, branched or cyclic alkyl group, a substituted or unsubstituted linear, branched or cyclic alkenyl group, a substituted or unsubstituted aralkyl group, a substituted or unsubstituted aryl group, or a substituted or unsubstituted heteroaryl group.

In —$COR_2$, $R_2$ is a hydrogen atom or a substituent. $R_2$ being the substituent is a substituted or unsubstituted linear, branched or cyclic alkyl group, a substituted or unsubstituted linear, branched or cyclic alkenyl group, a substituted or unsubstituted aralkyl group, a substituted or unsubstituted aryl group, a substituted or unsubstituted heteroaryl group, or an amino group.

In —$OCOR_3$, $R_3$ is a substituted or unsubstituted linear, branched or cyclic alkyl group, a substituted or unsubstituted linear, branched or cyclic alkenyl group, a substituted or unsubstituted aralkyl group, a substituted or unsubstituted aryl group, or a substituted or unsubstituted heteroaryl group.

More preferably, $R_1$ is a hydrogen atom, a substituted or unsubstituted linear, branched or cyclic alkyl group having 1 to 24 carbon atoms, a substituted or unsubstituted linear, branched or cyclic alkenyl group having 2 to 24 carbon atoms, a substituted or unsubstituted aralkyl group having 7 to 24 carbon atoms, a substituted or unsubstituted aryl group having 6 to 24 ring carbon atoms, or a substituted or unsubstituted heteroaryl group having 5 to 30 ring atoms.

Further preferably, $R_1$ is a hydrogen atom, a substituted or unsubstituted linear, branched or cyclic alkyl group having 1 to 24 carbon atoms, a substituted or unsubstituted aralkyl group having 7 to 24 carbon atoms, a substituted or unsubstituted aryl group having 6 to 24 ring carbon atoms, or a substituted or unsubstituted heteroaryl group having 5 to 30 ring atoms.

More preferably, $R_2$ is a hydrogen atom, a substituted or unsubstituted linear, branched or cyclic alkyl group having 1 to 24 carbon atoms, a substituted or unsubstituted linear, branched or cyclic alkenyl group having 2 to 24 carbon atoms, a substituted or unsubstituted aralkyl group having 7 to 24 carbon atoms, a substituted or unsubstituted aryl group having 6 to 24 ring carbon atoms, a substituted or unsubstituted heteroaryl group having 5 to 30 ring atoms, or an amino group.

Further preferably, $R_2$ is a hydrogen atom, a substituted or unsubstituted linear, branched or cyclic alkyl group having 1 to 24 carbon atoms, a substituted or unsubstituted aralkyl group having 7 to 24 carbon atoms, a substituted or unsubstituted aryl group having 6 to 24 ring carbon atoms, a substituted or unsubstituted heteroaryl group having 5 to 30 ring atoms, or an amino group.

More preferably, $R_3$ is a substituted or unsubstituted linear, branched or cyclic alkyl group having 1 to 24 carbon atoms, a substituted or unsubstituted linear, branched or cyclic alkenyl group having 2 to 24 carbon atoms, a substituted or unsubstituted aralkyl group having 7 to 24 carbon atoms, a substituted or unsubstituted aryl group having 6 to 24 ring carbon atoms, or a substituted or unsubstituted heteroaryl group having 5 to 30 ring atoms.

Further preferably, $R_3$ is a substituted or unsubstituted linear, branched or cyclic alkyl group having 1 to 24 carbon atoms, a substituted or unsubstituted aralkyl group having 7 to 24 carbon atoms, a substituted or unsubstituted aryl group having 6 to 24 ring carbon atoms, or a substituted or unsubstituted heteroaryl group having 5 to 30 ring atoms.

The substituent meant by "substituted or unsubstituted" in the first compound is preferably a substituent selected from the group consisting of an aryl group having 6 to 30 ring carbon atoms, heteroaryl group having 5 to 30 ring atoms, alkyl group having 1 to 30 carbon atoms, alkyl halide group having 1 to 30 carbon atoms, cycloalkyl group having 3 to 30 ring carbon atoms, cyano group, amino group, substituted amino group, halogen atom, alkoxy group having 1 to 30 carbon atoms, aryloxy group having 6 to 30 ring carbon atoms, arylthio group having 6 to 30 carbon atoms, aralkyl group having 7 to 30 carbon atoms, substituted phosphoryl group, substituted silyl group, nitro group, carboxy group, alkenyl group having 2 to 30 carbon atoms, alkynyl group having 2 to 30 carbon atoms, alkylthio group having 1 to 30 carbon atoms, alkylsilyl group having 3 to 30 carbon atoms, arylsilyl group having 6 to 30 ring carbon atoms, and hydroxy group.

The substituent meant by "substituted or unsubstituted" for the first compound is more preferably a substituent selected from the group consisting of a substituted or unsubstituted aryl group having 6 to 30 ring carbon atoms, substituted or unsubstituted heteroaryl group having 5 to 30 ring atoms, alkyl group having 1 to 30 carbon atoms, alkyl halide group having 1 to 30 carbon atoms, and cycloalkyl group having 3 to 30 ring carbon atoms.

The substituent meant by "substituted or unsubstituted" for the first compound is further preferably a substituent selected from the group consisting of a substituted or unsubstituted aryl group having 6 to 12 ring carbon atoms, substituted or unsubstituted heteroaryl group having 5 to 12 ring atoms, alkyl group having 1 to 6 carbon atoms, alkyl halide group having 1 to 6 carbon atoms, and cycloalkyl group having 3 to 12 ring carbon atoms.

Herein, the red light emission refers to light emission whose main peak wavelength of fluorescence spectrum is in a range from 600 nm to 660 nm.

When the emitting layer is a red emitting layer, the first compound is preferably a red fluorescent compound.

The main peak wavelength of the first compound is preferably in a range from 600 nm to 660 nm, more preferably in a range from 600 nm to 640 nm, further preferably in a range from 610 nm to 630 nm.

Herein, the main peak wavelength means a peak wavelength of a fluorescence spectrum exhibiting a maximum luminous intensity among fluorescence spectra measured in a toluene solution in which a measurement target compound is dissolved at a concentration ranging from $10^{-6}$ mol/l to $10^{-5}$ mol/l. A spectrophotofluorometer (F-7000 manufactured by Hitachi High-Tech Science Corporation) is used as a measurement device.

Method of Preparing First Compound

The first compound can be prepared by any known method.

Specific examples of the first compound of the present exemplary embodiment are shown below. It should be noted that the first compound according to the invention is not limited to these specific examples.

It should also be noted that coordinate bond between a boron atom and a nitrogen atom in a pyrromethene skeleton can be illustrated in a variety of manners (e.g., in a solid line, in a dotted line, in an arrow, or omitted). The coordinate bond is illustrated in a solid line or dotted line or omitted herein.

[Formula 9]

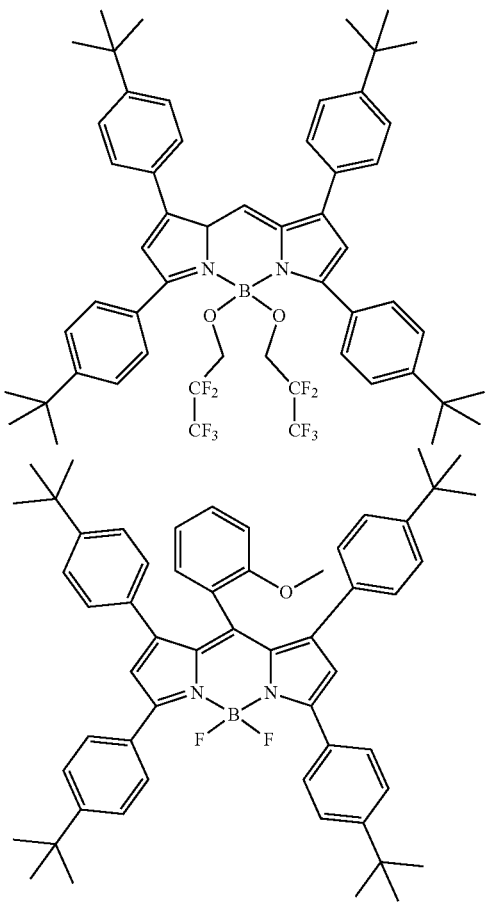

-continued

[Formula 10]

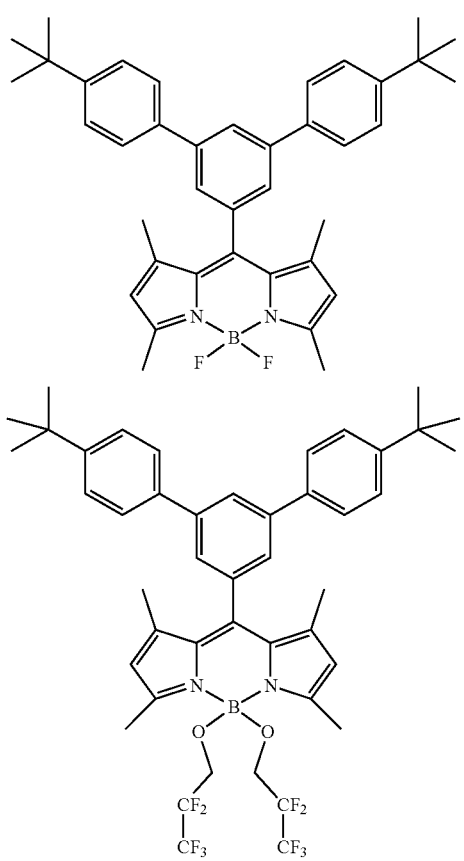

[Formula 11]

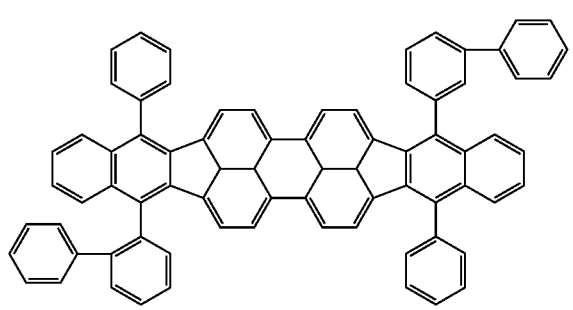

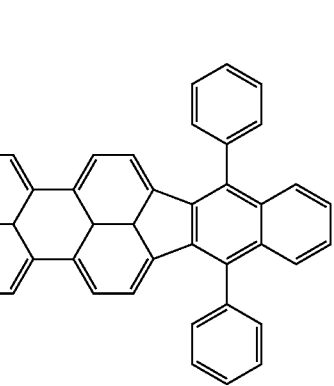

-continued

[Formula 12]

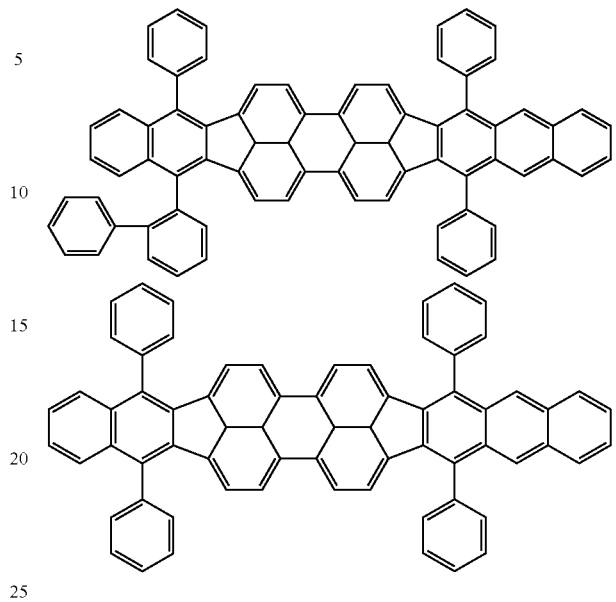

Second Compound

The second compound is a delayed fluorescent compound.

The second compound according to the present exemplary embodiment is not a phosphorescent metal complex. The second compound according to the present exemplary embodiment is preferably not a metal complex.

The second compound is preferably a compound represented by a formula (3) below.

Thermally Activated Delayed Fluorescent Compound

The red emitting layer contains a delayed fluorescent compound as well as a red dopant. Any delayed fluorescent compound usable together with the red dopant is usually usable for the delayed fluorescent compound.

The delayed fluorescent compound contained in the red emitting layer is not a phosphorescent metal complex. The delayed fluorescent compound according to the present exemplary embodiment is preferably not a metal complex.

The delayed fluorescent compound is preferably a compound represented by the formula (3) below.

[Formula 13]

(3)

In the formula (3), m is an integer of 1 or more.

n is an integer of 2 or more.

A is a substituted or unsubstituted aromatic ring.

The aromatic ring A is directly bonded to a cyano group whose number is n in the formula (3).

Cz in the formula (3) is a group represented by a formula (3B-1) or (3B-2) below.

When m is an integer of 2 or more, a plurality of Cz are mutually the same or different.

[Formula 14]

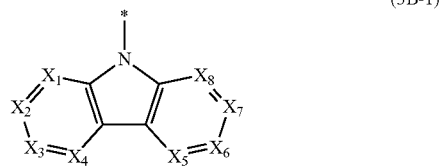

(3B-1)

In the formula (3B-1), $X_1$ to $X_8$ are each independently a nitrogen atom or $CR_A$; $R_A$ is a hydrogen atom or a substituent, or at least one of combinations of adjacent ones of $R_A$ are mutually bonded to form a ring; $R_A$ being as the substituent are each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a substituted or unsubstituted amino group, a cyano group, hydroxy group, a nitro group, and a carboxy group.

A plurality of $R_A$ are mutually the same or different.

A nitrogen atom in the formula (3B-1) is bonded to the aromatic ring A in the formula (3).

[Formula 15]

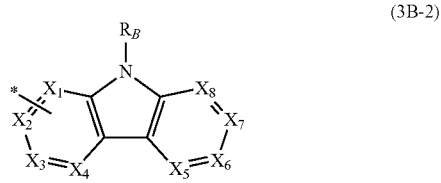

(3B-2)

In the formula (3B-2), $X_1$ to $X_4$ are each a carbon atom bonded to the aromatic ring A in the formula (3), a nitrogen atom, or $CR_C$, $R_C$ being a hydrogen atom or a substituent, at least one pair of adjacent ones of $R_C$ being mutually bonded to form a ring, at least one of $X_1$ to $X_4$ being a carbon atom bonded to the aromatic ring A in the formula (3).

$X_5$ to $X_8$ are each a nitrogen atom or $CR_D$, $R_D$ being a hydrogen atom or a substituent, at least one pair of adjacent ones of $R_D$ being mutually bonded to form a ring.

$R_B$, $R_C$ and $R_D$ each independently represent the same as $R_A$ in the formula (3B-1). A plurality of $R_C$ are mutually the same or different. A plurality of $R_D$ are mutually the same or different.

A substituent E meant by "a substituted or unsubstituted" in the compound represented by the formula (3) is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted silyl group, a substituted or unsubstituted alkoxy group having 1 to 30 carbon atoms, a substituted or unsubstituted alkoxy halide group having 1 to 30 carbon atoms, a substituted or unsubstituted aryloxy group having 6 to 30 carbon atoms, a substituted or unsubstituted alkylthio group having 1 to 30 carbon atoms, a substituted or unsubstituted arylthio group having 6 to 30 ring carbon atoms, a substituted or unsubstituted aralkyl group having 7 to 30 carbon atoms, a substituted or unsubstituted alkenyl group having 2 to 30 carbon atoms, a halogen atom, a substituted or unsubstituted alkynyl group having 2 to 30 carbon atoms, a substituted or unsubstituted amino group, a cyano group, hydroxy group, a nitro group, and a carboxy group.

When the substituent E further has a substituent F, the substituent F is selected from the group consisting of an unsubstituted aryl group having 6 to 30 ring carbon atoms, a substituted or unsubstituted heteroaryl group having 5 to 30 ring atoms, an unsubstituted alkyl group having 1 to 30 carbon atoms, an unsubstituted alkyl halide group having 1 to 30 carbon atoms, an unsubstituted cycloalkyl group having 3 to 30 ring carbon atoms, an unsubstituted silyl group, an unsubstituted alkoxy group having 1 to 30 carbon atoms, an unsubstituted alkoxy halide group having 1 to 30 carbon atoms, an unsubstituted aryloxy group having 6 to 30 carbon atoms, an unsubstituted alkylthio group having 1 to 30 carbon atoms, an unsubstituted arylthio group having 6 to 30 ring carbon atoms, an unsubstituted aralkyl group having 7 to 30 carbon atoms, an unsubstituted alkenyl group having 2 to 30 carbon atoms, a halogen atom, an unsubstituted alkynyl group having 2 to 30 carbon atoms, a substituted or unsubstituted amino group, a cyano group, hydroxy group, a nitro group, and a carboxy group.

It should be noted that the substituent F is not further substituted.

In the formula (3B-1), when $R_A$ is a substituted or unsubstituted heteroaryl group having 5 to 30 ring atoms, the heteroaryl group is each independently preferably a carbazolyl group or an azacarbazolyl group.

In the formula (3B-2), when $R_B$, $R_C$ and $R_D$ are each independently a substituted or unsubstituted heteroaryl group having 5 to 30 ring atoms, the heteroaryl groups are each independently preferably a carbazolyl group or an azacarbazolyl group. A plurality of $R_C$ are mutually the same or different. A plurality of $R_D$ are mutually the same or different.

In the formula (3B-1), $R_A$ is preferably not a substituted or unsubstituted amino group.

In the formula (3B-2), $R_B$, $R_C$ and $R_D$ are each independently preferably not a substituted or unsubstituted amino group.

The substituent E is preferably not a substituted or unsubstituted heteroaryl group having 5 to 30 ring atoms.

The substituent E is preferably not a substituted or unsubstituted amino group.

m is preferably an integer from 2 to 10, more preferably an integer from 2 to 6, further preferably an integer from 2 to 5, further more preferably an integer of 2 or 3.

n is preferably an integer from 2 to 10, more preferably an integer from 2 to 4, further preferably an integer of 2 or 3.

$X_1$ to $X_8$ in the formula (3B-1) are each independently preferably $CR_A$.

$X_1$ to $X_4$ in the formula (3B-2) are each independently a carbon atom bonded to the aromatic ring A, or $CR_C$. It is preferable that one of $X_1$ to $X_4$ is a carbon atom bonded to the aromatic ring A and $X_5$ to $X_8$ are each independently $CR_D$.

In the formula (3B-1), it is preferable that paired adjacent ones of $R_A$ are not mutually bonded.

In the formula (3B-2), it is preferable that paired adjacent ones of $R_C$ are not mutually bonded and paired adjacent ones of $R_D$ are not mutually bonded.

$R_A$ in the formula (3B-1) and $R_B$, $R_C$ and $R_D$ in the formula (3B-2) are preferably each independently a hydrogen atom, a substituted or unsubstituted aryl group having 6 to 30 ring carbon atoms, a substituted or unsubstituted alkyl group having 1 to 30 carbon atoms, a substituted or unsubstituted alkyl halide group having 1 to 30 carbon atoms, carbazolyl group, substituted carbazolyl group, halogen atom, or a cyano group.

$R_A$ in the formula (3B-1) and $R_B$, $R_C$ and $R_D$ in the formula (3B-2) are preferably each independently a hydrogen atom, a substituted or unsubstituted aryl group having 6 to 30 ring carbon atoms, a substituted or unsubstituted alkyl group having 1 to 30 carbon atoms, or a substituted or unsubstituted alkyl halide group having 1 to 30 carbon atoms.

$R_A$ in the formula (3B-1) and $R_C$ and $R_D$ in the formula (3B-2) are preferably hydrogen atoms.

Cz in the formula (3) is preferably the group represented by the formula (3B-1).

The aromatic ring A represents: a hydrocarbon aromatic ring including a carbon atom and a hydrogen atom; and a hetero aromatic ring including a hetero atom other than a carbon atom and a hydrogen atom.

The aromatic ring A may further have a substituent.

The aromatic ring A may be a fused ring formed by fusing a plurality of aromatic rings.

The hydrocarbon aromatic ring is preferably a hydrocarbon aromatic ring having 6 to 30 ring carbon atoms, more preferably a hydrocarbon aromatic ring having 6 to 14 ring carbon atoms, further preferably a hydrocarbon aromatic ring having 6 ring carbon atoms.

Examples of the hydrocarbon aromatic ring include benzene, naphthalene, anthracene, phenanthrene, tetracene (naphthacene), pentacene, pyrene, and coronene.

The hetero aromatic ring preferably has 3 to 30 ring atoms, more preferably 4 to 16 ring atoms, further preferably 5 to 12 ring atoms.

Examples of a hetero aromatic ring containing a nitrogen atom only as a hetero atom include pyridine, pyrazine, pyrimidine, pyrrole, pyrazole, and imidazole.

Examples of a hetero aromatic fused ring containing a nitrogen atom only as a hetero atom include benzimidazole, indole, and carbazole.

Examples of a hetero aromatic ring containing an oxygen atom as a hetero atom include furan, oxazole, and isooxazole.

Examples of a hetero aromatic ring containing a sulfur atom as a hetero atom include thiophene, thiazole, and isothiazole.

Examples of a hetero aromatic fused ring containing an oxygen atom as a hetero atom include benzofuran and dibenzofuran.

Examples of a hetero aromatic fused ring containing a sulfur atom as a hetero atom include benzothiophene and dibenzothiophene.

The aromatic ring A in the formula (3) preferably represents an aromatic ring selected from the group consisting of a substituted or unsubstituted benzene, a substituted or unsubstituted biphenyl, a substituted or unsubstituted terphenyl, a substituted or unsubstituted naphthalene, a substituted or unsubstituted anthracene, a substituted or unsubstituted benzanthracene, a substituted or unsubstituted phenanthrene, a substituted or unsubstituted benzophenanthrene, a substituted or unsubstituted tetracene (naphthacene), a substituted or unsubstituted phenalene, a substituted or unsubstituted picene, a substituted or unsubstituted pentacene, a substituted or unsubstituted pyrene, a substituted or unsubstituted chrysene, a substituted or unsubstituted chrysene, a substituted or unsubstituted fluoranthene, a substituted or unsubstituted triphenylene, a substituted or unsubstituted coronene, a substituted or unsubstituted pyridine, a substituted or unsubstituted pyrazine, a substituted or unsubstituted pyrimidine, a substituted or unsubstituted pyrrole, a substituted or unsubstituted pyrazole, a substituted or unsubstituted imidazole, a substituted or unsubstituted benzimidazole, a substituted or unsubstituted indole, a substituted or unsubstituted furan, a substituted or unsubstituted oxazole, a substituted or unsubstituted isoxazole, a substituted or unsubstituted thiophene, a substituted or unsubstituted thiazole, a substituted or unsubstituted isothiazole, a substituted or unsubstituted benzofuran, a substituted or unsubstituted dibenzofuran, a substituted or unsubstituted benzothiophene, and a substituted or unsubstituted dibenzothiophene.

The aromatic ring A in the formula (3) is preferably each independently a polyvalent residue derived from any one of benzene, biphenyl, terphenyl, naphthalene, anthracene, benzoanthracene, phenanthrene, benzophenanthrene, phenalene, picene, pentacene, pyrene, chrysene, benzochrysene, fluoranthene and triphenylene.

The aromatic ring A in the formula (3) is preferably each independently a polyvalent residue derived from any one of benzene, biphenyl, terphenyl, naphthalene, phenanthrene, fluoranthene and triphenylene.

The aromatic ring A is also preferably an aromatic ring containing at least one selected from the group consisting of benzene, azines, pyrrole, furan, and thiophene.

The aromatic ring A is preferably an aromatic ring including at least one selected from the group consisting of benzene, pyridine, pyrazine, naphthalene, anthracene, indole, carbazole, dibenzofuran, and dibenzothiophene.

The aromatic ring A is also preferably an aromatic ring including at least one selected from the group consisting of benzene and pyridine.

The aromatic ring A is more preferably benzene.

When the aromatic ring A has a substituent other than a cyano group, the substituent is preferably at least one substituent selected from the group consisting of an alkyl group, aryl group, heteroaryl group, silyl group and a halogen atom.

Cz in the formula (3) is preferably any one group selected from the group consisting of groups represented by formulae (3B11) to (3B22) below.

[Formula 16]

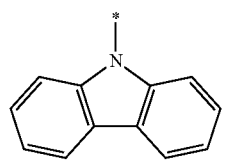

(3B11)

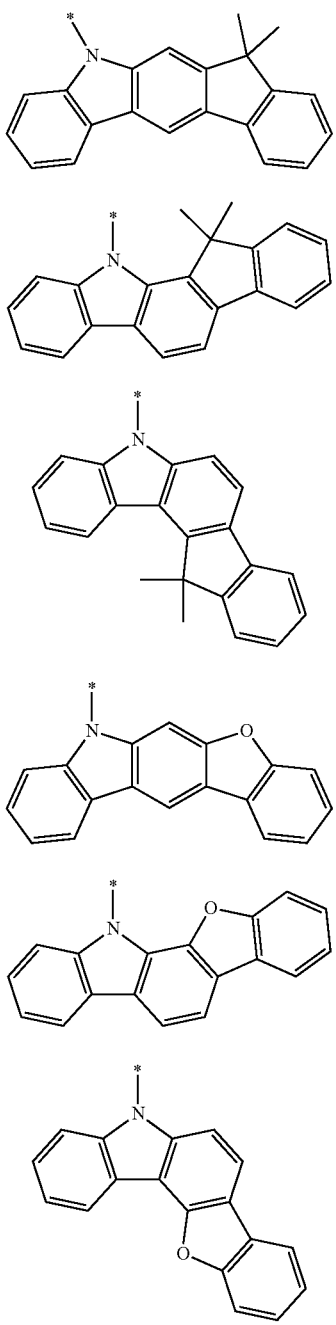

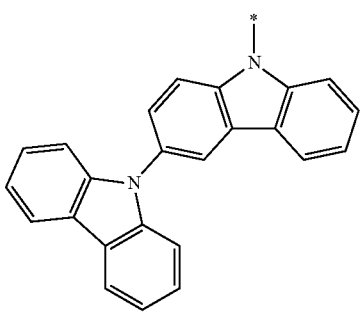

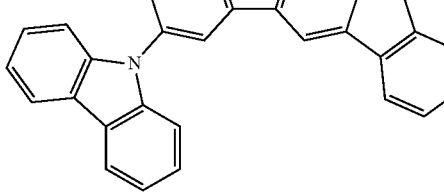

In the groups represented by the formulae (3B11) to (3B22), the carbon atom capable of being substituted by a substituent is substituted by a substituent X, which is the same as $R_A$ as the substituent, or unsubstituted, the substituent X optionally comprising a plurality of substituents X that are mutually the same or different.

Cz in the formula (3) is preferably any one group selected from the group consisting of groups represented by the formulae (3B11) to (3B17).

In the formula (3), a substituent E meant by "substituted or unsubstituted" is preferably a substitutent selected from the group consisting of an unsubstituted aryl group having 6 to 30 ring carbon atoms, an unsubstituted alkyl group having 1 to 30 carbon atoms, an unsubstituted cycloalkyl group having 3 to 30 ring carbon atoms, a cyano group, and a halogen atom.

In the formula (3), a substituent E meant by "substituted or unsubstituted" is preferably a substitutent selected from the group consisting of an unsubstituted aryl group having 6 to 30 ring carbon atoms, and an unsubstituted alkyl group having 1 to 30 carbon atoms.

In the formula (3), a substituent E meant by "substituted or unsubstituted" is preferably a substitutent selected from the group consisting of an unsubstituted aryl group having 6 to 18 ring carbon atoms, and an unsubstituted alkyl group having 1 to 6 carbon atoms.

Specific examples of the second compound are shown below. It should be noted that the second compound according to the invention is not limited to these specific examples.

[Formula 18]

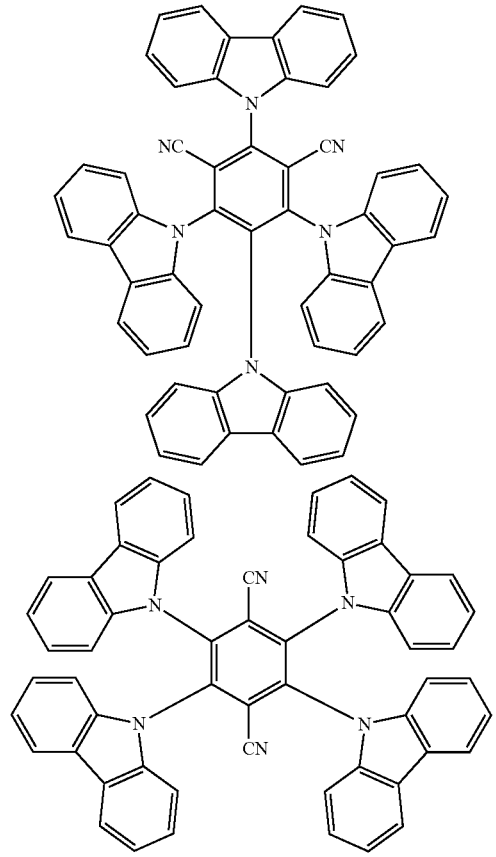

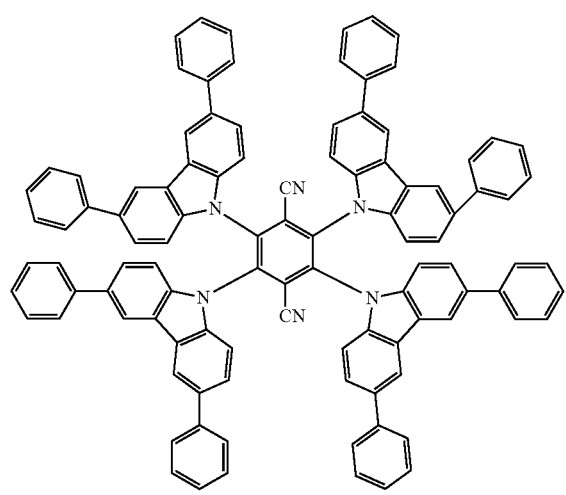

[Formula 19]

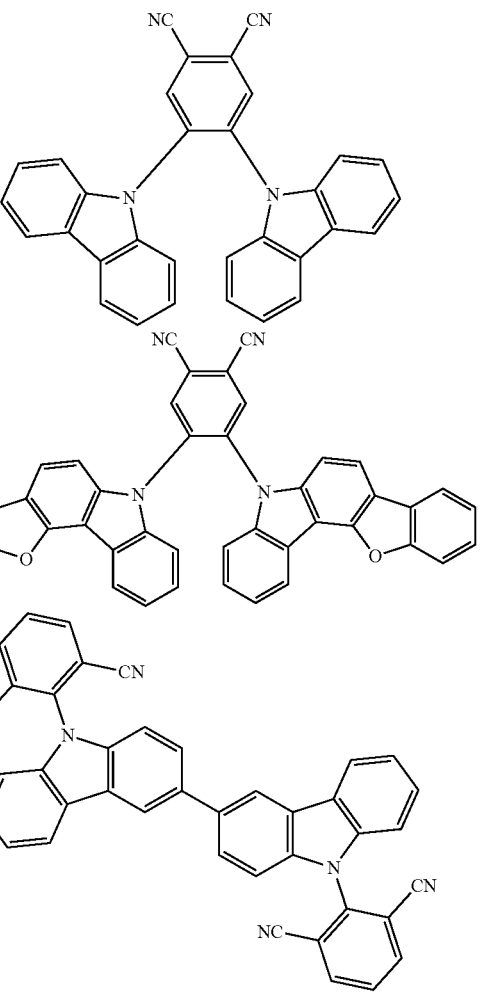

Method of Preparing Second Compound

The second compound can be prepared by methods disclosed in, for instance, International Publication Nos. WO2013/180241, WO2014/092083, WO2014/104346 and the like.

Delayed Fluorescence

Delayed fluorescence (thermally activated delayed fluorescence) is described in "Yuki Hando-tai no Debaisu Bussei (Device Physics of Organic Semiconductor)" edited by Chihaya Adachi, published by Kodansha Company Ltd, pages 261 to 268. This document describes that, when an energy gap $\Delta E_{13}$ between a singlet state and a triplet state of a fluorescent material can be decreased, in spite of a typical low transition probability, inverse energy transfer from the triplet state to the singlet state occurs at a high efficiency to express TADF (Thermally Activated Delayed Fluorescence). Further, FIG. 10.38 in this literature illustrates an occurrence mechanism of the delayed fluorescence. The second compound in the present exemplary embodiment is a compound emitting thermally activated delayed fluorescence to be generated by such a mechanism.

Occurrence of delayed fluorescence emission can be determined by transient PL (Photo Luminescence) measurement.

The behavior of delayed fluorescence can be analyzed based on the decay curve obtained by the transient PL measurement. The transient PL measurement is a process where a sample is irradiated with a pulse laser to be excited, and a decay behavior (transient characteristics) of PL emission after the irradiation is stopped is measured. PL emission using a TADF material is divided into an emission component from singlet excitons generated by the first PL excitation and an emission component from singlet excitons generated via triplet excitons. The lifetime of the singlet excitons generated by the initial PL excitation is in a nano-second order and considerably short. Emission from these singlet excitons thus decays immediately after the irradiation with the pulse laser.

In contrast, since delayed fluorescence provides emission from singlet excitons generated through long-life triplet excitons, emission is gradually reduced. There is thus a large difference in time between emission from the singlet excitons generated by the initial PL excitation and emission from the singlet excitons generated via triplet excitons. Therefore, a luminous intensity resulting from the delayed fluorescence can be obtained.

Figure 2:
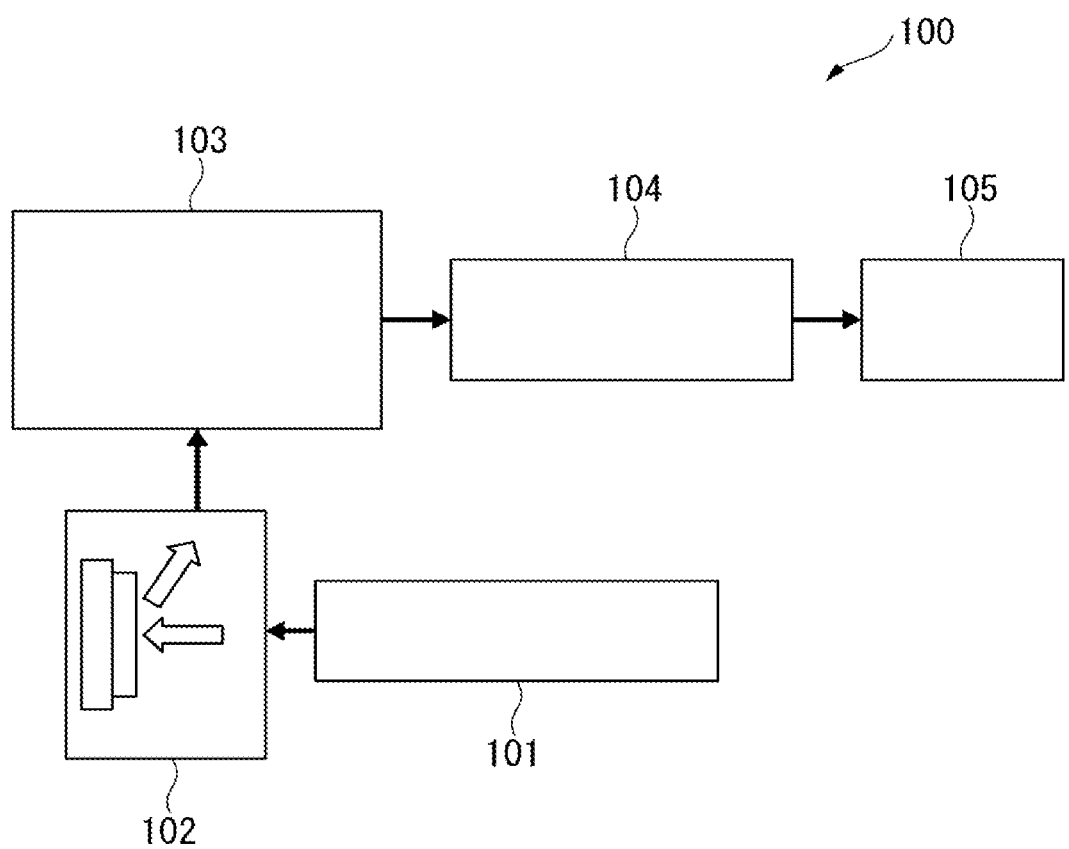
FIG. 2 schematically shows a device for measuring transient PL.

FIG. 2 schematically shows an exemplary device for measuring transient PL.

A transient PL measuring apparatus 100 of the first exemplary embodiment includes: a pulse laser 101 capable of emitting light with a predetermined wavelength; a sample chamber 102 configured to house a measurement sample; a spectrometer 103 configured to disperse light emitted from the measurement sample; a streak camera 104 configured to form a two-dimensional image; and a personal computer 105 configured to analyze the two-dimensional image imported thereinto. It should be noted that transient PL may be measured by a device different from one described in the first exemplary embodiment.

The sample to be housed in the sample chamber 102 is prepared by forming a thin film, which is made of a matrix material doped with a doping material at a concentration of 12 mass %, on a quartz substrate.

The thus-obtained thin film sample is housed in the sample chamber 102, and is irradiated with a pulse laser emitted from the pulse laser 101 to excite the doping material. The emitted excitation light is taken in a 90-degree direction with respect to the irradiation direction of the excitation light, and is dispersed by the spectrometer 103. A two-dimensional image of the light is formed through the streak camera 104. In the thus-obtained two-dimensional image, an ordinate axis corresponds to time, an abscissa axis corresponds to wavelength, and a bright spot corresponds to luminous intensity. The two-dimensional image is taken at a predetermined time axis, thereby obtaining an emission spectrum with an ordinate axis representing luminous intensity and an abscissa axis representing wavelength. Further, the two-dimensional image is taken at a wavelength axis, thereby obtaining a decay curve (transient PL) with an ordinate axis representing the logarithm of luminous intensity and an abscissa axis representing time.

For instance, a thin film sample A was prepared as described above from a reference compound H1 as the matrix material and a reference compound D1 as the doping material and was measured in terms of the transient PL.

[Formula 20]

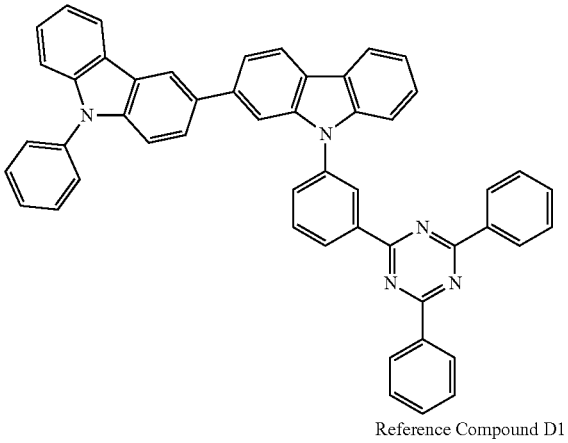

Reference Compound H1

Reference Compound D1

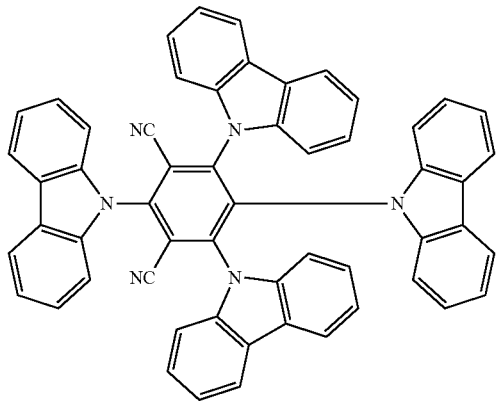

Herein, the decay curve was analyzed using the above-described thin film sample A and a thin film sample B. The thin film sample B was manufactured in the same manner as described above from a reference compound H2 as the matrix material and the reference compound D1 as the doping material.

Figure 3:
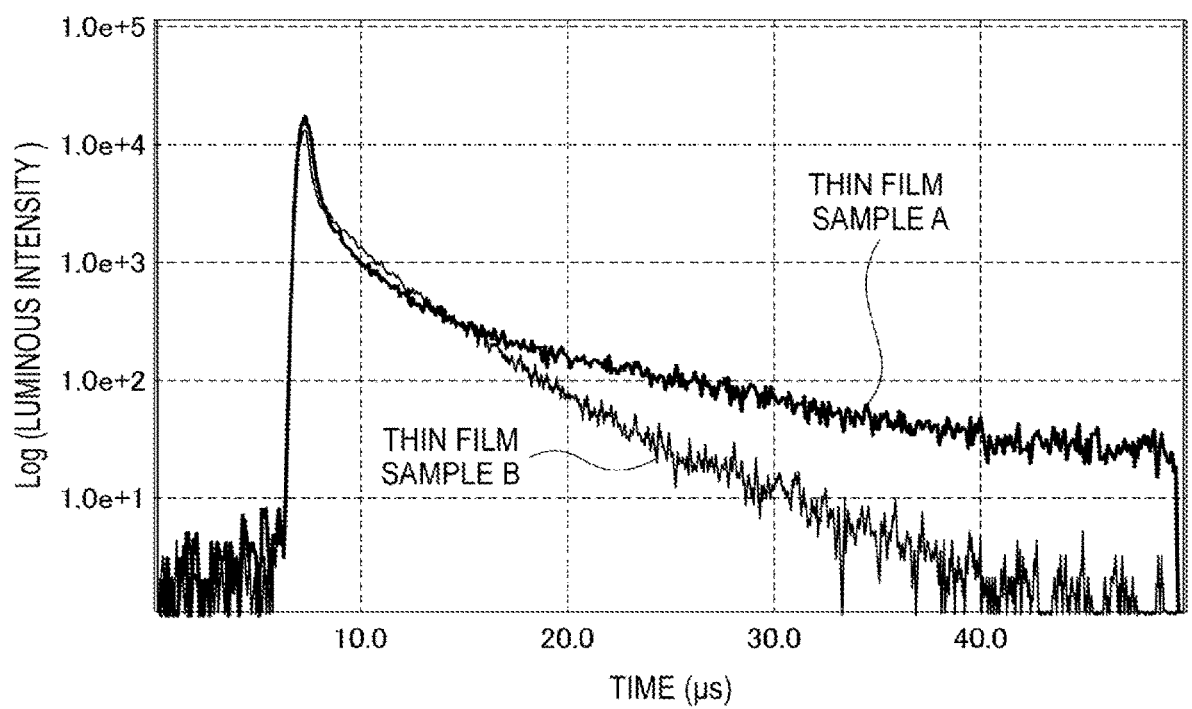
FIG. 3 shows examples of a transient PL decay curve.

FIG. 3 shows a decay curve obtained from the measured transitional PL of the thin film sample A and the thin film sample B.

[Formula 21]

Reference Compound H2

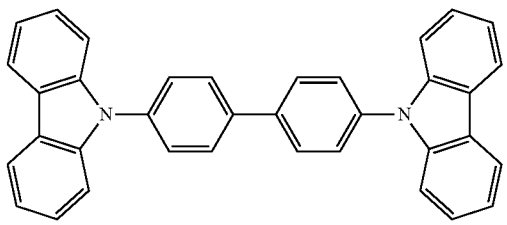

As described above, an emission decay curve with an ordinate axis representing luminous intensity and an abscissa axis representing time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

In the exemplary embodiment, an amount of the delayed fluorescence can be calculated using the device of FIG. 2. In the first compound after excited with pulse light (light emitted from the pulse laser) having a wavelength to be absorbed in the second compound, Prompt Emission that is immediately observed in the excited state and Delay Emission that is not observed immediately after the excitation but is later observed are present. In the exemplary embodiment, the amount of Delayed emission is preferably 5% or more relative to the amount of Prompt emission.

The amount of Prompt emission and the amount of Delayed emission can be obtained in the same method as a method described in "Nature 492, 234-238, 2012". The amount of Prompt emission and the amount of Delay emission may be calculated using a device different from one described in the above Reference Literature.

Moreover, a sample usable for measuring delayed fluorescence is obtained, for instance, by co-depositing the first compound and a compound TH-2 on a quartz substrate at a ratio of the first compound of 12 mass % to form a 100-nm-thick thin film.

[Formula 22]

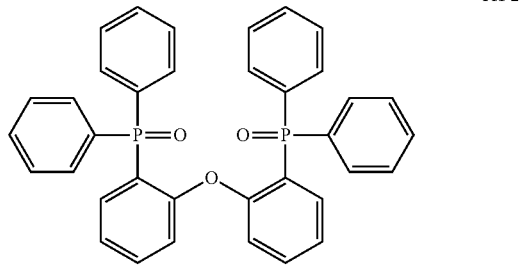

TH-2

TADF Mechanism

In the organic EL device of the present exemplary embodiment, the second compound is preferably a compound having a small $\Delta ST(M2)$ so that inverse intersystem crossing from the triplet energy level of the second compound to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as a TADF mechanism.

Figure 4:
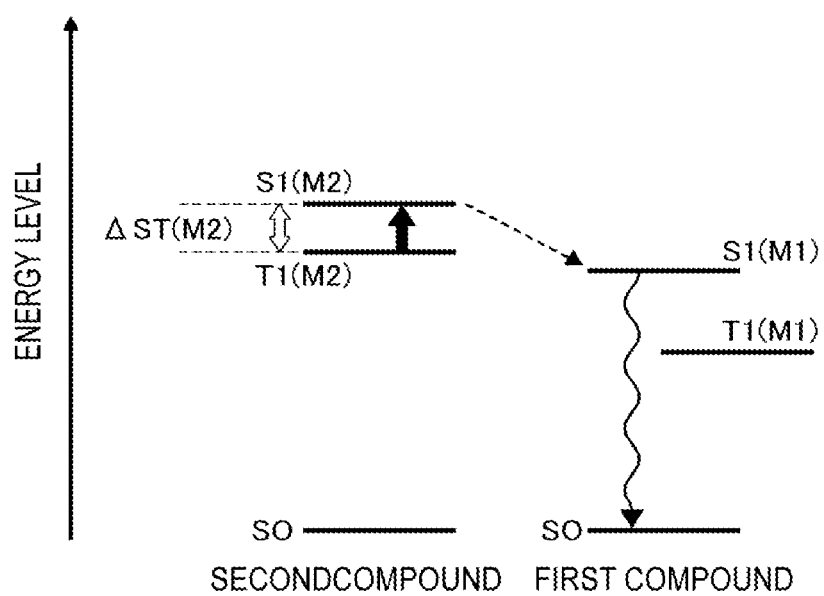
FIG. 4 illustrates a relationship between energy levels and energy transfer of a second compound and a first compound in a red emitting layer.

FIG. 4 shows an example of a relationship among energy levels of the first compound and the second compound in the red emitting layer. In FIG. 4, S0 represents a ground state, S1(M1) represents a lowest singlet state of the first compound, T1(M1) represents a lowest triplet state of the first compound, S1(M2) represents a lowest singlet state of the second compound, and T1(M2) represents a lowest triplet state of the second compound. A dashed arrow directed from S1(M2) to S1(M1) in FIG. 4 represents Förster energy transfer from the lowest singlet state of the second compound to the lowest singlet state of the first compound. In the exemplary embodiment, a difference between the lowest singlet state S1 and the lowest triplet state T1 is defined as $\Delta ST$.

As shown in FIG. 4, when a compound having a small $\Delta ST(M2)$ is used as the second compound, inverse intersystem crossing from the lowest triplet state T1(M2) to the lowest singlet state S1(M2) can be caused by a heat energy. Förster energy transfer from the lowest singlet state S1(M2) of the second compound to the lowest singlet state S1(M1) of the first compound is caused. As a result, fluorescence from the lowest singlet state S1(M1) of the first compound can be observed. It is considered that the internal quantum efficiency can be theoretically raised up to 100% also by using delayed fluorescence by the TADF mechanism.

Relationship Between First Compound and Second Compound in Red Emitting Layer

In the organic EL device of the exemplary embodiment, the lowest singlet energy $S_1(M1)$ of the first compound and the lowest singlet energy $S_1(M2)$ of the second compound preferably satisfy a relationship of Numerical Formula 3 below.

$$S_1(M2) > S_1(M1) \quad \text{(Numerical Formula 3)}$$

In the exemplary embodiment, it is preferable that the electron affinity level Af(M2) of the second compound and the electron affinity level Af(M1) of the first compound satisfy a relationship of Numerical Formula 4 below.

When Numerical Formula 4 is satisfied, it is considered that electrons trapped by the second compound become more likely to be transferred from the second compound to the first compound, so that probability of recombination of electrons and holes in the first compound is improved while probability of recombination of the electrons and holes in the second compound is decreased.

Accordingly, when the Numerical Formula 4 is satisfied, the luminous efficiency is considered to be further improved.

$$Af(M2) < Af(M1) \quad \text{(Numerical Formula 4)}$$

In the exemplary embodiment, an energy gap $T_{77K}(M2)$ at 77K of the second compound and an energy gap $T_{77K}(M1)$ at 77K of the first compound preferably satisfy a relationship of Numerical Formula 4B below.

$$T_{77K}(M2) > T_{77K}(M1) \quad \text{(Numerical Formula 4B)}$$

Relationship Between Triplet Energy and Energy Gap at 77K

Description will be made on a relationship between a triplet energy and an energy gap at 77K. In the first exemplary embodiment, the energy gap at 77K is different from a typically defined triplet energy in some aspects.

The triplet energy is measured as follows. Firstly, a target compound for measurement is dissolved in an appropriate solvent to prepare a solution and the solution is encapsulated in a quartz glass tube to prepare a sample. A phosphorescent spectrum (ordinate axis: phosphorescent luminous intensity, abscissa axis: wavelength) of the sample is measured at a low temperature (77K). A tangent is drawn to a rise of the phosphorescent spectrum on the short-wavelength side. The triplet energy is calculated by a predetermined conversion equation based on a wavelength value at an intersection of the tangent and the abscissa axis.

Herein, the delayed fluorescent compound used in the present exemplary embodiment is preferably a compound having a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the first exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. The measurement target compound is dissolved in EPA (diethyl ether:isopentane:ethanol=5:5:2 (by volume ratio)) such that a concentration of the compound becomes 10 µmol/L. The obtained solution is put into a quartz cell to provide a measurement sample. A phosphorescent spectrum (ordinate axis: phosphorescent luminous intensity, abscissa axis: wavelength) of the sample is measured at a low temperature (77K). A tangent is drawn to a rise of the phosphorescent spectrum on the short-wavelength side. An energy amount is calculated as an energy gap $T_{77K}$ at 77K by the following conversion equation based on a wavelength value $\lambda_{edge}$ [nm] at an intersection of the tangent and the abscissa axis.

$T_{77K}$ [eV]=1239.85/$\lambda$edge     Conversion Equation (F1):

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Lowest Singlet Energy $S_1$

A method of measuring a lowest singlet energy $S_1$ with use of a solution (occasionally referred to as a solution method) is exemplified by a method below.

A 10 µmol/L toluene solution of a measurement target compound is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength side, and a wavelength value $\lambda$edge (nm) at an intersection of the tangent and the abscissa axis is obtained. The wavelength value $\lambda$edge [nm] is substituted in a conversion equation (F2) below to calculate a lowest singlet energy.

$S_1$ [eV]=1239.85/$\lambda$edge     Conversion Equation (F2):

Any device for measuring absorption spectrum is usable. For instance, a spectrophotometer (U3310 manufactured by Hitachi, Ltd.) is usable.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve fell (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less is not included in the above-mentioned maximum absorbance on the long-wavelength side.

In the present exemplary embodiment, a difference ($S_1$–$T_{77K}$) between the lowest singlet energy $S_1$ and the energy gap $T_{77K}$ at 77K is defined as $\Delta$ST.

In the present exemplary embodiment, a difference $\Delta$ST(M2) between the lowest singlet energy $S_1$(M2) of the second compound and the energy gap $T_{77K}$(M2) at 77K of the second compound is preferably less than 0.3 eV, more preferably less than 0.2 eV, further preferably less than 0.1 eV. In other words, $\Delta$ST(M2) preferably satisfies a relationship of at least one of the following Numerical Formulae 10 to 12.

$\Delta ST(M2)=S_1(M2)-T_{77K}(M2)<0.3$ eV     (Numerical Formula 10)

$\Delta ST(M2)=S_1(M2)-T_{77K}(M2)<0.2$ eV     (Numerical Formula 11)

$\Delta ST(M2)=S_1(M2)-T_{77K}(M2)<0.1$ eV     (Numerical Formula 12)

Content Ratio of Compounds in Red Emitting Layer

In the organic EL device of the present exemplary embodiment, in the red emitting layer, a content ratio of the first compound is preferably in a range from 0.01 mass % to 10 mass %, and a content ratio of the second compound is preferably in a range from 80 mass % to 99.99 mass %. An upper limit of the total of the respective content ratios of the first and second compounds in the red emitting layer is 100 mass %. It should be noted that the red emitting layer of the present exemplary embodiment may further contain a material(s) in addition to the first and second compounds.

The red emitting layer may contain a single type of the first compound or may contain two or more types of the first compound. The red emitting layer may contain a single type of the second compound or may contain two or more types of the second compound.

Green Pixel

The green pixel includes a green emitting layer.

Green Emitting Layer

The green emitting layer preferably contains a host material and a dopant material.

The green emitting layer may be a fluorescent emitting layer or a phosphorescent emitting layer. Moreover, the green emitting layer may be an emitting layer containing a thermally activated delayed fluorescent compound. In this case, the green emitting layer preferably contains the second compound in a form of a delayed fluorescent compound and the first compound (a fluorescent compound capable of emitting light in a range from 500 nm to 660 nm) in a form of a green fluorescent dopant material.

Host Material

Examples of the host material usable for the green emitting layer include compounds described in 1) to 4) below.
1) a metal complex such as an aluminum complex, a beryllium complex, or a zinc complex
2) a heterocyclic compound such as an oxadiazole derivative, a benzoimidazole derivative, or a phenanthroline derivative
3) a fused aromatic compound such as a carbazole derivative, an anthracene derivative, a phenanthrene derivative, a pyrene derivative, or a chrysene derivative
4) an aromatic amine compound such as a triarylamine derivative or a fused polycyclic aromatic amine derivative The host material of the green emitting layer is preferably a compound represented by a formula (51) or a formula (52) below.

[Formula 23]

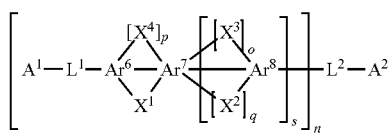

(51)

[Formula 24]

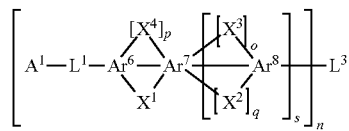

(52)

In the formulae (51) and (52), $Ar^6$, $Ar^7$ and $Ar^8$ are each independently a substituted or unsubstituted aromatic hydrocarbon group having 6 to 24 ring carbon atoms or a substituted or unsubstituted aromatic heterocyclic group having 3 to 24 ring atoms.

$Ar^6$, $Ar^7$ and $Ar^8$ may each independently have one or more substituents Y.

A plurality of substituents Y are mutually the same or different.

Y represents an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms with a carbon-carbon bond to $Ar^6$, $Ar^7$ and $A^8$.

In the formulae (51) and (52), $X^1$, $X^2$, $X^3$ and $X^4$ are each independently O, S, N—$R^1$ or $CR^2R^3$.

o, p and q are each independently 0 or 1.

s is 1, 2, or 3.

$R^1$, $R^2$ and $R^3$ are each independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms.

In the formulae (51) and (52), $L^1$ represents <<nret>> a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms with a carbon-carbon bond to $Ar^6$.

In the formula (51), $L^2$ represents a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms with a carbon-carbon bond to $Ar^6$.

In the formula (52), n is 2, 3 or 4. With $L^3$ as the linking group, a dimer, a trimer and a tetramer are formed when n is 2, 3 and 4, respectively.

In the formula (52), $L^3$ represents, when n is 2, a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms with a carbon-carbon bond to $Ar^8$.

When n is 3, $L^3$ represents a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 ring atoms with a carbon-carbon bond to $Ar^8$.

When n is 4, $L^3$ represents a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms with a carbon-carbon bond to $Ar^8$.

In the formulae (51) and (52), $A^1$ represents a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms with a carbon-carbon bond to $L^1$.

In the formula (51), $A^2$ represents a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms with a carbon-carbon bond to $L^2$.

A host of the green emitting layer is also preferably a compound represented by a formula (53) or a formula (54) below.

$$(Cz-)_n A \quad (53)$$

$$Cz(-A)_m \quad a\ (54)$$

In the formulae (53) and (54), Cz is a substituted or unsubstituted aryl carbazoyl group or a substituted or unsubstituted carbazoyl alkylene group.

n is an integer from 1 to 3.

m is an integer from 1 to 3.

A plurality of Cz are mutually the same or different.

A plurality of A are mutually the same or different.

A is a group represented by a formula (55) below.

$$(M)_p\text{-}(L)_q\text{-}(M')_r \quad (55)$$

In the formula (55), M and M' are each independently a substituted or unsubstituted nitrogen-containing hetero aromatic ring having 2 to 40 ring carbon atoms.

A plurality of M are mutually the same or different.

A plurality of M' are mutually the same or different.

L represents a single bond, a substituted or unsubstituted arylene group having 6 to 30 ring carbon atoms, a substituted or unsubstituted cycloalkylene group having 5 to 30 ring carbon atoms, or a substituted or unsubstituted heteroaromatic ring having 2 to 30 ring carbon atoms.

A plurality of L are mutually the same or different.

p is an integer from 0 to 2.

q is an integer from 1 to 2.

r is an integer from 0 to 2.

p+r is equal to or more than 1.

As the host material of the green emitting layer, a compound similar to the second compound that is thermally activated delayed fluorescent as described above. When the thermally activated delayed fluorescent second compound is used as the host material of the green emitting layer, a later-described green fluorescent material is preferably used as the dopant material.

Dopant Material

As the dopant material, a fluorescent compound emitting fluorescence and a phosphorescent compound emitting phosphorescence are usable.

Examples of a green fluorescent material usable for the green emitting layer include an aromatic amine derivative. Specific examples of the green fluorescent material include N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazole-9-yl)phenyl]-N-phenylanthracene-2-amine (abbreviation: 2YGABPhA), N, N, 9-triphenylanthracene-9-amine (abbreviation: DPhAPhA).

Moreover, as the green fluorescent material usable for the green emitting layer, the compound represented by the formula (1) is also usable.

A phosphorescent dopant of the green emitting layer preferably contains a metal complex formed of a metal selected from the group consisting of Ir, Pt, Os, Au, Cu, Re and Ru, and a ligand.

Specific examples of the phosphorescent dopant of the green emitting layer include the following compounds in addition to PQIr(iridium(III)bis(2-phenylquinolyl-N,C$^{2'}$) acetylacetonate), Ir(ppy)$_3$(fac-tris(2-phenylpyridine) iridium).

[Formula 25]

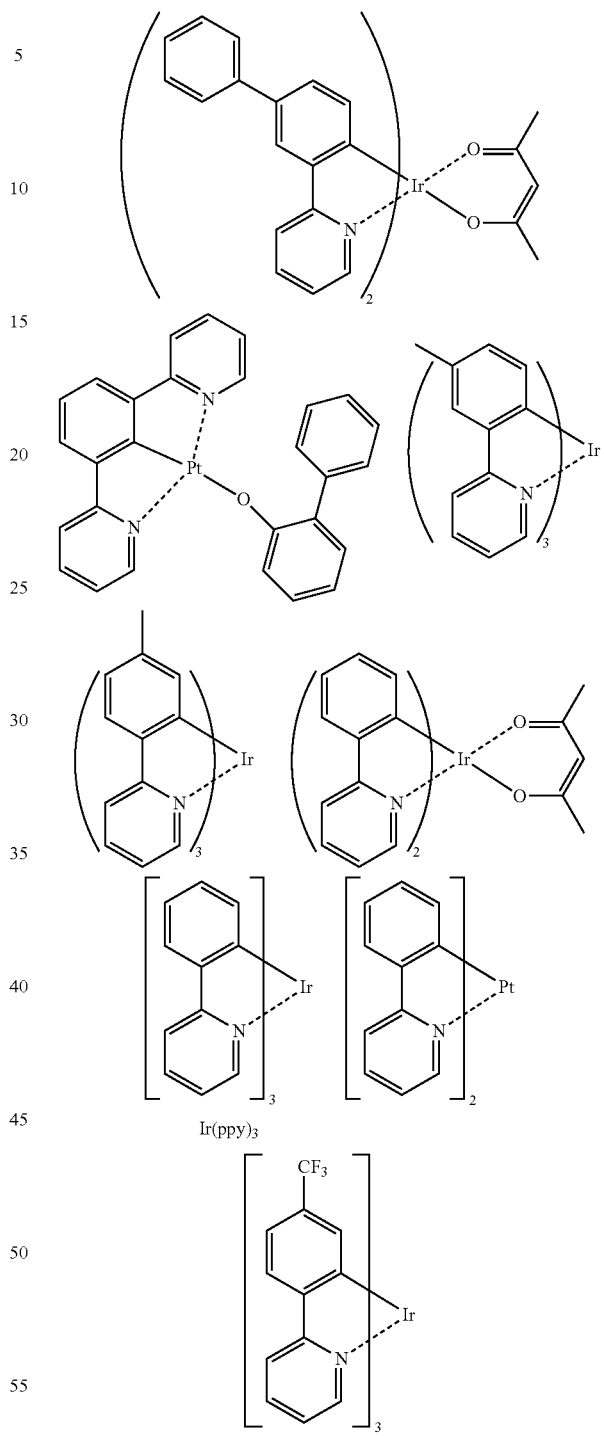

Herein, when the dopant material is the fluorescent material, green emission means emission whose fluorescence spectrum has a main peak wavelength in a range from 500 nm to 560 nm.

A main peak wavelength of the dopant material contained in the green emitting layer is more preferably in a range from 500 nm to 540 nm, further preferably in a range from 510 nm to 530 nm.

The main peak wavelength can be measured according to the same method as the main peak wavelength of the first compound.

The green emitting layer may contain only a single kind of the host material or may contain two or more kinds of the host material.

A content of the host material is not particularly limited. The content of the host material is, for instance, preferably in a range from 80 mass % to 99.9 mass %, more preferably in a range from 90 mass % to 99.9 mass %, further preferably in a range from 95 mass % to 99.9 mass % with reference to the entire green emitting layer.

The green emitting layer may contain only a single kind of the dopant material or may contain two or more kinds of the dopant material.

A content of the dopant material is not particularly limited. The content of the dopant material is, for instance, preferably in a range from 0.1 mass % to 20 mass %, more preferably in a range from 0.1 mass % to 10 mass %, further preferably in a range from 0.1 mass % to 5 mass % with reference to the entire green emitting layer in content.

The green emitting layer may contain a delayed fluorescent compound.

The delayed fluorescent compound contained in the green emitting layer is not particularly limited to but may be the delayed fluorescent compound (e.g., the compound represented by the formula (3)) described in relation to the red emitting layer.

Hereinafter, occasionally, the delayed fluorescent compound contained in the green emitting layer is referred to as a "compound DF" and the dopant material contained in the green emitting layer is referred to as a "compound GD."

When the green emitting layer contains the second compound in a form of a delayed fluorescent compound (compound DF) and the first compound (a fluorescent compound capable of emitting light in a range from 500 nm to 660 nm) in a form of a dopant material (compound GD), the lowest singlet energy $S_1(GD)$ of the compound GD and the lowest singlet energy $S_1(DF)$ of the compound DF preferably satisfy Numerical Formula 3A below as well as the Numerical Formula 3.

$$S_1(DF) > S_1(GD) \qquad \text{(Numerical Formula 3A)}$$

The electron affinity level Af(DF) of the compound DF and the electron affinity level Af(GD) of the compound DF preferably satisfy Numerical Formula 4A as well as the Numerical Formula 4.

When the Numerical Formula 4A is satisfied, it is considered that electrons trapped by the compound DF become more likely to be transferred from the compound DF to the compound GD, so that probability of recombination of electrons and holes in the compound GD is improved while probability of recombination of the electrons and holes in the compound DF is decreased.

Accordingly, when the (Numerical Formula 4A is satisfied, the luminous efficiency is considered to be further improved.

$$Af(DF) < Af(GD) \qquad \text{(Numerical Formula 4A)}$$

When the green emitting layer contains the delayed fluorescent compound (compound DF) and the dopant material (compound GD):

a content ratio of the compound GD in the green emitting layer is preferably in the same range as the content ratio of the first compound in the red emitting layer; and a content ratio of the compound DF in the green emitting layer is preferably in the same range as the content ratio of the second compound in the red emitting layer.

Blue Pixel

The blue pixel includes a blue emitting layer.

Blue Emitting Layer

The blue emitting layer preferably contains a host material and a dopant material.

The blue emitting layer contains a blue emitting compound.

The blue emitting layer may be a fluorescent emitting layer or a phosphorescent emitting layer. The blue emitting layer may be an emitting layer containing a thermally activated delayed fluorescent compound. The blue emitting layer is preferably a fluorescent emitting layer.

Host Material

Examples of the host material usable for the blue emitting layer include compounds described in 1) to 4) below.

1) a metal complex such as an aluminum complex, a beryllium complex, or a zinc complex
2) a heterocyclic compound such as an oxadiazole derivative, a benzoimidazole derivative, or a phenanthroline derivative
3) a fused aromatic compound such as a carbazole derivative, an anthracene derivative, a phenanthrene derivative, a pyrene derivative, or a chrysene derivative
4) an aromaticamine compound such as a triarylamine derivative or a fused polycyclic aromatic amine derivative A host of the blue emitting layer is preferably a fused aromatic compound, more preferably an anthracene derivative.

In addition to the above-described host, a dibenzofuran compound described in WO05/113531 and JP2005-314239, a fluorene compound described in WO02/14244, and a benzanthracene compound described in WO08/145239 are usable.

Dopant Material

As the dopant material, a fluorescent compound emitting fluorecense or a phosphorescent compound emitting phosphorescence are usable.

Examples of a blue fluorescent material usable for the blue emitting layer include a pyrene derivative, styrylamine derivative, chrysene derivative, fluoranthene derivative, fluorene derivative, diamine derivative, and triarylamine derivative. Specific examples include N,N'-bis[4-(9H-carbazole-9-yl)phenyl]-N,N'-diphenylstilbene-4,4'-diamine (abbreviation: YGA2S), 4-(9H-carbazole-9-yl)-4'-(10-phenyl-9-anthryl)triphenylamine (abbreviation: YGAPA), and 4-(10-phenyl-9-anthryl)-4'-(9-phenyl-9H-carbazole-3-yl)triphenylamine (abbreviation: PCBAPA).

Examples of a blue phosphorescent material usable for the blue emitting layer include metal complexes such as an iridium complex, osmium complex and platinum complex. Specific examples include bis[2-(4',6'-difluorophenyl)pyridinato-N,C2']iridium(III)tetrakis(1-pyrazolyl)borate (abbreviation: FIr6), bis[2-(4',6'-difluorophenyl)pyridinato-N,C2']iridium(III)picolinate (abbreviation: FIrpic), bis[2-(3',5'bistrifluoromethylphenyl)pyridinato-N,C2']iridium(II)picolinate (abbreviation: Ir(CF3ppy)$_2$(pic)), and bis[2-(4',6'-difluorophenyl)pyridinato-N,C2']iridium(III) acetylacetonato (abbreviation: FIracac).

Herein, when the dopant material is the fluorescent material, the blue light emission refers to light emission whose main peak wavelength of fluorescence spectrum is in a range from 430 nm to 500 nm.

The main peak wavelength of the dopant material contained in the blue emitting layer is preferably in a range from 430 nm to less than 500 nm.

The main peak wavelength can be measured according to the same method as the main peak wavelength of the red dopant.

Examples of the blue fluorescent material usable for the blue emitting layer include a pyrene derivative, styrylamine derivative, chrysene derivative, fluoranthene derivative, fluorene derivative, boron complex, perylene derivative, oxadiazole derivative, anthracene derivative, diamine derivative, and triarylamine derivative.

The dopant of the blue emitting layer is preferably a derivative selected from the group consisting of a fluoranthene derivative, styrylarylene derivative, pyrene derivative, arylacetylene derivative, fluorene derivative, boron complex, perylene derivative, oxadiazole derivative, and anthracene derivative.

The dopant of the blue emitting layer is more preferably a derivative selected from the group consisting of a fluoranthene derivative, styrylarylene derivative, pyrene derivative, and boron complex.

The dopant of the blue emitting layer is further preferably a derivative selected from the group consisting of a fluoranthene derivative and a boron complex compound.

A combination of the host and the dopant in the blue emitting layer is preferably a combination of the host being an anthracene derivative and the dopant being a fluoranthene derivative or a boron complex.

A fluoranthene derivative usable in the blue emitting layer is exemplified by a compound represented by a formula (4) below.

[Formula 26]

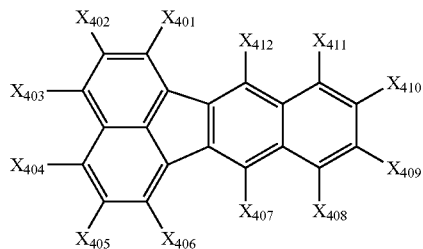

(4)

In the formula (4), $X_{401}$ to $X_{412}$ are each independently a hydrogen atom or a substituent.

The fluoranthene derivative is preferably the compound represented by the formula (4) in which $X_{401}$, $X_{402}$, $X_{404}$ to $X_{406}$ and $X_{408}$ to $X_{411}$ each are a hydrogen atom, and $X_{403}$, $X_{407}$ and $X_{412}$ each are a substituted or unsubstituted aryl group having 6 to 30 ring carbon atoms.

The fluoranthene derivative is more preferably the compound represented by the formula (4) in which $X_{401}$, $X_{402}$, $X_{404}$ to $X_{406}$ and $X_{408}$ to $X_{411}$ each are a hydrogen atom, $X_{407}$ and $X_{412}$ each are a substituted or unsubstituted aryl group having 6 to 30 ring carbon atoms, and $X_{403}$ is —$Ar_{401}$-$Ar_{402}$. $Ar_{401}$ is a substituted or unsubstituted arylene group having 6 to 30 ring carbon atoms. $Ar_{402}$ is a substituted or unsubstituted aryl group having 6 to 30 ring carbon atoms.

The fluoranthene derivative is also more preferably the compound represented by the formula (4) in which $X_{401}$, $X_{402}$, $X_{404}$ to $X_{406}$ and $X_{408}$ to $X_{411}$ each are a hydrogen atom, $X_{407}$ and $X_{412}$ each are a substituted or unsubstituted aryl group having 6 to 30 ring carbon atoms, and $X_{403}$ is —$Ar_{401}$-$Ar_{402}$—$Ar_{403}$. $Ar_{401}$ and $Ar_{403}$ are each independently a substituted or unsubstituted arylene group having 6 to 30 ring carbon atoms. $Ar_{402}$ is a substituted or unsubstituted aryl group having 6 to 30 ring carbon atoms.

The boron complex compound usable in the blue emitting layer is exemplified by a compound represented by a formula (41) below.

[Formula 27]

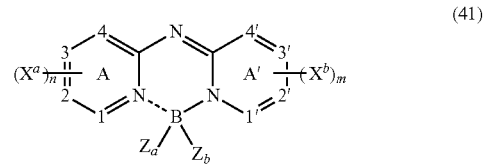

(41)

In the formula (41): A and A' are each independently an azine ring corresponding to a six-membered aromatic ring containing at least one nitrogen;

m is an integer from 0 to 4;

n is an integer from 0 to 4;

$Z_a$ and $Z_b$ are each independently a halogen atom;

1, 2, 3 and 4 in the azine ring A each independently represent a nitrogen atom or a carbon atom bonded to $X^a$;

1', 2', 3' and 4' in the azine ring A' each independently represent a nitrogen atom or a carbon atom bonded to $X^b$;

$X^a$ is a hydrogen atom or a substituent;

a plurality of $X^a$ are mutually the same or different;

$X^a$ may be linked to the ring A to form a fused ring with the ring A, the formed fused ring including an aryl or heteroaryl substituent;

$X^b$ is a hydrogen atom or a substituent;

a plurality of $X^b$ are mutually the same or different; and $X^b$ may be linked to the ring A' to form a fused ring with the ring A', the formed fused ring including an aryl or heteroaryl substituent.

The boron complex compound represented by the formula (41) is preferably a compound represented by a formula (42) below.

[Formula 28]

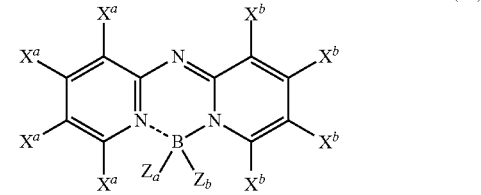

(42)

In the formula (42):

a plurality of $X^a$ are mutually the same or different;

two or more of four $X^a$ are substituents;

a plurality of $X^b$ are mutually the same or different;

two or more of four $X^b$ are substituents;

two or more of four $X^a$ being substituents are mutually bonded to form an aromatic ring or not bonded; and two or more of four $X^b$ being substituents are mutually bonded to form an aromatic ring or not bonded.

In the formulae (41) and (42), $Z_a$ and $Z_b$ are preferably fluorine atoms.

An anthracene compound usable in the blue emitting layer is exemplified by a compound represented by a formula (43) below.

[Formula 29]

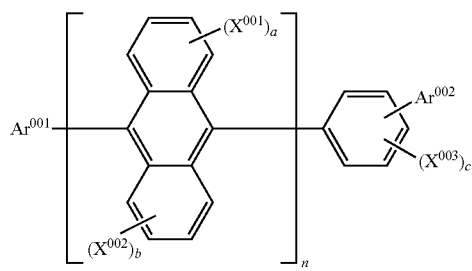

(43)

In the formula (43):
$Ar^{001}$ is a substituted or unsubstituted fused aryl group having 10 to 30 ring carbon atoms;
$Ar^{002}$ is a substituted or unsubstituted aryl group having 6 to 30 ring carbon atoms;
$X^{001} \sim X^{003}$ are each independently a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 1 to 30 carbon atoms, a carboxyl group, a halogen atom, a cyano group, a nitro group or a hydroxy group;
a, b and c are each independently an integer from 0 to 4;
n is an integer from 1 to 3; and
when n is 2 or more, the anthracene cyclic structure enclosed in square brackets are mutually the same or different.

In the formula (43), n is preferably 1.
In the formula (43), a, b and c are preferably 0.
A fluorescent dopant usable in the blue emitting layer is exemplified by a compound represented by a formula (44) below.

[Formula 30]

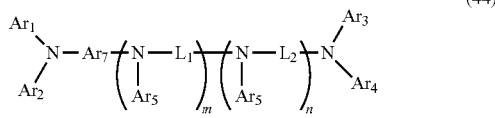

(44)

In the formula (44):
$Ar_1$ to $Ar_6$ are each independently a substituted or unsubstituted aryl group having 6 to 30 ring carbon atoms;
$Ar_7$ is a substituted or unsubstituted arylene group having 6 to 30 ring carbon atoms;
m is 0 or 1;
n is 0 or 1; and
$L_1$ and $L_2$ are each independently an alkenylene group or a divalent aromatic hydrocarbon group.

A substituent meant by "substituted or unsubstituted" in the formula (44) is preferably at least one substituent selected from the group consisting of alkoxy group, dialkylamino group, alkyl group, fluoroalkyl group, and silyl group.

In addition to the above-described dopant, a pyrene compound described in JP2004-204238, WO05/108348, WO04/83162, WO09/84512, KR10-2008-79956, KR10-2007-115588, and KR10-2010-24894, a chrysene compound described in WO04/44088, and an anthracene compound described in WO07/21117 are usable.

The blue emitting layer may contain only a single kind of the host material or may contain two or more kinds of the host material.

A content of the host material is not particularly limited. The content of the host material is, for instance, preferably in a range from 80 mass % to 99.9 mass %, more preferably in a range from 90 mass % to 99.9 mass %, further preferably in a range from 95 mass % to 99.9 mass % with reference to the entire blue emitting layer.

The blue emitting layer may contain only a single kind of the dopant material or may contain two or more kinds of the dopant material.

A content of the dopant material is not particularly limited. The content of the dopant material is, for instance, preferably in a range from 0.1 mass % to 20 mass %, more preferably in a range from 0.1 mass % to 10 mass %, further preferably in a range from 0.1 mass % to 5 mass % with reference to the entire blue emitting layer.

Thickness of Red Emitting Layer, Green Emitting Layer, and Blue Emitting Layer

The red emitting layer, the green emitting layer, and the blue emitting layer each independently have a thickness in a range from 5 nm to 50 nm, more preferably from 7 nm to 50 nm, most preferably from 10 nm to 50 nm. At the thickness of 5 nm or more, formation of the emitting layer and adjustment of the chromaticity are likely to be easy. At the thickness of 50 nm or less, an increase in the drive voltage is likely to be suppressed.

When the red emitting layer includes a plurality of layers, the thickness of the red emitting layer means a total thickness of the plurality of layers. The same definition applies to the thickness of each of the green emitting layer and the blue emitting layer.

Hole Transporting Zone

Examples of layers forming the hole transporting zone in each pixel include a hole transporting layer, hole injecting layer, and electron blocking layer.

Hole Transporting Layer

The hole transporting layer is a layer containing a substance exhibiting a high hole transportability (preferably having a hole mobility of $10^{-6}$ cm$^2$/[V·s] or more). An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N, N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB).

A carbazole derivative such as CBP, CzPA, and PCzPA and an anthracene derivative such as t-BuDNA, DNA, and DPAnth may be used for the hole transporting layer. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

The examples of the substance exhibiting a high hole injectability further include: an aromatic amine compound, which is a low-molecule organic compound, such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid)(PAni/PSS) are also usable.

Electron Blocking Layer

The same material as the above-described materials of the hole injecting layer and the hole transporting layer are usable for the electron blocking layer.

Electron Transporting Zone

Examples of layers forming the electron transporting zone in each emitting unit include an electron transporting layer, an electron injecting layer, and a hole blocking layer.

Electron Transporting Layer

The electron transporting layer is a layer containing a substance having a high electron transportability (preferably an electron mobility of $10^{-6}$ cm$^2$/[V·s] or more). For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: Almq3), bis(10-hydroxybenzo[h]quinolinato)beryllium (abbreviation: BeBq$_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. It should be noted that any substance other than the above substance may be used for the electron transporting layer as long as the substance exhibits a higher electron transportability than the hole transportability. The electron transporting layer may be not only a single layer but also a laminate of two or more layers formed of the above substance(s).

Moreover, a high polymer compound is usable for the electron transporting layer. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)](abbreviation: PF-BPy) and the like are usable.

Electron Injecting Layer

The electron injecting layer is a layer containing a highly electron-injectable substance. Examples of the electron injecting layer include an alkali metal, alkaline earth metal such as lithium (Li), cesium (Cs), calcium (Ca), lithium fluoride (LiF), cesium fluoride (CsF), calcium fluoride (CaF$_2$), and lithium oxide (Li$_2$O), and a compound thereof (e.g., lithium quinolate Liq). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the anode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Hole Blocking Layer

The same material as the above-described materials of the electron injecting layer and the electron transporting layer are usable for the hole blocking layer.

Substrate

The substrate is used as a support for the luminescent device. For instance, glass, quartz, plastics and the like are usable as the substrate. A flexible substrate is also usable. The flexible substrate means a substrate that can be bent. Examples of the flexible substrate include a plastic substrate made of polycarbonate, polyarylate, polyethersulfone, polypropylene, polyester, polyvinyl fluoride, or polyvinyl chloride. Moreover, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), silver (Ag) and nitrides of a metal material (e.g., titanium nitride) are usable.

The material is typically formed into a film by a sputtering method. For instance, indium oxide-zinc oxide can be formed by the sputtering method using a target containing zinc oxide in a range from 1 wt % to 10 wt % relative to indium oxide. The indium oxide containing tungsten oxide and zinc oxide can be formed by the sputtering method using a target in which tungsten oxide in a range from 0.5 wt % to 5 wt % and zinc oxide in a range from 0.1 wt % to 1 wt % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

The elements belonging to the group 1 or 2 of the periodic table, which are a material having a small work function, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal are usable. It should be noted that the vacuum deposition method and the sputtering method are usable for forming the anode using the alkali metal, alkaline earth metal and the alloy thereof. Further, when a silver paste is used for the anode, the coating method and the inkjet method are usable.

When the organic EL device is of a bottom emission type, the anode is preferably formed of a light-transmissive or semi-transmissive metallic material that transmits light from the emitting layer. Herein, the light-transmissive or semi-transmissive property means the property of allowing transmissivity of 50% or more (preferably 80% or more) of the light emitted from the emitting layer. The light-transmissive or semi-transmissive metallic material can be selected in use as needed from the above materials listed in the description about the anode.

When the organic EL device is of a top emission type, the anode is a reflective electrode having a reflective layer. The reflective layer is preferably formed of a metallic material having light reflectivity. Herein, the light reflectivity means the property of reflecting 50% or more (preferably 80% or more) of the light emitted from the emitting layer. The metallic material having light reflectivity can be selected in use as needed from the above materials listed in the description about the anode.

The anode may be formed only of the reflective layer, but may be a multilayer structure having the reflective layer and a conductive layer (preferably a transparent conductive layer). When the anode has the reflective layer and the conductive layer, it is preferable that the conductive layer is disposed between the reflective layer and the hole transporting zone. A material of the conductive layer can be selected in use as needed from the above materials listed in the description about the anode.

Cathode

It is preferable to use metal, an alloy, an electroconductive compound, and a mixture thereof, which have a small work function (specifically, 3.8 eV or less) for the cathode. Examples of materials for the cathode include elements belonging to the group 1 or 2 of the periodic table, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

When the organic EL device is of a bottom emission type, the cathode is a reflective electrode having a reflective layer. The reflective layer is preferably formed of a metallic material having light reflectivity. The metallic material having light reflectivity can be selected in use as needed from the above materials listed in the description about the cathode.

When the organic EL device is of a top emission type, the cathode is preferably formed of a light-transmissive or semi-transmissive metallic material that transmits light from the emitting layer. The light-transmissive or semi-transmissive metallic material can be selected in use as needed from the above materials listed in the description about the cathode.

Capping Layer

The top emission type organic EL device usually has a capping layer on the top of the cathode.

As the capping layer, for example, a high polymer compound, metal oxide, metal fluoride, metal boride, silicon nitride, silicon compound (silicon oxide or the like), and the like can be used.

In addition, an aromatic amine derivative, an anthracene derivative, a pyrene derivative, a fluorene derivative, or a dibenzofuran derivative can also be used for the capping layer.

In addition, a laminate in which layers containing these substances are stacked can also be used as the capping layer.

Layer Thickness

In an organic EL device, a layer thickness of each of the emitting layer and the like provided between the anode and the cathode is not limited except for the above particular definition. In general, the layer thickness preferably ranges from several nanometers to 1 µm in order to avoid defects such as a pin hole and to prevent efficiency from being deteriorated since a high voltage needs to be applied in the case of extreme thickness.

Second Exemplary Embodiment

Figure 6:
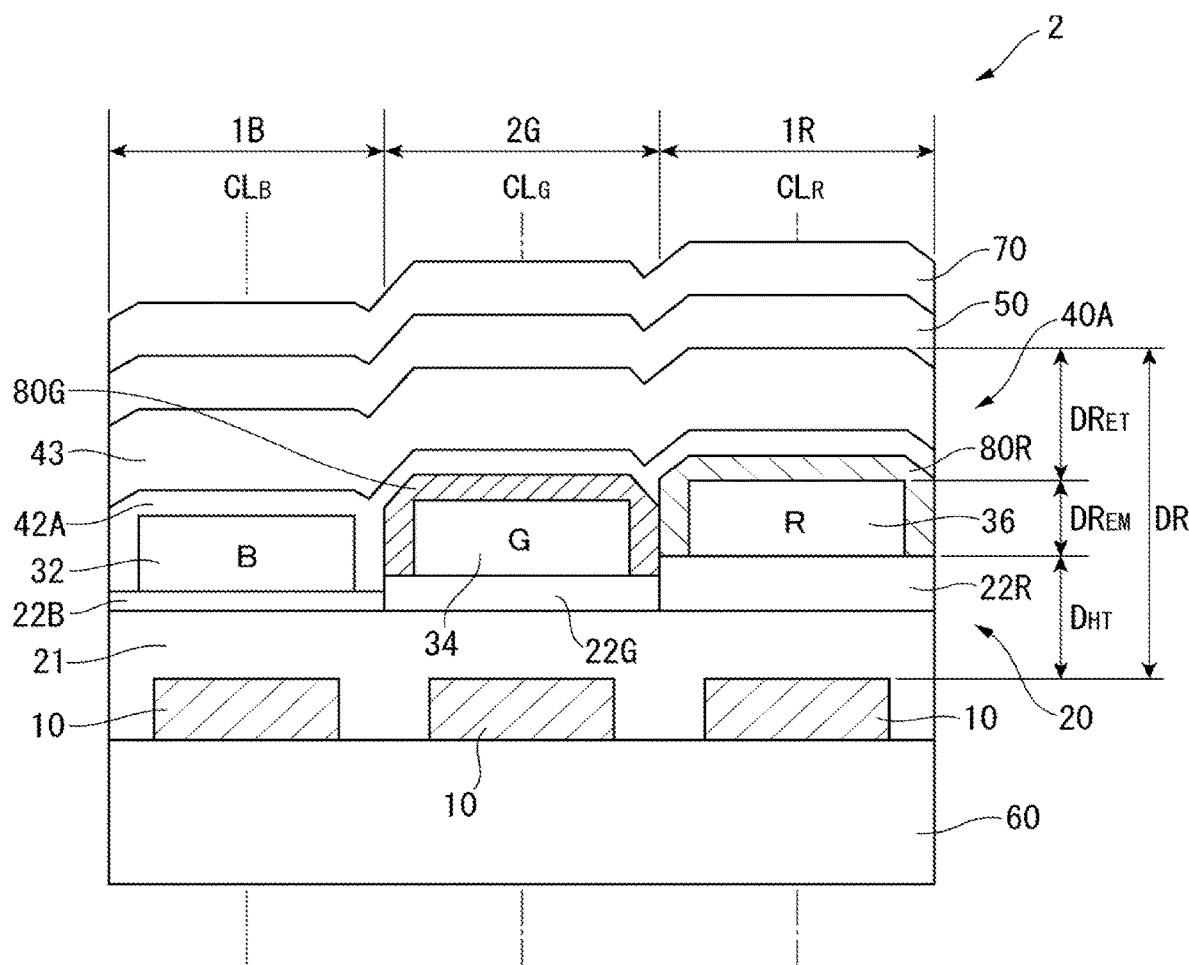
FIG. 6 illustrates a schematic arrangement of an organic EL device according to a second exemplary embodiment of the invention.
Figure 12:
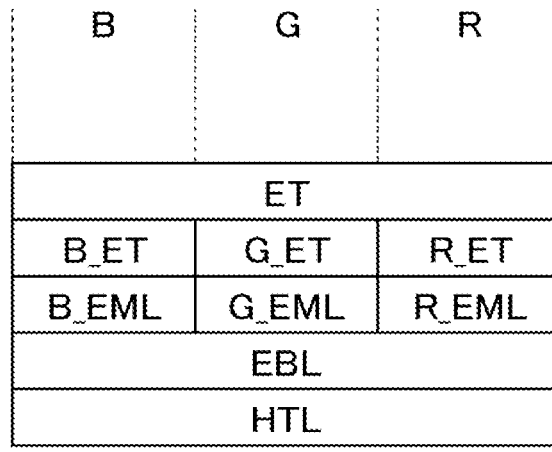
FIG. 12 schematically illustrates a partial cross section of an organic EL device according to a still further exemplary embodiment of the invention.

FIG. 6 schematically illustrates an arrangement of an organic EL device according to a second exemplary embodiment of the invention.

An organic EL device 2 shown in FIG. 6 includes a hole blocking layer 80G in the electron transporting zone 40A in the green pixel 2G, the hole blocking layer 80G being provided as the additional layer to the organic EL device 1 shown in FIG. 1. It should be noted that the additional layer is the non-common layer described above.

Further, in the organic EL device 2 shown in FIG. 6, the green emitting layer 34 in the green pixel 2G contains a delayed fluorescent compound (compound DF) and a dopant material (compound GD). Since the organic EL device 2 is otherwise the same as the organic EL device in the first exemplary embodiment, the description of the same features is omitted or simplified.

The delayed fluorescent compound (compound DF) is preferably the host material.

The compound DF is not limited to but may be the second compound (e.g., the compound represented by the formula (3)) described in the description of the red emitting layer.

As the compound GD, for instance, the green fluorescent material described in relation to the green emitting layer or the compound represented by the formula (1) is usable.

The green emitting layer 34 may contain a metal complex. It is preferable that the green emitting layer 34 does not contain a phosphorescent metal complex. It is also preferable that the green emitting layer 34 does not contain a metal complex.

The electron transporting zone 40A in the second exemplary embodiment includes: the hole blocking layer 80R as the additional layer in the red pixel 1R; the hole blocking layer 80G as the additional layer in the green pixel 2G; a hole blocking layer 42A; and the electron transporting layer 43. The additional layers (the hole blocking layers 80R, 80G) and the hole blocking layer 42A (the common layer) may be formed of the same material or different materials. The electron transporting zone 40A may include the electron injecting layer and the like between the cathode 50 and the electron transporting layer 43.

The hole transporting zone 20 preferably includes: the second common layer (e.g., the hole transporting layer 21 in FIG. 6, however, the second common layer is not limited to the hole transporting layer) provided in common through pixels (the red pixel 1R, the green pixel 2G and the blue pixel 1B); and electron blocking layers 22R, 22G, 22B formed in the respective pixels. The hole transporting zone 20 may include the hole injecting layer and the like between the hole transporting layer 21 and the anode 10.

Accordingly, the organic EL device 2 of the second exemplary embodiment can improve the luminous efficiency.

Further, according to the organic EL device 2 of the second exemplary embodiment, since the roll-off value [(current efficiency at 10 mA/cm$^2$ of the current density)/(current efficiency at 1 mA/cm$^2$ of the current density)] can be made closer to 1, roll-off characteristics when driven at a high current density (e.g., from 1 mA/cm$^2$ to 10 mA/cm$^2$) can be improved.

In the organic EL device 2 of the second exemplary embodiment, it is preferable that the anode 10 is a reflective electrode and the cathode 50 is a light transmissive electrode.

Second Exemplary Embodiment A

Figure 19:
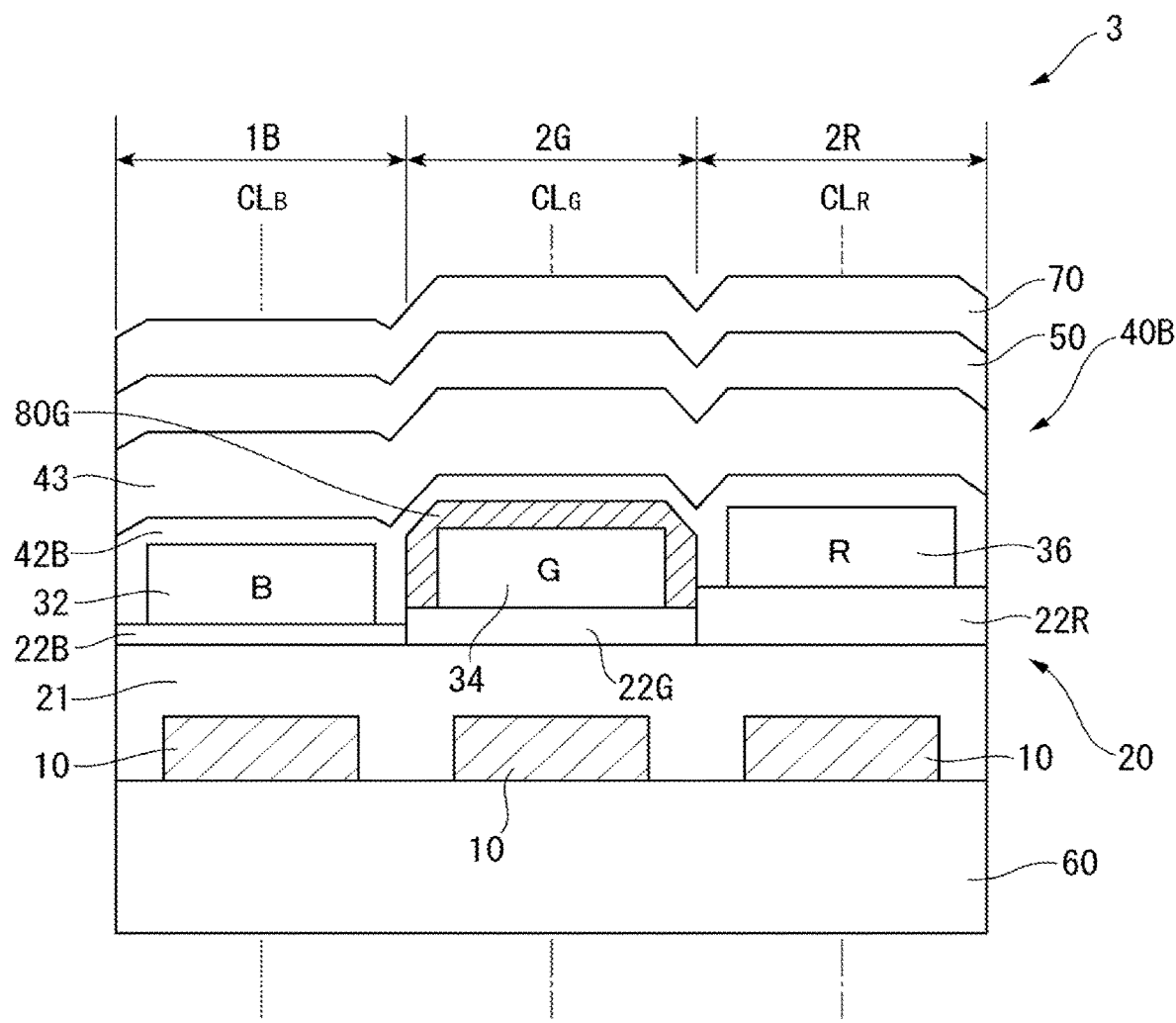
FIG. 19 illustrates a schematic arrangement of an organic EL device according to a third exemplary embodiment of the invention.

FIG. 19 schematically illustrates an arrangement of an organic EL device according to a second exemplary embodiment A.

An organic EL device 3 shown in FIG. 19 is provided such that, unlike the organic EL device 1 shown in FIG. 1, the electron transporting zone 40B in the red pixel 2R does not have the additional layer (the hole blocking layer 80R in FIG. 1), but instead, the electron transporting zone 40B in the green pixel 2G has the additional layer (the hole blocking layer 80G in FIG. 19). The additional layer is the non-common layer described above.

In the organic EL device 3 shown in FIG. 19, the green emitting layer 34 in the green pixel 2G contains the delayed fluorescent compound (compound DF) and the dopant material (compound GD). In other words, the green pixel 2G shown in FIG. 19 has the same arrangement as the green pixel 2G shown in FIG. 6. Since the organic EL device 3 is otherwise the same as the organic EL devices in the first and second exemplary embodiments, the description of the same features is omitted or simplified.

The electron transporting zone 40B in the second exemplary embodiment A includes: the hole blocking layer 80G as the additional layer in the green pixel 2G; a hole blocking layer 42B; and the electron transporting layer 43. The additional layer (the hole blocking layer 80G in FIG. 19) and the hole blocking layer 42B (the common layer) may be made of the same material or different materials. The electron transporting zone 40B may include the electron injecting layer and the like between the cathode 50 and the electron transporting layer 43.

The hole transporting zone 20 preferably includes: the second common layer (e.g., the hole transporting layer 21 in FIG. 19, however, the second common layer is not limited to the hole transporting layer) provided in common through pixels (the red pixel 2R, the green pixel 2G and the blue pixel 1B); and the electron blocking layers 22R, 22G, 22B formed in the respective pixels. The hole transporting zone 20 may include the hole injecting layer and the like between the hole transporting layer 21 and the anode 10.

As a result of dedicated study, the inventors have found that a particular light emission caused by a delayed fluorescent compound is obtained at a high efficiency by providing the additional layer in the electron transporting zone of at least the green pixel among the RGB pixels, in other words, by providing a relatively thicker electron transporting zone in the green pixel than a typical electron transporting zone in a green pixel.

Specifically, in the organic EL device 3 shown in FIG. 19, the additional layer (hole blocking layer 80G in FIG. 19) is provided in the electron transporting zone 40B in the green pixel 2G. Although a relationship between the electron transporting zones 40B of the pixels in terms of the thickness is not limited to the relationship shown in FIG. 19, the thickness of the electron transporting zone 40B in the green pixel 2G is preferably larger than the thickness of the electron transporting zone 40B in the red pixel 2R and the blue pixel 1B. Further, such an arrangement that the first common layer (hole blocking layer 42B in FIG. 19) is provided in common in the red pixel 2R, the green pixel 2G, and the blue pixel 1B is employed.

It is considered that providing of the additional layer in the electron transporting zone 40B of the green pixel 2G leads to overlapping of the recombination region in the green emitting layer 34, which is considered to be located in the electron transporting zone 40B, with a position where the cavity effect can be suitably produced.

Since it is expected that holes and electrons are recombined in the recombination region, where the cavity effect can be suitably produced, in the green pixel 2G in the second exemplary embodiment A, it is considered that a particular light emission caused by a delayed fluorescent compound can be obtained from the green emitting layer 34 at a high efficiency.

Accordingly, the organic EL device 3 of the second exemplary embodiment A can improve the luminous efficiency.

Further, the organic EL device in the second exemplary embodiment A can also improve roll-off characteristics when driven at a high current density (e.g., from 1 mA/cm² to 10 mA/cm²).

Relationship Between First Compound and Second Compound in Green Emitting Layer

In the organic EL device 3 of the second exemplary embodiment A, the lowest singlet energy $S_1(M1)$ of the first compound and the lowest singlet energy $S_1(M2)$ of the second compound in the green emitting layer 34 preferably satisfy the relationship of the Numerical Formula 3 below.

$$S_1(M2) > S_1(M1) \quad \text{(Numerical Formula 3)}$$

In the organic EL device 3 of the second exemplary embodiment A, the electron affinity level Af(M2) of the second compound and the electron affinity level Af(M1) of the first compound contained in the green emitting layer 34 preferably satisfy a relationship of Numerical Formula 4 below.

When the Numerical Formula 4 is satisfied, the luminous efficiency is considered to be further improved due to the same reason as that described in the later-described "Relationship between First Compound and Second Compound in Red Emitting Layer".

$$Af(M2) < Af(M1) \quad \text{(Numerical Formula 4)}$$

Relationship Between First Compound, Second Compound and Third Compound in Green Emitting Layer In the organic EL device 3 of the second exemplary embodiment A, the green emitting layer 34 may further include a third compound. The third compound is exemplified by a third compound described in a third exemplary embodiment described later.

In the organic EL device 3 of the second exemplary embodiment A, when the green emitting layer 34 contains the first compound, the second compound, and the third compound, a lowest singlet energy $S_1(M3)$ of the third compound and the lowest singlet energy $S_1(M2)$ of the second compound preferably satisfy a relationship of Numerical Formula 5 below.

$$S_1(M3) > S_1(M2) \quad \text{(Numerical Formula 5)}$$

In the organic EL device 3 according to the second exemplary embodiment A, when the green emitting layer 34 contains the first compound, the second compound, and the third compound, it is preferable that the electron affinity level Af(M2) of the second compound and an electron affinity level Af(M3) of the third compound satisfy a relationship of the following (Numerical Formula 6.

When the Numerical Formula 6 is satisfied, the luminous efficiency is considered to be further improved due to the same reason as that described in the later-described "Relationship between First Compound, Second Compound and Third Compound in Red Emitting Layer".

$$Af(M3) < Af(M2) \quad \text{(Numerical Formula 6)}$$

In the organic EL device 3 of the second exemplary embodiment A, it is preferable that the anode 10 is a reflective electrode and the cathode 50 is a light transmissive electrode.

Preferable Embodiments of First Exemplary Embodiment, Second Exemplary Embodiment and Second Exemplary Embodiment A Arrangements of the organic EL devices in the first exemplary embodiment, the second exemplary embodiment and the second exemplary embodiment A are exemplarily shown in FIGS. 7 to 17.

FIGS. 7 to 17 schematically illustrates partial cross sections of the organic EL devices in the first exemplary embodiment, the second exemplary embodiment and the second exemplary embodiment A.

The description of the substrate, the anode, the cathode and the like are omitted in FIGS. 7 to 17. In FIGS. 7 to 17, B, G and R represent the blue pixel, the green pixel, and the red pixel, respectively.

Reference numerals represent the following in the figures. In adjacent pixels (B and G, or G and R), the same reference numeral represents a layer (common layer) formed in common through the adjacent pixels. For instance, in FIG. 7, ET in the blue pixel B, ET in the green pixel G, and ET in the red pixel R represent a layer (common layer) formed in common through B, G and R.

The thickness of each layer is optionally determined although a frame height (i.e., the layer thickness) is the same for convenience of the explanation. It should be noted that the thickness of the layer being the common layer is the same.

The hole injecting layer may be provided between the hole transporting layer and the anode (not shown).

The electron injecting layer may be provided between the electron transporting layer and the cathode (not shown).

In terms of the number of times when the mask is changed during manufacturing, etc. and in terms of improving mass productivity, the arrangements of the organic EL devices shown in FIGS. 7 to 12 and 15 among FIGS. 7 to 17 are preferable, and the arrangements of the organic EL devices shown in FIGS. 7, 8, 10 and 11 are more preferable.

Explanation of FIGS. 7 to 17

HTL . . . hole transporting layer (common layer)
ET . . . electron transporting layer (common layer)
HBL . . . hole blocking layer (common layer)
EBL . . . electron blocking layer (common layer)
B_HT . . . hole transporting layer (common layer when the hole transporting layer is provided in common through two pixels, or non-common layer when the hole transporting layer is provided only in a single pixel)

G_HT . . . hole transporting layer (common layer when the hole transporting layer is provided in common through two pixels, or non-common layer when the hole transporting layer is provided in common in a single pixel)

R_HT, R_HT1, R_HT2 . . . hole transporting layer (non-common layer) in R R_HT1 and R_HT2 are layers formed of different materials, respectively.

B_EML, G_EML, R_EML . . . emitting layer (non-common layer)

B_HBL, G_HBL, R_HBL . . . hole blocking layer (non-common layer)

B_ET, G_ET, R_ET . . . electron transporting layer (non-common layer)

Third Exemplary Embodiment

An organic EL device according to a third exemplary embodiment is different from the organic EL devices according to the first and second exemplary embodiments in that the red emitting layer further contains the third compound. The organic EL device according to the third exemplary embodiment is otherwise the same as the organic EL devices according to the first and second exemplary embodiments Specifically, in the third exemplary embodiment, the red emitting layer contains the red fluorescent first compound, the delayed fluorescent second compound, and the third compound.

In this embodiment, the first compound is preferably the dopant material, the second compound is preferably the host material, and the third compound is also preferably a material for dispersing the dopant material in the emitting layer as a dispersant.

Third Compound

The third compound may be a delayed fluorescent compound or a compound not exhibiting a delayed fluorescence.

The third compound is not particularly limited to but preferably a compound other than an amine compound. For instance, the third compound can be a derivative selected from the group consisting of a carbazole derivative, dibenzofuran derivative, and dibenzothiophene derivative, but not limited to these derivatives.

The third compound is also preferably a compound containing at least one of a partial structure represented by a formula (31), a partial structure represented by a formula (32), a partial structure represented by a formula (33A), and a partial structure represented by a formula (34A) in a molecule of the third compound.

[Formula 31]

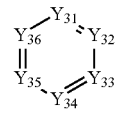
(31)

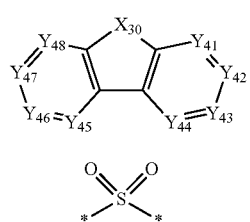
(32)

(33A)

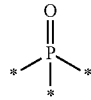
(34A)

In the formula (31), $Y_{31}$ to $Y_{36}$ are each independently a nitrogen atom, or a carbon atom bonded to another atom in the molecule of the third compound.

However, at least one of $Y_{31}$ to $Y_{36}$ is a carbon atom bonded to another atom in the molecule of the third compound.

In the formula (32): $Y_{41}$ to $Y_{48}$ are each independently a nitrogen atom, or a carbon atom bonded to another atom in the molecule of the third compound;

at least one of $Y_{41}$ to $Y_{48}$ is a carbon atom bonded to another atom in the molecule of the third compound; and $X_{30}$ is a nitrogen atom bonded to another atom in the molecule of the third compound, an oxygen atom, or a sulfur atom.

In the formulae (33A) and (34A), * each independently represents a bonding position to another atom in the molecule of the third compound, or another structure.

In the formula (32), it is also preferable that at least two of $Y_{41}$ to $Y_{48}$ are carbon atoms bonded to other atoms in the molecule of the third compound, thereby forming a cyclic structure including the carbon atoms.

For instance, the partial structure represented by the formula (32) is preferably any one partial structure selected from the group consisting of partial structures represented by a formula (321), formula (322), formula (323), formula (324), formula (325), and formula (326).

[Formula 32]

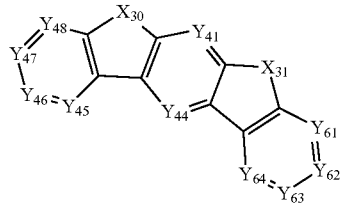
(321)

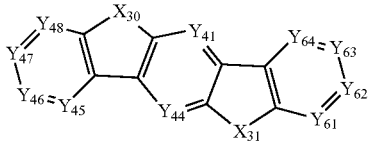
(322)

[Formula 33]

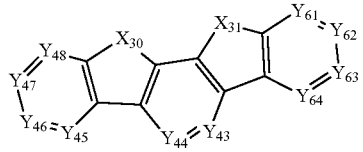
(323)

-continued (324)

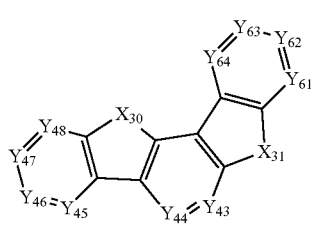

[Formula 34]

(325)

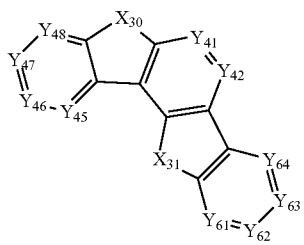

(326)

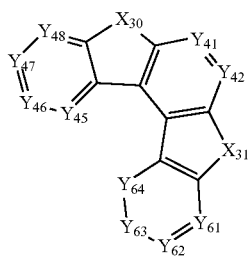

In the formulae (321) to (326):

$X_{30}$ is each independently a nitrogen atom bonded to another atom in the molecule of the third compound, an oxygen atom, or a sulfur atom;

$Y_{41}$ to $Y_{48}$ are each independently a nitrogen atom, or a carbon atom bonded to another atom in the molecule of the third compound;

$X_{31}$ is each independently a nitrogen atom bonded to another atom in the molecule of the third compound, an oxygen atom, a sulfur atom, or a carbon atom bonded to another atom in the molecule of the third compound; and $Y_{61}$ to $Y_{64}$ are each independently a nitrogen atom, or a carbon atom bonded to another atom in the molecule of the third compound.

In the present exemplary embodiment, the third compound preferably has the partial structure represented by the formula (323) among the formulae (321) to (326).

The partial structure represented by the formula (31) is preferably contained in the third compound as at least one group selected from the group consisting of a group represented by a formula (33) and a group represented by a formula (34).

The third compound also preferably has at least one partial structure of the partial structures represented by the formula (33) and the formula (34). Since the bonding positions are at meta positions as in the partial structures represented by the formula (33) and the formula (34), an energy gap $T_{77K}(M3)$ at 77K of the third compound can be kept high.

[Formula 35]

(33)

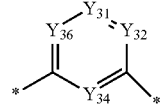

(34)

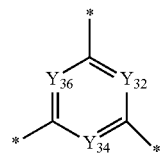

In the formula (33), $Y_{31}$, $Y_{32}$, $Y_{34}$, and $Y_{36}$ are each independently a nitrogen atom or $CR_{31}$.

In the formula (34), $Y_{32}$, $Y_{34}$, and $Y_{36}$ are each independently a nitrogen atom or $CR_{31}$.

In the formulae (33) and (34):

$R_{31}$ is each independently a hydrogen atom or a substituent;

$R_{31}$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

It should be noted that a substituted or unsubstituted aryl group having 6 to 30 ring carbon atoms in $R_{31}$ is preferably a non-fused ring.

In the formulae (33) and (34), * each independently represents a bonding position to another atom in the molecule of the third compound, or another structure.

In the formula (33), $Y_{31}$, $Y_{32}$, $Y_{34}$ and $Y_{36}$ are preferably each independently $CR_{31}$. A plurality of $R_{31}$ are mutually the same or different.

In the formula (34), $Y_{32}$, $Y_{34}$ and $Y_{36}$ are preferably each independently $CR_{31}$. A plurality of $R_{31}$ are mutually the same or different.

A substituted germanium group is preferably represented by —$Ge(R_{301})_3$. $R_{301}$ is each independently a substituent. A substituent $R_{301}$ is preferably a substituted or unsubstituted alkyl group having 1 to 30 carbon atoms, or a substituted or unsubstituted aryl group having 6 to 30 ring carbon atoms. A plurality of $R_{301}$ are mutually the same or different.

The partial structure represented by the formula (32) is preferably contained in the third compound as at least one group selected from the group consisting of groups represented by formulae (35) to (39) and (30a).

[Formula 36]

(35)

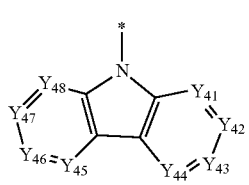

-continued

(36)
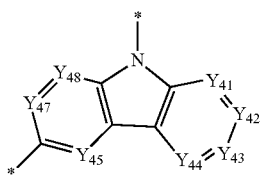
[Formula 37]

(37)
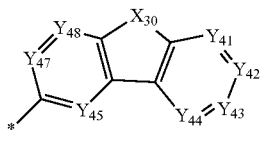

(38)
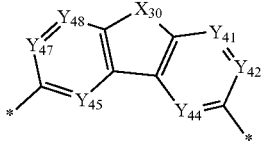
[Formula 38]

(39)
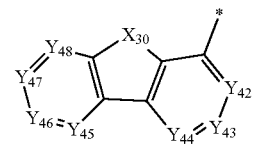

(30a)
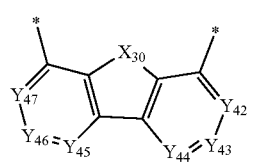

In the formula (35), $Y_{41}$ to $Y_{48}$ are each independently a nitrogen atom or $CR_{32}$.

In the formulae (36) and (37), $Y_{41}$ to $Y_{45}$, $Y_{47}$ and $Y_{48}$ are each independently a nitrogen atom or $CR_{32}$.

In the formula (38), $Y_{41}$, $Y_{42}$, $Y_{44}$, $Y_{45}$, $Y_{47}$ and $Y_{48}$ are each independently a nitrogen atom or $CR_{32}$.

In the formula (39), $Y_{42}$ to $Y_{48}$ are each independently a nitrogen atom or $CR_{32}$.

In the formula (30a), $Y_{42}$ to $Y_{47}$ are each independently a nitrogen atom or $CR_{32}$.

In the formulae (35) to (39) and (30a), $R_{32}$ is each independently a hydrogen atom or a substituent.

$R_{32}$ as the substituent is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

A plurality of $R_{32}$ are mutually the same or different.

In the formulae (37) to (39) and (30a), $X_{30}$ is $NR_{33}$, an oxygen atom, or a sulfur atom.

$R_{33}$ is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a fluorine atom, a cyano group, a nitro group, and a substituted or unsubstituted carboxy group.

A plurality of $R_{33}$ are mutually the same or different.

It should be noted that a substituted or unsubstituted aryl group having 6 to 30 ring carbon atoms in $R_{33}$ is preferably a non-fused ring.

In the formulae (35) to (39) and (30a), * each independently represents a bonding position to another atom in the molecule of the third compound, or another structure.

In the formula (35), $Y_{41}$ to $Y_{48}$ are preferably each independently $CR_{32}$. In the formulae (36) and (37), $Y_{41}$ to $Y_{45}$, $Y_{47}$ and $Y_{48}$ are preferably each independently $CR_{32}$.

In the formula (38), $Y_{41}$, $Y_{42}$, $Y_{44}$, $Y_{45}$, $Y_{47}$ and $Y_{4}$ are preferably each independently $CR_{32}$.

In the formula (39), $Y_{42}$ to $Y_{48}$ are preferably each independently $CR_{32}$.

In the formula (30a), $Y_{42}$ to $Y_{47}$ are preferably each independently $CR_{32}$. A plurality of $R_{32}$ are mutually the same or different.

In the third compound, $X_{30}$ is preferably an oxygen atom or a sulfur atom, more preferably an oxygen atom.

In the third compound, $R_{31}$ and $R_{32}$ each independently represent a hydrogen atom or a substituent. $R_{31}$ and $R_{32}$ as the substituents are preferably each independently a group selected from the group consisting of a fluorine atom, a cyano group, a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms. $R_{31}$ and $R_{32}$ are more preferably a hydrogen atom, a cyano group, a substituted or unsubstituted aryl group having 6 to 30 ring carbon atoms, or a substituted or unsubstituted heteroaryl group having 5 to 30 ring atoms. When $R_{31}$ and $R_{32}$ as the substituents are each a substituted or unsubstituted aryl group having 6 to 30 ring carbon atoms, the aryl group is preferably a non-fused ring.

It is also preferable that the third compound is an aromatic hydrocarbon compound or an aromatic heterocyclic compound. Moreover, it is preferable that the third compound does not have a fused aromatic hydrocarbon ring in the molecule thereof.

Manufacturing Method of Third Compound

The third compound can be manufactured by methods disclosed in International Publication No. WO2012/153780, International Publication No. WO2013/038650, and the like. Furthermore, the third compound can be manufactured, for instance, by application of known substitution reactions and/or materials depending on a target compound.

Examples of the substituent for the third compound are shown below, but the invention is not limited thereto.

Specific examples of the aryl group (occasionally referred to as an aromatic hydrocarbon group) include a phenyl group, tolyl group, xylyl group, naphthyl group, phenanthryl group, pyrenyl group, chrysenyl group, benzo[c]phenanthryl group, benzo[g]chrysenyl group, benzanthryl group, triphenylenyl group, fluorenyl group, 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group and fluorenyl group are preferable.

Specific examples of the aryl group having a substituent include a tolyl group, xylyl group and 9,9-dimethylfluorenyl group.

As is understood from the specific examples, the aryl group includes both fused aryl group and non-fused aryl group.

Preferable examples of the aryl group include a phenyl group, biphenyl group, terphenyl group, quarterphenyl group, naphthyl group, triphenylenyl group and fluorenyl group.

Specific examples of the heteroaryl group (occasionally referred to as a heterocyclic group, heteroaromatic ring group or aromatic heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothienyl group, dibenzothienyl group, azadibenzothienyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothienyl group, carbazolyl group, pyridyl group, pyrimidinyl group, triazinyl group, azadibenzofuranyl group and azadibenzothienyl group may be preferable.

The heteroaryl group is preferably a dibenzofuranyl group, dibenzothienyl group, carbazolyl group, pyridyl group, pyrimidinyl group, triazinyl group, azadibenzofuranyl group or azadibenzothienyl group, and further preferably a dibenzofuranyl group, dibenzothienyl group, azadibenzofuranyl group and azadibenzothienylgroup.

In the third compound, it is also preferable that the substituted silyl group is selected from the group consisting of a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyldimethylsilyl group.

Specific examples of the substituted or unsubstituted triarylsilyl group include triphenylsilyl group and tritolylsilyl group.

In the third compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

In the third compound, examples of the substituted carboxy group include benzoyloxy group.

Relationship between First Compound, Second Compound and Third Compound in Red Emitting Layer In the red emitting layer, the lowest singlet energy $S_1(M3)$ of the third compound and the lowest singlet energy $S_1(M2)$ of the second compound preferably satisfy a relationship of Numerical Formula 5 below.

$$S_1(M3) > S_1(M2) \quad \text{(Numerical Formula 5)}$$

In the red emitting layer, the lowest singlet energy $S_1(M3)$ of the third compound is preferably larger than the lowest singlet energy $S_1(M1)$ of the first compound.

In the red emitting layer, it is preferable that the electron affinity level $Af(M2)$ of the second compound and the electron affinity level $Af(M3)$ of the third compound satisfy a relationship of Numerical Formula 6 below.

When the Numerical Formula 6 is satisfied, the luminous efficiency is considered to be further improved.

$$Af(M3) < Af(M2) \quad \text{(Numerical Formula 6)}$$

It is considered that, when the relationship represented by the Numerical Formula 6 is satisfied, electrons injected in the red emitting layer are trapped in the second compound and a recombination region in the red emitting layer is likely to be localized close to the electron transporting layer.

It is also considered that, when the relationship represented by the Numerical Formula 6 is satisfied, the trapped electrons become more likely to be transferred from the second compound to the first compound, so that probability of recombination of electrons and holes in the first compound is improved while probability of recombination of the electrons and holes in the second compound is decreased.

An energy gap $T_{77K}(M3)$ at 77K of the third compound is preferably larger than an energy gap $T_{77K}(M1)$ at 77K of the first compound in the red emitting layer.

An energy gap $T_{77K}(M3)$ at 77K of the third compound is preferably larger than an energy gap $T_{77K}(M2)$ at 77K of the second compound in the red emitting layer.

The lowest singlet energy $S_1(M1)$ of the first compound, the lowest singlet energy $S_1(M2)$ of the second compound and the lowest singlet energy $S_1(M3)$ of the third compound in the red emitting layer preferably satisfy a relationship of Numerical Formula 7 below.

$$S_1(M3) > S_1(M2) > S_1(M1) \quad \text{(Numerical Formula 7)}$$

The first compound, the second compound, and the third compound in the red emitting layer preferably satisfy a relationship of Numerical Formula 8 below.

$$T_{77K}(M3) > T_{77K}(M2) > T_{77K}(M1) \quad \text{(Numerical Formula 8)}$$

When the organic EL device of the present exemplary embodiment emits light, it is preferable that the dopant material contained in each emitting layer mainly emits light.

When the emitting layer is the red emitting layer, it is preferable that the first compound contained in the red emitting layer mainly emits light.

Content Ratio of Compounds in Red Emitting Layer

In the organic EL device of the present exemplary embodiment, a content ratio of the first compound in the red emitting layer is preferably in a range from 0.01 mass % to 10 mass %, more preferably in a range from 0.01 mass % to 5 mass %, further preferably in a range from 0.01 mass % to 1 mass %.

The content ratio of the second compound preferably ranges from 10 mass % to 80 mass %, more preferably from 10 mass % to 60 mass %, further preferably from 20 mass % to 60 mass %.

The content ratio of the third compound preferably ranges from 10 mass % to 80 mass %.

An upper limit of the total of the respective content ratios of the first, second and third compounds in the red emitting layer is 100 mass %. It should be noted that the red emitting layer of the present exemplary embodiment may further contain a material other than the first, second and third compounds.

The red emitting layer may contain a single type of the first compound or may contain two or more types of the first compound. The red emitting layer may contain a single type of the second compound or may contain two or more types of the second compound. The red emitting layer may contain a single type of the third compound or may contain two or more types of the third compound.

Figure 5:
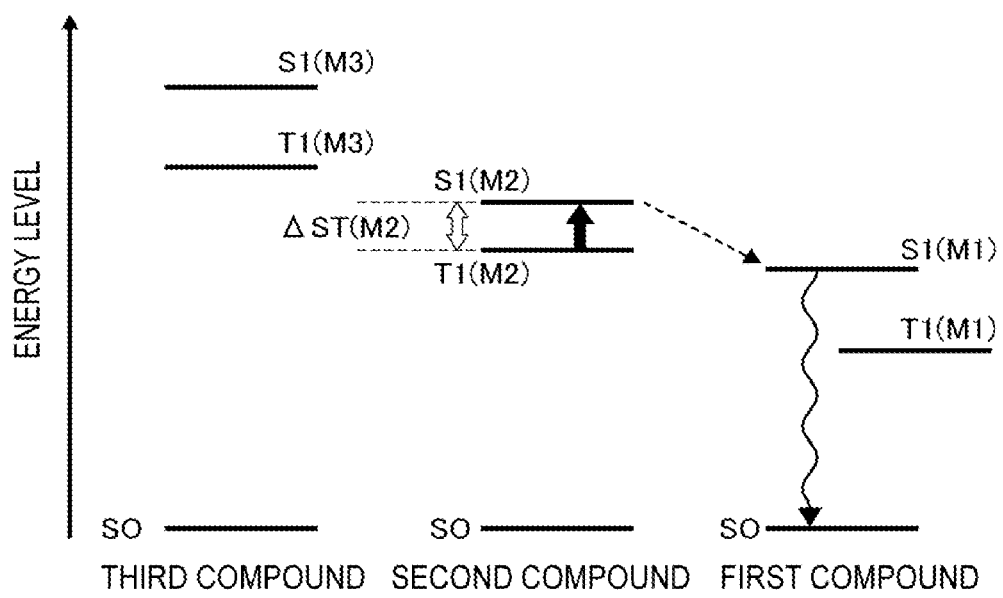
FIG. 5 illustrates a relationship between energy levels and energy transfer of a third compound, the second compound and the first compound in the red emitting layer.

FIG. 5 shows an example of a relationship among energy levels of the first compound, the second compound and the third compound in the red emitting layer. In FIG. 5, S0 represents a ground state. S1(M1) represents the lowest singlet state of the first compound. T1(M1) represents the lowest triplet state of the first compound. S1(M2) represents the lowest singlet state of the second compound. T1(M2) represents the lowest triplet state of the second compound. S1(M3) represents the lowest singlet state of the third compound. T1(M3) represents the lowest triplet state of the third compound. A dashed arrow directed from S1(M2) to S1(M1) in FIG. 5 represents Forster energy transfer from the lowest singlet state of the second compound to the lowest singlet state of the first compound.

As shown in FIG. 5, when a compound having a small ΔST(M2) is used as the second compound, inverse intersystem crossing from the lowest triplet state T1(M2) to the lowest singlet state S1(M2) can be caused by a heat energy. Subsequently, Förster energy transfer from the lowest singlet state S1(M2) of the second compound to the first compound occurs to generate the lowest singlet state S1(M1). As a result, fluorescence from the lowest singlet state S1(M1) of the first compound can be observed. It is inferred that the internal quantum efficiency can be theoretically raised up to 100% also by using delayed fluorescence by the TADF mechanism.

The organic EL device of the third exemplary embodiment can improve the luminous efficiency.

Further, according to the organic EL device of the third exemplary embodiment, since the roll-off value [(current efficiency at 10 mA/cm² of the current density)/(current efficiency at 1 mA/cm² of the current density)] can be made closer to 1, roll-off characteristics when driven at a high current density (e.g., from 1 mA/cm² to 10 mA/cm²) can be improved.

In the organic EL device according to the third exemplary embodiment, the green emitting layer may further contain the third compound in addition to the delayed fluorescent compound (compound DF) and the dopant material (compound GD).

The third compound is not particularly limited to but may be the third compound described in relation to the third exemplary embodiment.

The compound DF is not particularly limited to but may be the second compound (e.g., the compound represented by the formula (3)) described in relation to the red emitting layer.

As the compound GD, for instance, the green fluorescent material described in relation to the green emitting layer, or the compound represented by the formula (1) is usable.

The green emitting layer may contain a metal complex. It is preferable that the green emitting layer does not contain a phosphorescent metal complex. It is also preferable that the green emitting layer does not contain a metal complex.

Hereinafter, occasionally, the third compound contained in the green emitting layer is referred to as a "compound MX."

The lowest singlet energy $S_1(M3)$ of the compound MX contained in the green emitting layer and the lowest singlet energy $S_1(M2)$ of the compound DF preferably satisfy a relationship of Numerical Formula 5A.

$$S_1(MX) > S_1(DF) \qquad \text{(Numerical Formula 5A)}$$

It is preferable that an electron affinity level Af(M2) of the compound DF contained in the green emitting layer and an electron affinity level Af(M3) of the compound MX contained in the green emitting layer satisfy a relationship of Numerical Formula 6A below.

$$Af(M3) < Af(M2) \qquad \text{(Numerical Formula 6A)}$$

It is considered that, when the relationship represented by the Numerical Formula 6A is satisfied, electrons injected in the green emitting layer are trapped in the compound DF and a recombination region in the green emitting layer is likely to be localized close to the electron transporting layer.

When the Numerical Formula 6A is satisfied, it is considered that the trapped electrons become more likely to be transferred from the compound DF to the compound GD, so that probability of recombination of electrons and holes in the compound GD is improved while probability of recombination of the electrons and holes in the compound DF is decreased.

Accordingly, when the Numerical Formula 6A is satisfied, the luminous efficiency is considered to be further improved.

When the green emitting layer further contains the third compound in addition to the delayed fluorescent compound (compound DF) and the dopant material (compound GD):
 a content ratio of the compound GD in the green emitting layer is preferably in the same range as the content ratio of the first compound in the red emitting layer;
 a content ratio of the compound DF in the green emitting layer is preferably in the same range as the content ratio of the second compound in the red emitting layer; and
 a content ratio of the compound MX in the green emitting layer is preferably in the same range as the content ratio of the third compound in the red emitting layer.

MODIFICATION OF EMBODIMENT(S)

It should be noted that the invention is not limited to the above exemplary embodiments but may include any modification and improvement as long as such modification and improvement are compatible with the invention.

An organic EL device 11 according to another exemplary embodiment includes a first pixel 1F and the blue pixel 1B juxataposed on the substrate 60, but an arrangement of the organic EL device 11 is not limited thereto. The organic EL device 11 according to the exemplary embodiment only requires at least that the first pixel 1F and the blue pixel 1B are apposed on the substrate 60.

In the exemplary embodiment, the additional layer (the hole blocking layer 80F in FIG. 18) is not particularly limited as long as the additional layer is provided between the first emitting layer 36F and the cathode 50. For instance, in FIG. 18, the additional layer (the hole blocking layer 80F in FIG. 18) may be provided between the hole blocking layer 42 and the electron transporting layer 43 or between the electron transporting layer 43 and the cathode 50.

In the first exemplary embodiment, the additional layer (the hole blocking layer 80R in FIG. 1) is not particularly limited as long as the additional layer is provided between the red emitting layer 36 and the cathode 50. For instance, in FIG. 1, the additional layer (the hole blocking layer 80R in FIG. 1) may be provided between the hole blocking layer 42 and the electron transporting layer 43 or between the electron transporting layer 43 and the cathode 50.

In the second exemplary embodiment, the additional layers (the hole blocking layers 80R and 80G in FIG. 6) are not particularly limited as long as the respective additional layers are provided between the red emitting layer 36 and the cathode 50 and between the green emitting layer 34 and the cathode 50. For instance, in FIG. 6, the additional layers (the hole blocking layers 80R and and 80G in FIG. 6) may be provided between the hole blocking layer 42A and the electron transporting layer 43 or between the electron transporting layer 43 and the cathode 50.

In the second exemplary embodiment A, the additional layer (the hole blocking layer 80G in FIG. 19) is not particularly limited as long as the additional layer is provided between the green emitting layer 34 and the cathode 50. For instance, in FIG. 19, the additional layer (the hole blocking layer 80G in FIG. 19) may be provided between the hole blocking layer 42B and the electron transporting layer 43 or between the electron transporting layer 43 and the cathode 50.

For instance, the green emitting layer in the organic EL device according to the second exemplary embodiment A may further contain the third compound.

Specifically, in the second exemplary embodiment A, the green emitting layer may further contain the third compound in addition to the green fluorescent first compound and the delayed fluorescent second compound.

For instance, the emitting layer in each of the pixels is not limited to a single layer but may be a laminate of a plurality of emitting layers. When the organic EL device has a plurality of emitting layers, it is only required that at least one red emitting layer contains the first compound and the second compound. Alternatively, when the organic EL device has a plurality of emitting layers, it is only required that at least one green emitting layer contains the first compound and the second compound. For instance, the rest of the emitting layers may be a fluorescent emitting layer or a phosphorescent emitting layer with use of emission caused by electron transfer from the triplet excited state directly to the ground state.

It should be noted that the red emitting layer, the green emitting layer and the blue emitting layer are sometimes collectively referred to as "the emitting layer" when it is not necessary to distinguish between the red emitting layer, the green emitting layer and the blue emitting layer.

The organic EL device of the exemplary embodiment preferably include the electron blocking layer between the anode and the emitting layer.

When the electron blocking layer is provided in contact with the side of the emitting layer close to the anode, the electron blocking layer permits transport of holes, but blocks electrons from reaching a layer provided close to the anode (e.g., the hole transporting layer) beyond the electron blocking layer.

For instance, the organic EL device according to the exemplary embodiment optionally has the hole blocking layer adjacent to a side of the emitting layer close to the cathode. The hole blocking layer is preferably in contact with the emitting layer and blocks at least one of electrons and excitons.

For instance, when the hole blocking layer is provided in contact with a side of the emitting layer close to the cathode, the hole blocking layer permits transport of electrons, but blocks holes from reaching a layer provided close to the cathode (e.g., the electron transporting layer) beyond the hole blocking layer. When the organic EL device includes the electron transporting layer, the organic EL device preferably includes the hole blocking layer between the emitting layer and the electron transporting layer.

Moreover, the blocking layer (hole blocking layer and electron blocking layer) may be adjacent to the emitting layer so that excited energy does not leak out from the emitting layer toward neighboring layer(s). When the blocking layer is adjacent to the emitting layer, the blocking layer blocks excitons generated in the emitting layer from transferring to a layer(s) (e.g., the electron transporting layer and the hole transporting layer) closer to the electrode(s) beyond the blocking layer. The organic EL device of the exemplary embodiment preferably includes the hole blocking layer and the like as the additional layer in the electron transporting zone of the red pixel.

In addition, the specific structure and shapes for practicing the invention may be altered to other structures and shapes as long as such other structures and shapes are compatible with the invention.

Fourth Exemplary Embodiment

Display

A display in a fourth exemplary embodiment is installed with the organic EL device according to any one of another exemplary embodiment, the first exemplary embodiment, the second exemplary embodiment, the second exemplary embodiment A, the third exemplary embodiment, and the modification of the exemplary embodiments. Examples of the display device include a display component (e.g., an organic EL panel module), TV, mobile phone, tablet and personal computer.

Since the display of the fourth exemplary embodiment is installed with the organic EL device of the exemplary embodiment, the luminous efficiency is improvable.

Fifth Exemplary Embodiment

Electronic Device

An electronic device in a fifth exemplary embodiment is installed with the organic EL device according to any one of the another exemplary embodiment, the first exemplary embodiment, the second exemplary embodiment, the second exemplary embodiment A, the third exemplary embodiment, and the modification of the exemplary embodiments. Examples of the electronic device include a display and a light-emitting apparatus. The display is exemplified by the examples described in relation to the above-described display. Examples of the light-emitting unit include an illuminator and a vehicle light.

Since the electronic device of the fifth exemplary embodiment is installed with the organic EL device of the exemplary embodiment, the luminous efficiency is improvable.

Herein, numerical ranges represented by "x to y" represents a range whose lower limit is the value (x) recited before "to" and whose upper limit is the value (y) recited after "to".

Herein, the phrase "Rx and Ry are mutually bonded to form a ring" means, for instance, that Rx and Ry include a carbon atom, a nitrogen atom, an oxygen atom, a sulfur atom or a silicon atom, the atom(s) contained in Rx (a carbon atom, a nitrogen atom, an oxygen atom, a sulfur atom or a silicon atom) and the atom(s) contained in Ry (a carbon atom, a nitrogen atom, an oxygen atom, a sulfur atom or a silicon atom) are bonded via a single bond(s), a double bond(s), a triple bond, and/or a divalent linking group(s) to form a ring having 5 or more ring atoms (specifically, a heterocycle or an aromatic hydrocarbon ring). x represents a number, a character or a combination of a number and a character. y represents a number, a character or a combination of a number and a character.

The divalent linking group is not limited. Examples of the divalent linking group include —O—, —CO—, —CO$_2$—, —S—, —SO—, —SO$_2$—, —NH—, —NRa-, and a group provided by a combination of two or more of these linking group.

Specific examples of the heterocycle include a cyclic structure (heterocycle) provided by removing a bond from the "heteroaryl group" exemplified in later-described "Description of Substituents in Formula." The heterocyclic ring may have a substituent.

Specific examples of the aromatic hydrocarbon ring include a cyclic structure (aromatic hydrocarbon ring) provided by removing a bond from the "aryl group" exemplified in later-described "Description of Substituents in Formula." The aromatic hydrocarbon ring may have a substituent.

Examples of Ra include a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms.

For instance, when "Rx and Ry are mutually bonded to form a ring," an atom(s) contained in $Rx_1$ and an atom(s) contained in $Ry_1$ in a molecular structure represented by a formula (E1) below form a ring (cyclic structure) E represented by a formula (E2); an atom(s) contained in $Rx_1$ and an atom(s) contained in $Ry_1$ in a molecular structure represented by a formula (F1) below form a ring (cyclic structure) F represented by a formula (F2); an atom(s) contained in $Rx_1$ and an atom(s) contained in $Ry_1$ in a molecular structure represented by a formula (G1) below form a ring (cyclic structure) G represented by a formula (G2); an atom(s) contained in $Rx_1$ and an atom(s) contained in $Ry_1$ in a molecular structure represented by a formula (H1) below form a ring (cyclic structure) H represented by a formula (H2); or an atom(s) contained in $Rx_1$ and an atom(s) contained in $Ry_1$ in a molecular structure represented by a formula (I1) below form a ring (cyclic structure) I represented by a formula (I2).

In the formulae (E1) to (I1), * each independently represent a bonding position to another atom in a molecule. The two * in the formulae (E1), (F1), (G1), (H1) and (I1) correspond to two * in the formula (E2), (F2), (G2), (H2) and (I2), respectively.

[Formula 39]

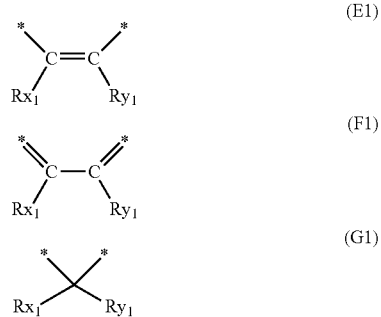

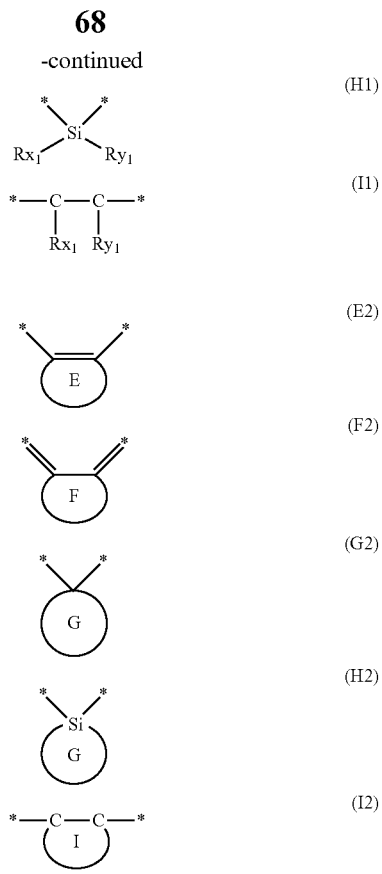

In the molecular structures represented by the formulae (E2) to (I2), E to I each represent a cyclic structure (ring having 5 or more ring atoms). In the formulae (E2) to (I2), * each independently represent a bonding position to another atom in a molecule. The two * in the formula (E2) correspond to two * in the formula (E1). Similarly, two * in each of the formulae (F2) to (I2) correspond one-to-one to two * in in each of the formulae (F1) to (I1).

For instance, in the formula (E1), $Rx_1$ and $Ry_1$ are mutually bonded to form the ring E in the formula (E2) and the ring E is an unsubstituted benzene ring, the molecular structure represented by the formula (E1) is a molecular structure represented by a formula (E3) below. Herein, two * in the formula (E3) each independently correspond to two * in the formula (E2) and the formula (E1).

For instance, in the formula (E1), $Rx_1$ and $Ry_1$ are mutually bonded to form the ring E in the formula (E2) and the ring E is an unsubstituted pyrrole ring, the molecular structure represented by the formula (E1) is a molecular structure represented by a formula (E4) below. Herein, two * in the formula (E4) each independently correspond to two * in the formula (E2) and the formula (E1). In the formulae (E3) and (E4), * each independently represent a bonding position to another atom in a molecule.

[Formula 41]

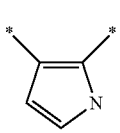
(E4)

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent(s), carbon atom(s) contained in the substituent(s) is not counted in the ring carbon atoms. The same applies to the "ring carbon atoms" described below, unless particularly noted. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring or a naphthalene ring is substituted, for instance, by an alkyl group, the carbon atoms of the alkyl group are not counted as the ring carbon atoms. For instance, when a fluorene ring (inclusive of a spirofluorene ring) is bonded as a substituent to a fluorene ring, the carbon atoms of the fluorene ring as a substituent are not counted as the ring carbon atoms.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring and atom(s) included in the substituent substituting the ring are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to carbon atoms of the pyridine ring or the quinazoline ring and atoms forming a substituent are not counted as the ring atoms. For instance, when a fluorene ring (inclusive of a spirofluorene ring) is bonded as a substituent to a fluorene ring, the atoms of the fluorene ring as a substituent are not counted as the ring atoms.

Description of Each Substituent in Formula Herein

Examples of the aryl group (occasionally referred to as an aromatic hydrocarbon group) in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are preferable. A carbon atom in a position 9 of each of 1-fluorenyl group, 2-fluorenyl group, 3-fluorenyl group and 4-fluorenyl group is preferably substituted by a substituted or unsubstituted alkyl group or a substituted or unsubstituted aryl group described later herein.

The heteroaryl group (occasionally referred to as heterocyclic group, heteroaromatic ring group or aromatic heterocyclic group) herein preferably contains as a hetero atom, at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group herein are a pyridyl group, pyrimidinyl group, pyrazinyl group, pyridazinyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

The heterocyclic group herein preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further preferable. A nitrogen atom in position 9 of 1-carbazolyl group, 2-carbazolyl group, 3-carbazolyl group and 4-carbazolyl group is preferably substituted by the substituted or unsubstituted aryl group or the substituted or unsubstituted heterocyclic group described herein.

Herein, the heterocyclic group may be a group derived from any one of partial structures represented by formulae (XY-1) to (XY-18).

[Formula 42]

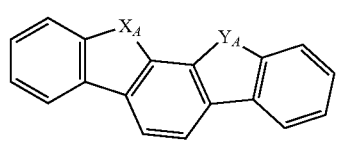
(XY-1)

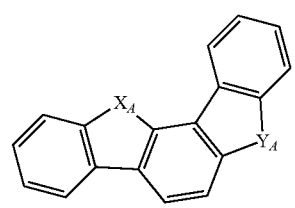
(XY-2)

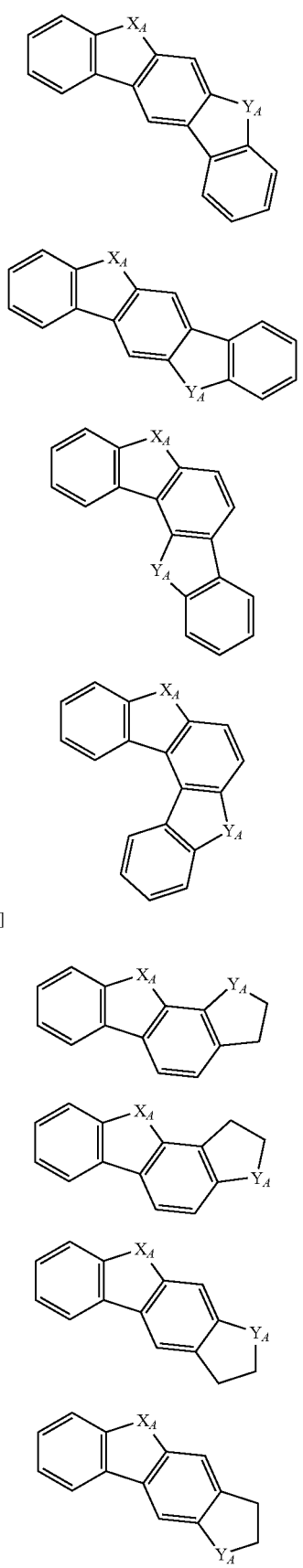
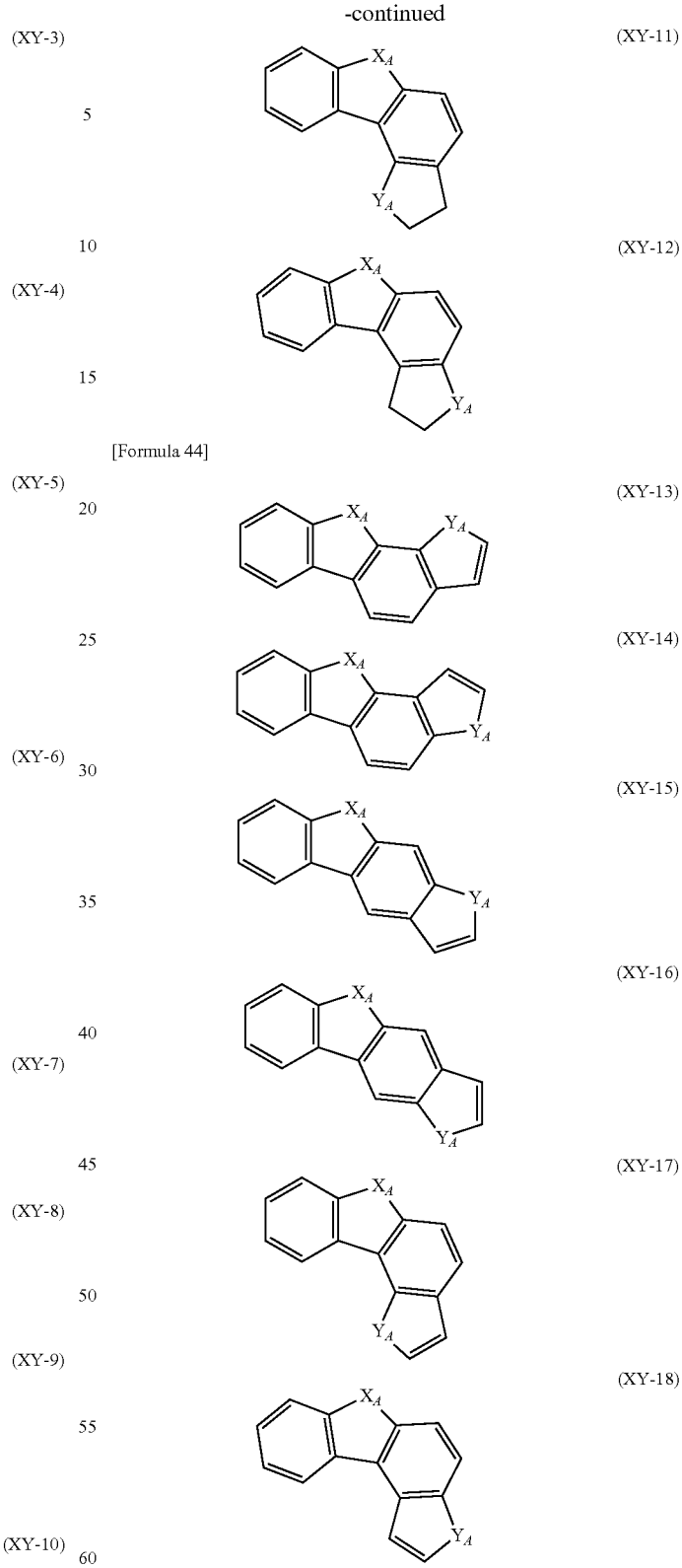
In the formulae (XY-1) to (XY-18), $X_A$ and $Y_A$ each independently represent a hetero atom, and preferably represent an oxygen atom, sulfur atom, selenium atom, silicon atom or germanium atom. The partial structures represented by the formulae (XY-1) to (XY-18) may each have a bond(s)

in any position to become a heterocyclic group, in which the heterocyclic group may be substituted.

Examples of a substituted or unsubstituted carbazolyl group herein may contain groups represented by formulae (XY-19) to (XY-22) in which a further group is fused to a carbazole ring. Such a group also may be substituted. Bonding positions of the group may be altered as desired.

[Formula 45]

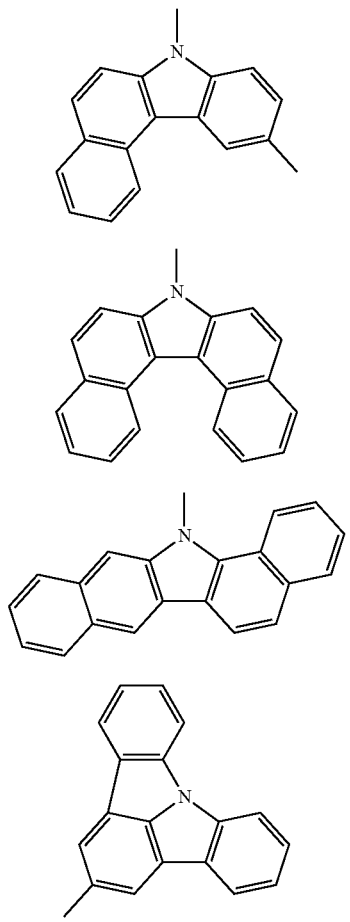

(XY-19)

(XY-20)

(XY-21)

(XY-22)

The alkyl group herein may be linear, branched or cyclic. Alternatively, the alkyl group may be a alkyl halide group.

Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear or branched alkyl group preferably has 1 to 10 carbon atoms, more preferably 1 to 6 carbon atoms. The linear or branched alkyl group is further preferably a methyl group, ethyl group, propyl group, isopropyl group, n-butyl group, s-butyl group, isobutyl group, t-butyl group, n-pentyl group, n-hexyl group, amyl group, isoamyl group and neopentyl group.

Herein, a cyclic alkyl group is exemplified by a cycloalkyl group.

Herein, examples of the cycloalkyl group include a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are further preferable.

Herein, an alkyl halide group provided by substituting an alkyl group with a halogen atom is exemplified by an alkyl halide group provided by substituting an alkyl group with one or more halogen atoms, preferably a fluorine atom(s).

Examples of the alkyl halide group herein include a fluoromethyl group, difluoromethyl group, trifluoromethyl group, fluoroethyl group, trifluoromethylmethyl group, trifluoroethyl group and pentafluoroethyl group.

Examples of the substituted silyl group herein include an alkylsilyl group and an arylsilyl group.

Herein, the alkylsilyl group is exemplified by a trialkylsilyl group having the above examples of the alkyl group. Specific examples of the alkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be mutually the same or different.

Herein, examples of the arylsilyl group include a dialkylarylsilyl group, alkyldiarylsilyl group and triarylsilyl group.

The dialkylarylsilyl group is exemplified by a dialkylarylsilyl group including two of the alkyl group listed as the examples of the alkyl group and one of the aryl group listed as the examples of the aryl group. The dialkylarylsilyl group preferably has 8 to 30 carbon atoms.

The alkyldiarylsilyl group is exemplified by a alkyldiarylsilyl group including one of the alkyl group listed as the examples of the alkyl group and two of the aryl group listed as the examples of the aryl group. The alkyldiarylsilyl group preferably has 13 to 30 carbon atoms.

The triarylsilyl group is exemplified by a triarylsilyl group including three of the aryl group listed above. The triarylsilyl group preferably has 18 to 30 carbon atoms.

Herein, an alkylsulfonyl group is represented by $-SO_2R_w$. $R_w$ in $-SO_2R_w$ is represented by a substituted or unsubstituted alkyl group.

Herein, a substituted or unsubstituted alkylsulfonyl group is exemplified by a group represented by the above $-SO_2R_w$ in which $R_w$ is the above substituted or unsubstituted alkyl group.

Herein, an aryl group included in an aralkyl group (occasionally referred to as an arylalkyl group) is an aromatic hydrocarbon group or a heterocyclic group.

Herein, an aralkyl group preferably has an aryl group and is represented by $-Z_3-Z_4$. $Z_3$ is exemplified by an alkylene group corresponding to the above alkyl group. $Z_4$ is exemplified by the above aryl group. In the aralkyl group, an aryl moiety has 6 to 30 carbon atoms, preferably 6 to 20 carbon atoms, more preferably 6 to 12 carbon atoms, and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-3-naphthylethyl group, 1-β-naphthylisopropyl group, and 2-β-naphthylisopropyl group.

Herein, the alkoxy group is represented by —$OZ_1$. $Z_1$ is exemplified by the above-described alkyl group. Examples of the alkoxy group include a methoxy group, ethoxy group, propoxy group, butoxy group, pentyloxy group and hexyloxy group. The alkoxy group preferably has 1 to 20 carbon atoms.

An alkoxy halide group provided by substituting an alkoxy group with a halogen atom is exemplified by one provided by substituting an alkoxy group with one or more fluorine atoms.

Herein, an aryl group in an aryloxy group (sometime referred to as an arylalkoxy group) also includes a heteroaryl group.

The arylalkoxy group herein is represented by —$OZ_2$. $Z_2$ is exemplified by the above aryl group. The arylalkoxy group preferably has 6 to 20 ring carbon atoms. The arylalkoxy group is exemplified by a phenoxy group.

Herein, a substituted amino group is represented by —$NHR_V$ or —$N(R_V)_2$. Examples of $R_V$ include the above-described alkyl group and the above-described aryl group.

Herein, the alkenyl group is linear or branched. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

The alkynyl group herein may be linear or branched. Examples of the alkynyl group are an ethynyl group, a propynyl group and a 2-phenylethynyl group.

Herein, the alkylthio group and the arylthio group are represented by —$SR_V$. Examples of $R_V$ include the above-described alkyl group and the above-described aryl group. The alkylthio group preferably has 1 to 20 carbon atoms. The arylthio group preferably has 6 to 20 ring carbon atoms.

Examples of the halogen atom herein include a fluorine atom, chlorine atom, bromine atom and iodine atom, among which a fluorine atom is preferable.

Herein, examples of a substituted phosphino group include a phenyl phosphanyl group.

The arylcarbonyl group herein is represented by —COY'. Y' is exemplified by the above aryl group. Herein, examples of the arylcarbonyl group include a phenyl carbonyl group, diphenyl carbonyl group, naphthyl carbonyl group, and triphenyl carbonyl group.

The acyl group herein is represented by —COR'. R' is exemplified by the above alkyl group. Herein, the acyl group is exemplified by an acetyl group and a propionyl group.

A substituted phosphoryl group herein is represented by a formula (P).

[Formula 46]

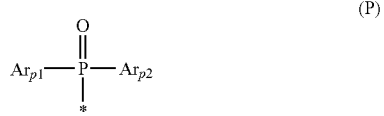

(P)

In the formula (P), $Ar_{P1}$ and $Ar_{P2}$ are any one substituent selected from the group consisting of the above-described alkyl group and the above-described aryl group.

Examples of the ester group herein include an alkyl ester group. The alkyl ester group is represented by —C(=O)$OR^E$. Examples of $R^E$ include the above-described substituted or unsubstituted alkyl group.

A siloxanyl group herein is a silicon compound group via an ether bond, examples of which include a trimethylsiloxanyl group.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

Herein, a hydrogen atom includes isotope having different numbers of neutrons, specifically, protium, deuterium and tritium.

Herein, the substituent meant by "substituted or unsubstituted" is at least one group selected from the group consisting of an aryl group, heteroaryl group, linear alkyl group, branched alkyl group, cycloalkyl group, alkyl halide group, substituted or unsubstituted silyl group (e.g., alkylsilyl group and arylsilyl group), alkoxy group, alkoxy halide group, aryloxy group, substituted or unsubstituted amino group, alkylthio group, arylthio group, aralkyl group, alkenyl group, halogen atom, alkynyl group, cyano group, hydroxy group, nitro group, carboxy group, and substituted phosphoryl group.

Herein, the substituent meant by "substituted or unsubstituted" is also exemplified by a diaryl boron group ($Ar_{B1}Ar_{B2}B$—). Examples of $Ar_{B1}$ and $Ar_{B2}$ include the above-described aryl group.

Specific examples and preferable examples of the substituent meant by "substituted or unsubstituted" are the same as specific examples and preferable examples of the substituent described in "Description of Each Substituent."

The substituent meant by "substituted or unsubstituted" may be further substituted by at least one group selected from the group consisting of an aryl group, heteroaryl group, linear alkyl group, branched alkyl group, cycloalkyl group, alkyl halide group, alkylsilyl group, arylsilyl group, alkoxy group, alkoxy halide group, aryloxy group, substituted or unsubstituted amino group, alkylthio group, arylthio group, aralkyl group, alkenyl group, alkynyl group, halogen atom, cyano group, hydroxy group, nitro group, and carboxy group. In addition, plural ones of these substituents may be mutually bonded to form a ring.

The substituent meant by "substituted or unsubstituted" may be further substituted by an acyl group.

The term "unsubstituted" used in "substituted or unsubstituted" means that a hydrogen atom(s) is not substituted by the above-described substituent.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of a substituted ZZ group.

Herein, "XX to YY atoms" in the description of "substituted or unsubstituted ZZ group having XX to YY atoms" represent atoms of an unsubstituted ZZ group and does not include atoms of a substituent(s) of a substituted ZZ group.

The same description as the above applies to "substituted or unsubstituted" in compounds or partial structures thereof described herein.

Herein, when the substituents are bonded to each other to form a ring, the ring is structured to be a saturated ring, an unsaturated ring, an aromatic hydrocarbon ring or a hetero ring.

Herein, examples of the aromatic hydrocarbon group and the heterocyclic group in the linking group include a divalent or multivalent group obtained by eliminating one or more atoms from the above monovalent groups.

EXAMPLES

Example(s) of the invention will be described below. However, the invention is not limited to Example(s).

Compounds

Compounds used for manufacturing an organic EL device will be shown below.

[Formula 47]

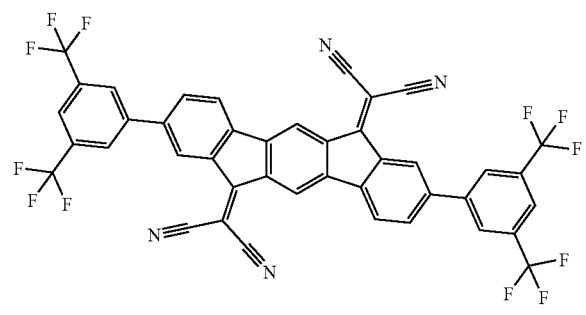

HA

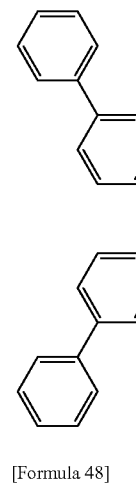

HT

[Formula 48]

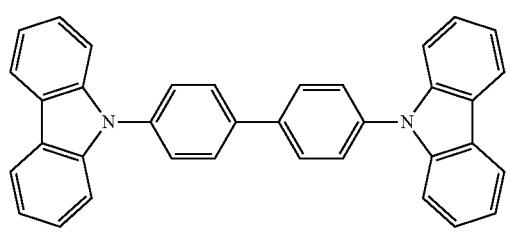

CBP

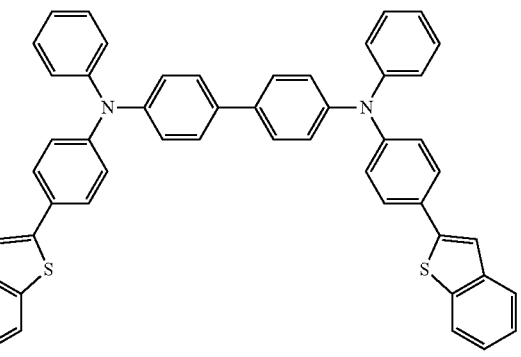

HT-2

[Formula 49]

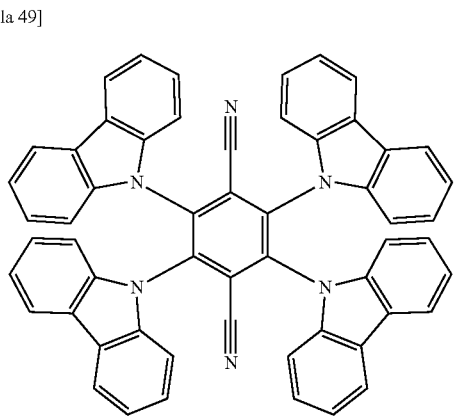

TADF1

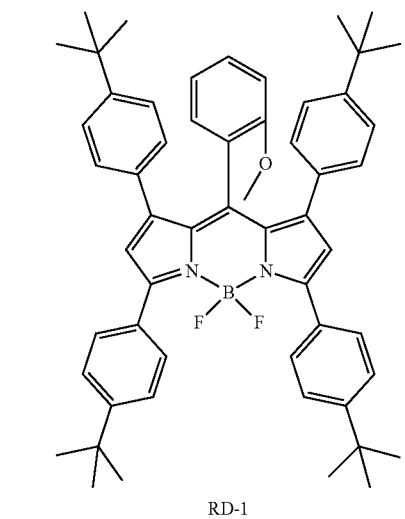

RD-1

[Formula 50]

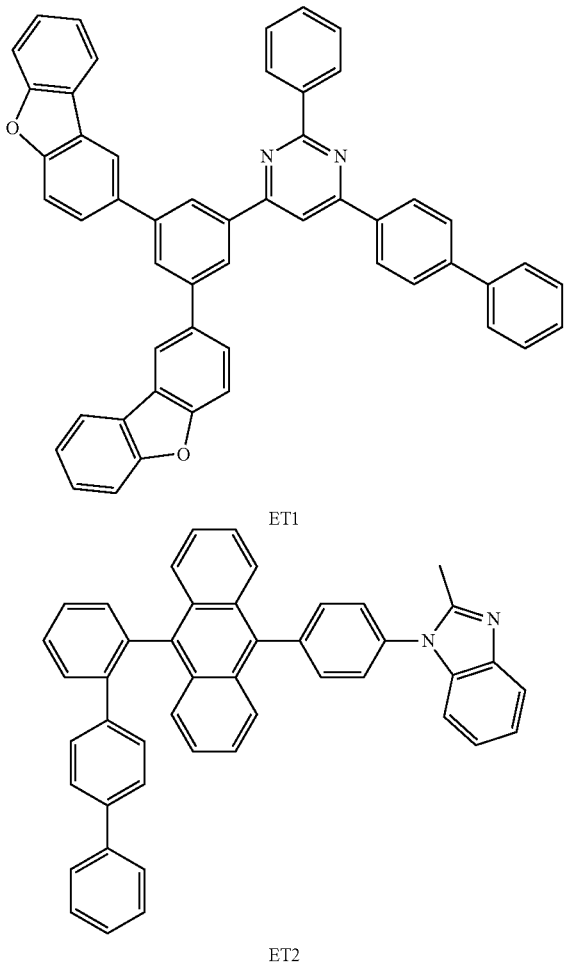

ET1

ET2

Delayed Fluorescence
Delayed Fluorescence of Compound TADF1

Delayed fluorescence properties were checked by measuring transient photoluminescence (PL) using a device shown in FIG. 2. A sample was prepared by co-depositing the compounds TADF1 and TH-2 on a quartz substrate at a ratio of the compound TADF1 of 12 mass % to form a 100-nm-thick thin film. Prompt emission was observed immediately when the excited state was achieved by exciting the compound TADF1 with a pulse beam (i.e., a beam emitted from a pulse laser) having a wavelength to be absorbed by the compound TADF1, and Delay emission was observed not immediately when the excited state was achieved but after the excited state was achieved. The delayed fluorescence in Examples means that an amount of Delay Emission is 5% or more with respect to an amount of Prompt Emission. Specifically, provided that the amount of Prompt emission is denoted by $X_P$ and the amount of Delay emission is denoted by X, the delayed fluorescence means that a value of $X_D/X_P$ is 0.05 or more.

It was found that the amount of Delay Emission was 5% or more with respect to the amount of Prompt Emission in the compound TADF1. Specifically, it was found that the value of $X_D/X_P$ was 0.05 or more in the compound TADF1.

The amount of Prompt emission and the amount of Delayed emission can be obtained in the same method as a method described in "Nature 492, 234-238, 2012". A device used for calculating the amounts of Prompt Emission and Delay Emission is not limited to the device of FIG. 2 and a device described in the above document.

Lowest Singlet Energy $S_1$

The lowest singlet energy $S_1$ of each of the compounds TADF1, CBP, and RD-1 was measured according to the above-described solution method.

The lowest singlet energy $S_1$ of the compound TADF1 was 2.37 eV.

The lowest singlet energy $S_1$ of the compound CBP was 3.52 eV.

The lowest singlet energy $S_1$ of the compound RD-1 was 2.02 eV.

Main Peak Wavelength of Compounds

A 5 μmol/L toluene solution of a measurement target compound was prepared and put in a quartz cell. A fluorescence spectrum (ordinate axis: fluorescence intensity, abscissa axis: wavelength) of the thus-obtained sample was measured at a normal temperature (300K). In Examples, the fluorescence spectrum was measured using a spectrophotometer (F-7000 manufactured by Hitachi, Ltd.). It should be noted that the fluorescence spectrum measuring device may be different from the above device. A peak wavelength of the fluorescence spectrum exhibiting the maximum luminous intensity was defined as a main peak wavelength.

The main peak wavelength of the compound RD-1 was 609 nm.

Ionization Potential

The ionization potential (unit: eV) was measured under atmosphere using a photoelectron spectroscope ("AC-3" manufactured by RIKEN KEIKI Co., Ltd.). Specifically, a material was irradiated with light and then the amount of electrons generated by charge separation was measured to measure the ionization potential.

The ionization potential of the compound TADF1 was 6.03 eV.

The ionization potential of the compound CBP was 6.00 eV.

The ionization potential of the compound RD-1 was 5.77 eV.

Electron Affinity Level Af

An electron affinity level Af was measured from measurement values of the ionization potential Ip and the lowest singlet energy $S_1$. The lowest singlet energy $S_1$ was measured according to the above-described solution method. The electron affinity level Af was calculated according to the following equation.

$$Af = Ip - S_1$$

The electron affinity level Af of the compound TADF1 was 3.66 eV.

The electron affinity level Af of the compound CBP was 2.48 eV.

The electron affinity level Af of the compound RD-1 was 3.75 eV.

Preparation of Organic EL Device

An organic EL device was manufactured as follows. It should be noted that the following description is made only for the red pixel.

Example 1

An APC (Ag—Pd—Cu) layer (reflective layer) having a film thickness of 100 nm, which was silver alloy layer, and an indium zinc oxide (IZO: registered trademark) film (transparent conductive layer) having a thickness of 10 nm were sequentially formed by sputtering on a glass substrate (25 mm×75 mm×0.7 mm thickness) to be a substrate for manufacturing a device. By this operation, a conductive material layer of the APC layer and the IZO film was obtained.

Subsequently, the conductive material layer was patterned by etching using a resist pattern as a mask using a normal lithography technique to form a lower electrode (anode).

Next, the compound HA was vapor-deposited on the lower electrode by the vacuum deposition method to form a 5-nm-thick hole injecting layer.

Next, the compound HT was vapor-deposited on the hole injecting layer to form a 180-nm-thick hole transporting layer.

Next, the compound CBP was vapor-deposited on the hole transporting layer to form a 10-nm-thick electron blocking layer.

Next, the compound CBP (third compound), the compound TADF1 (second compound) and the compound RD-1 (first compound) were co-deposited on the electron blocking layer to form a 25-nm-thick red emitting layer. A concentration of the compound CBP was 74 mass %, a concentration of the compound TADF1 was 25 mass %, and a concentration of the compound RD-1 was 1 mass % in the red emitting layer.

Next, a compound ET1 was vapor-deposited on the red emitting layer to form a 10-nm-thick hole blocking layer.

A compound ET2 was then vapor-deposited on the hole blocking layer to form a 50-nm-thick electron transporting layer. Of the thickness of 50 nm, 20 nm corresponds to the thickness of the common layer and 30 nm corresponds to the thickness of the additional layer.

Next, LiF was vapor-deposited on the electron transporting layer to form a 1-nm-thick electron injecting layer formed of an LiF film.

Subsequently, Mg and Ag were co-deposited on the electron injecting layer at a mixing ratio (mass % ratio) of 15:85, thereby forming an upper electrode (cathode) formed of a semi-transparent Mg—Ag alloy (total film thickness 15 nm). A compound HT-2 was then vapor-deposited on the entire upper electrode to form a 65-nm-thick capping layer. An organic EL device of Example 1 is of a top emission type.

A device arrangement of the organic EL device in Example 1 is schematically shown as follows.

APC(100)/IZO(10)/HA(5)/HT(180)/CBP(10)/CBP:
TADF1:RD-1(25,74%,25%:1%)/ET1(10)/ET2(50)/
LiF(1)/MgAg(15)/HT-2(65)

The numerals in parentheses represent film thickness (unit: nm). The numerals represented by percentage in the same parentheses each indicate a ratio (mass %) of the compound CBP, the compound TADF1 and the compound RD-1 in the emitting layer. Similar notations apply to the description below.

Comparative 1

An organic EL device of Comparative 1 was manufactured in the same manner as in Example 1 except that the film thickness of the compound HT in Example 1 was changed to 210 nm and the film thickness of the compound ET2 was changed to 20 nm.

A total film thickness of the organic EL device in Comparative 1 is the same as that in Example 1. The film thickness of the compound ET2 being 20 nm in Comparative 1 means that a portion corresponding to the additional layer of Example 1 is not present in Comparative 1.

The organic EL device of Comparative 1 is of a top emission type.

A device arrangement of the organic EL device in Comparative 1 is schematically shown as follows.

APC(100)/IZO(10)/HA(5)/HT(210)/CBP(10)/CBP:
TADF1:RD-1(25,74%,25%:1%)/ET1(10)/ET2(20)/
LiF(1)/MgAg(15)/HT-2(65)

Evaluation

The organic EL devices manufactured in Example 1 and Comparative 1 were evaluated as follows. The results are shown in Table 1.

External Quantum Efficiency EQE

Voltage was applied on the organic EL devices such that a current density was 10 mA/cm$^2$, where spectral radiance spectrum was measured by a spectroradiometer (CS-2000 manufactured by Konica Minolta, Inc.).

The external quantum efficiency EQE (unit: %) was calculated based on the obtained spectral-radiance spectra, assuming that the spectra was provided under a Lambertian radiation.

Chromaticities CIEx, CIEy, and Current Efficiency

Voltage was applied on the organic EL devices such that a current density was 10 mA/cm$^2$, where spectral radiance spectrum was measured by a spectroradiometer (CS-2000 manufactured by Konica Minolta, Inc.). The chromaticities CIEx and CIEy and the current efficiency L/J (unit: cd/A) were calculated based on the obtained spectral-radiance spectra.

Roll-Off Characteristics

A current efficiency L/J (unit: cd/A) was calculated in the same method as in the above measurement of the chromaticities CIEx and CIEy and the current efficiency except that the current density was changed to 1 mA/cm$^2$.

A roll-off value was obtained according to a calculation equation below and was defined as an index of the roll-off characteristics. The closer the roll-off value is to 1, the more the roll-off phenomenon is suppressed.

Calculation Equation: roll-off value=(current efficiency at 10 mA/cm$^2$ of the current density)/ (current efficiency at 1 mA/cm$^2$ of the current density)    Calculation Equation:

TABLE 1

| | Red Pixel | | | | | | | | | |
|---|---|---|---|---|---|---|---|---|---|---|
| | thickness $DR_{HT}$ of HT zone [nm] | thickness $DR_{EM}$ of emitting layer [nm] | thickness $DR_{ET}$ of ET zone [nm] | total thickness DR ($DR_{HT}$ + $DR_{ET}$ + $DR_{EM}$) [nm] | $DR_{ET}$/DR (formula 1) | Evaluation | | | | |
| | | | | | | L/J [cd/A] | CIEx | CIEy | EQE [%] | roll-off value |
| Ex. 1 | 195 | 25 | 60 | 280 | 0.21 | 40.2 | 0.680 | 0.319 | 31.9 | 0.893 |
| Comp. 1 | 225 | 25 | 30 | 280 | 0.11 | 30.7 | 0.676 | 0.324 | 21.7 | 0.830 |

Explanation of Table 1

An HT zone represents a hole transporting zone. An ET zone represents an electron transporting zone. It should be noted that a value of $DR_{ET}$ does not include the thickness of the LiF layer as defined above.

The organic EL device of Example 1 having the additional layer in the electron transporting zone shows higher values of the current efficiency L/J and the external quantum efficiency EQE than those of the organic EL device of Comparative 1 having no additional layer in the electron transporting zone.

The organic EL device of Example 1 improved the luminous efficiency.

Further, as compared with the organic EL device of Comparative 1, the organic EL device of Example 1 showed that the roll-off value [Calculation Equation: roll-off value= (current efficiency at 10 mA/cm² of the current density)/ (current efficiency at 1 mA/cm² of the current density)] is close to 1.

Accordingly, the organic EL device of Example 1 exhibited an improved roll-off characteristics when driven at a high current density (from 1 mA/cm² to 10 mA/cm²).

In the organic EL device of Example 1, the red pixel satisfies the above Numerical Formula 1 ($0.15 \leq DR_{ET}/DR \leq 0.50$).

The invention claimed is:

1. An organic electroluminescence device comprising:
   a first pixel and a blue pixel apposed on a substrate, wherein
      the first pixel and the blue pixel each comprise an anode and a cathode,
      the first pixel comprises a first emitting layer between the anode and the cathode, and
      the blue pixel comprises a blue emitting layer between the anode and the cathode;
   a hole transporting zone interposed between the first emitting layer and the anode and between the blue emitting layer and the anode; and
   an electron transporting zone interposed between the first emitting layer and the cathode and between the blue emitting layer and the cathode, wherein
   the first emitting layer comprises a delayed fluorescent second compound, and a fluorescent first compound capable of emitting light in a range from 500 nm to 660 nm, and
   the electron transporting zone comprises: a first common layer provided in common in the first pixel and the blue pixel; and an additional layer interposed between the first emitting layer and the cathode in the first pixel, wherein
   the additional layer interposed between the first emitting layer and the cathode in the first pixel is a non-common layer,
   the first pixel further comprises a third compound,
   a lowest singlet energy $S_1(M3)$ of the third compound and a lowest singlet energy $S_1(M2)$ of the second compound satisfy a relationship of Numerical Formula 5, $$S_1(M3) > S_1(M2) \quad \text{(Numerical Formula 5),}$$

and
      an electron affinity level Af(M2) of the second compound and an electron affinity level Af(M3) of the third compound satisfy a relationship of Numerical Formula 6, $$Af(M3) < Af(M2) \quad \text{(Numerical Formula 6).}$$

2. The organic electroluminescence device of claim 1, wherein the hole transporting zone comprises a second common layer provided in common in the first pixel and the blue pixel.

3. The organic electroluminescence device of claim 1, wherein a lowest singlet energy $S_1(M2)$ of the second compound and a lowest singlet energy $S_1(M1)$ of the first compound satisfy a relationship of Numerical Formula 3 below, $$S_1(M2) > S_1(M1) \quad \text{(Numerical Formula 3).}$$

4. The organic electroluminescence device of claim 1, wherein the anode is a reflective electrode, and the cathode is a light transmissive electrode.

5. A display installed with
the organic electroluminescence device of claim 1.

6. An electronic device installed with
the organic electroluminescence device of claim 1.

7. The organic electroluminescence device of claim 1, wherein the first emitting layer is a single layer.

8. An organic electroluminescence device comprising:
   a first pixel and a blue pixel apposed on a substrate, wherein
      the first pixel and the blue pixel each comprise an anode and a cathode,
      the first pixel comprises a first emitting layer between the anode and the cathode, and
      the blue pixel comprises a blue emitting layer between the anode and the cathode;
   a hole transporting zone interposed between the first emitting layer and the anode and between the blue emitting layer and the anode; and
   an electron transporting zone interposed between the first emitting layer and the cathode and between the blue emitting layer and the cathode, wherein
   the first emitting layer comprises a delayed fluorescent second compound, and a fluorescent first compound capable of emitting light in a range from 500 nm to 660 nm, and
   the electron transporting zone comprises: a first common layer provided in common in the first pixel and the blue pixel; and an additional layer interposed between the first emitting layer and the cathode in the first pixel, wherein
   the additional layer interposed between the first emitting layer and the cathode in the first pixel is a non-common layer, and
   an electron affinity level Af(M2) of the second compound and an electron affinity level Af(M1) of the first compound satisfy a relationship of Numerical Formula 4, $$Af(M2) < Af(M1) \quad \text{(Numerical Formula 4).}$$

9. The organic electroluminescence device of claim 8, wherein the hole transporting zone comprises a second common layer provided in common in the first pixel and the blue pixel.

10. The organic electroluminescence device of claim 8, wherein a lowest singlet energy $S_1(M2)$ of the second compound and a lowest singlet energy $S_1(M1)$ of the first compound satisfy a relationship of Numerical Formula 3 below $$S_1(M2) > S_1(M1) \quad \text{(Numerical Formula 3)}$$

11. The organic electroluminescence device of claim 8, wherein the anode is a reflective electrode, and the cathode is a light transmissive electrode.

12. A display installed with the organic electroluminescence device of claim 8.

13. An electronic device installed with the organic electroluminescence device of claim 8.

\* \* \* \* \*